(12) United States Patent
Kim et al.

(10) Patent No.: US 12,009,365 B2
(45) Date of Patent: Jun. 11, 2024

(54) DISPLAY DEVICE

(71) Applicant: Samsung Display Co., Ltd., Yongin-Si (KR)

(72) Inventors: Sung Hoon Kim, Asan-si (KR); Jung Hun Noh, Yongin-si (KR); Yi Joon Ahn, Seoul (KR); Eun Kyung Yeon, Suwon-si (KR); Jae Been Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 283 days.

(21) Appl. No.: 17/412,175

(22) Filed: Aug. 25, 2021

(65) Prior Publication Data

US 2022/0077197 A1 Mar. 10, 2022

(30) Foreign Application Priority Data

Sep. 7, 2020 (KR) ........................ 10-2020-0113590

(51) Int. Cl.
*H01L 27/12* (2006.01)
*H01L 25/16* (2023.01)

(52) U.S. Cl.
CPC ........ *H01L 27/1218* (2013.01); *H01L 25/167* (2013.01); *H01L 27/124* (2013.01); *H01L 27/1262* (2013.01)

(58) Field of Classification Search
CPC .. H01L 27/1218; H01L 25/167; H01L 27/124
USPC .................... 349/71, 110–111, 116
See application file for complete search history.

(56) References Cited

U.S. PATENT DOCUMENTS

| | | | |
|---|---|---|---|
| 9,947,284 B2 | 4/2018 | Park et al. | |
| 2018/0012549 A1* | 1/2018 | Lee | G09G 3/3266 |
| 2021/0036060 A1* | 2/2021 | Cho | H10K 30/87 |
| 2021/0118968 A1* | 4/2021 | Lee | H01L 27/124 |

FOREIGN PATENT DOCUMENTS

| | | |
|---|---|---|
| KR | 10-0673764 B1 | 1/2007 |
| KR | 10-0922356 B1 | 10/2009 |
| KR | 2011-0070609 A | 6/2011 |
| KR | 2017-0044809 A | 4/2017 |
| KR | 10-1996653 B1 | 7/2019 |

* cited by examiner

*Primary Examiner* — Charles S Chang
(74) *Attorney, Agent, or Firm* — Innovation Counsel LLP

(57) ABSTRACT

A display device is provided. The display device may include a first substrate, a first set of light emitting elements, and a second set of light emitting elements. The first substrate may include a first set of holes. Each hole of the first set of holes may extend through the first substrate. Each of the first set of light emitting elements and the second set of light emitting elements may overlap the first substrate. The first set of holes may be positioned between the first set of light emitting elements and the second set of light emitting elements in a plan view of the display device.

19 Claims, 39 Drawing Sheets

DISPLAY DEVICE

This application claims priority to and the benefit of Korean Patent Application No. 10-2020-0113590, filed on Sep. 7, 2020, in the Korean Intellectual Property Office; the Korean Patent Application is incorporated by reference.

BACKGROUND

1. Field

The technical field relates to a display device.

2. Description of the Related Art

A display device may display images according to input signals. A display device may include a display panel such as a light emitting display panel or a liquid crystal display panel. A light emitting display panel may include light emitting elements such as light emitting diodes (LEDs). For example, the LEDs may be organic light emitting diodes (OLEDs) including an organic fluorescent material or may be inorganic LEDs including an inorganic fluorescent material.

When a display device displays images, its light emitting elements may emit light for displaying the images. At the same time, heat may be generated in the light emitting elements.

SUMMARY

Embodiment may be related to a display device capable of efficiently dissipating heat generated from light emitting elements.

According to an embodiment, a display device may include a first substrate comprising a first set of holes, wherein each hole of the first set of holes extends through the first substrate; a first set of light emitting elements overlapping the first substrate; and a second set of light emitting elements overlapping the first substrate, wherein the first set of holes is positioned between the first set of light emitting elements and the second set of light emitting elements in a plan view of the display device.

According to an embodiment, a display device may include a first substrate; an overlapping layer overlapping the first substrate; a light emitting element positioned between the first substrate and the overlapping layer; a wavelength conversion member overlapping the light emitting element and positioned between the light emitting element and the overlapping layer; and a hole spaced from each of the light emitting element and the wavelength conversion member and extending through at least the first substrate and the overlapping layer.

In a display device according to an embodiment, heat generated from one or more light emitting elements and/or a light emitting element layer may be released to the environment outside the display device through holes that extend through one or more substrates of the display device. Advantageously, elements inside the display device may not be overheated.

In an embodiment, a display device may include one or more glass substrates. Advantageously, material cost of the display device may be minimized.

DETAILED DESCRIPTION

Example embodiments are described with reference to the accompanying drawings. The example embodiments may be embodied in different forms.

The same reference numbers may indicate the same components or analogous components.

Although the terms "first," "second," etc. may be used to describe various elements, these elements should not be limited by these terms. These terms may be used to distinguish one element from another element. For instance, a first element may be termed a second element. Similarly, a second element may be termed a first element. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The term "on" may mean "directly on" or "indirectly on". The term "connected" may mean "electrically connected" or "electrically connected through no intervening transistor". The term "insulate" may mean "electrically insulate" or "electrically isolate". The term "conductive" may mean "electrically conductive". The term "pattern" may mean "member". The term "drive" may mean "operate" or "control". The term "planar shape" may mean "shape in a plan view". The term "contact", "physical contact", or "physically contact" may mean "direct contact" or "directly contact". The term "penetrate" may mean "extend through". The expression that a hole overlaps an object may mean that the position of the hole overlaps the position of the object. The expression of a first number to a second number may mean a range of the first number to the second number.

Figure 1:
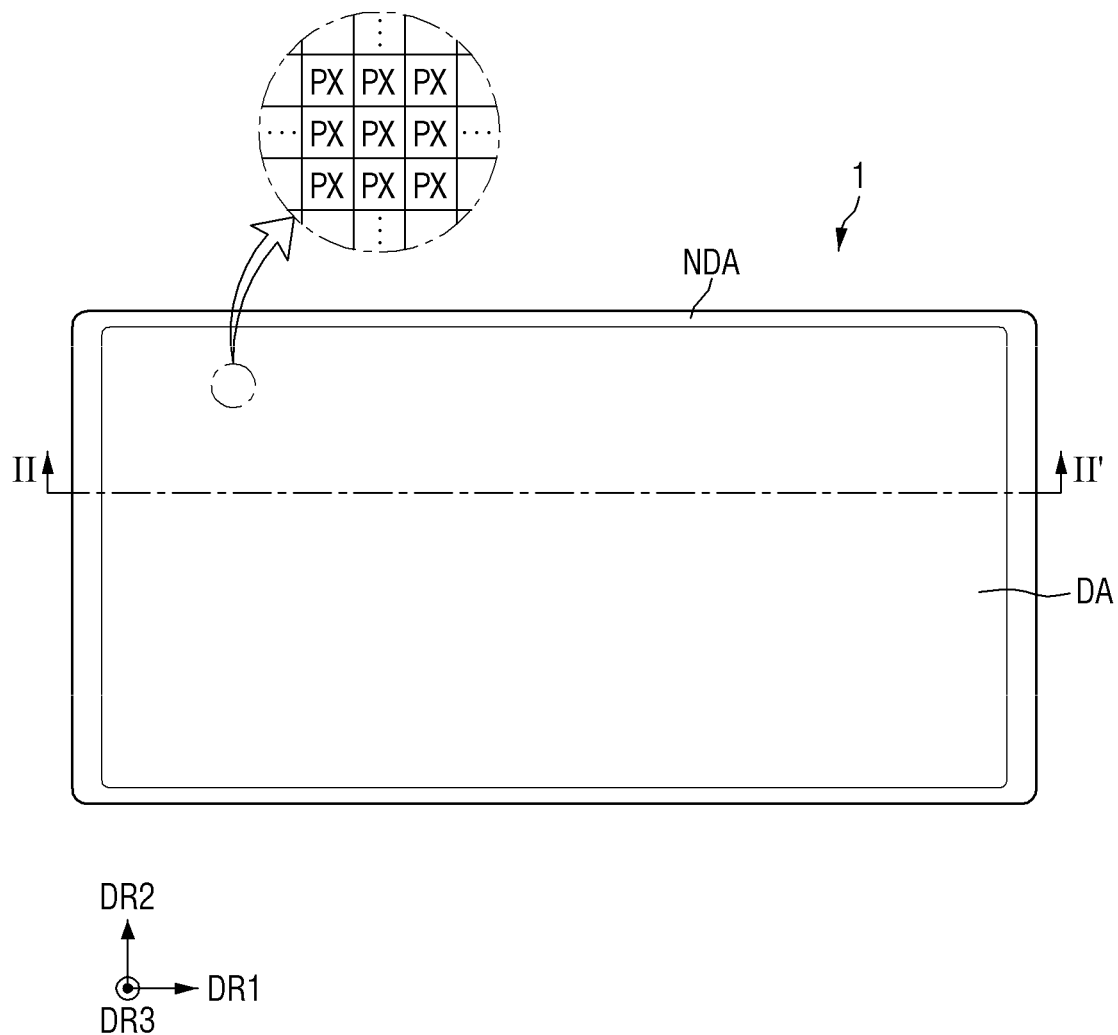
FIG. 1 is a schematic plan view of a display device according to an embodiment.

FIG. 1 is a schematic plan view of a display device 1 according to an embodiment.

The display device 1 may display moving images or still images. The display device 1 may represent or may be included in electronic device that has a display screen. Examples of the display device 1 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, and camcorders.

The display device 1 includes a display panel that provides a display screen. Examples of the display panel include inorganic light emitting diode (LED) display panels, organic light emitting display panels, quantum dot light emitting display panels, plasma display panels, and field emission display panels.

In the drawing, a first direction DR1, a second direction DR2, and a third direction DR3 are indicated. The first direction DR1 and the second direction DR2 may be perpendicular to each other in one plane. The third direction DR3 may be perpendicular to the plane. The third direction DR3 is perpendicular to each of the first direction DR1 and the second direction DR2. The third direction DR3 may indicate a thickness direction of the display device 1.

The display device 1 may have a rectangular planar shape including long sides and short sides and longer in the first direction DR1 than in the second direction DR2. Corners at which the long and short sides of the display device 1 meet may be right-angled or rounded in a plan view of the display device 1. The display device 1 may also have one or more other planar shapes such as a square, a quadrangle with rounded corners (vertices), other polygons, and a circle.

A display surface of the display device 1 may be perpendicular to the third direction DR3. In the description of the display device 1, "above" and "below" may be in the third direction DR3. The terms "left," "right," "upper," and "lower" may indicate directions when the display device 1 is seen in a plan view. For example, "right" and "left" may be in the first direction DR1; "Lipper" and "lower" may be in the second direction DR2.

The display device 1 may include a display area DA and a non-display area NDA. The display area DA may be for displaying image according to input signals, and the non-display area NDA may not display images according to input signals.

The shape of the display area DA may follow the shape of the display device 1. For example, the display area DA may have a rectangular planar shape similar to the overall shape of the display device 1. The display area DA may generally occupy the center of the display device 1.

The display area DA may include a plurality of pixels PX. The pixels PX may be arranged in a matrix. Each of the pixels PX may be rectangular or square in a plan view. Each of the pixels PX may also have a rhombic planar shape having each side inclined with respect to a direction. The pixels PX may be arranged in a stripe structure or PENTILE (TM) structure.

The non-display area NDA may be disposed around the display area DA. The non-display area NDA may entirely or partially surround the display area DA. The display area DA may be rectangular, and the non-display area NDA may be disposed adjacent to four sides of the display area DA. The non-display area NDA may form a bezel of the display device 1. In the non-display area NDA, wiring and circuit drivers included in the display device 1 or a pad part on which an external device is mounted or connected to may be disposed.

Figure 2:
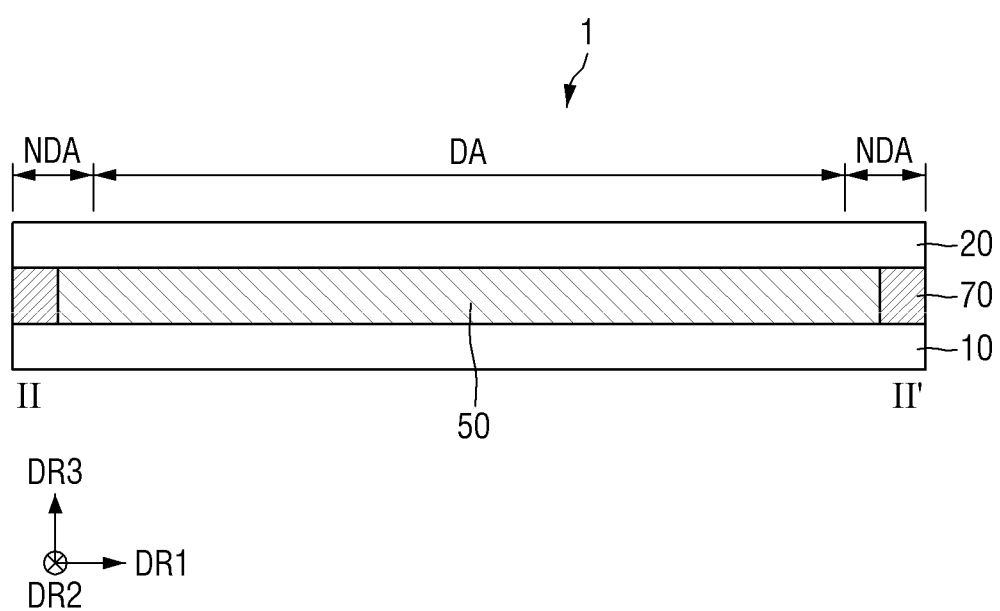
FIG. 2 is a schematic cross-sectional view taken along line II-II' of FIG. 1 according to an embodiment.

FIG. 2 is a schematic cross-sectional view of the display device 1 according to the embodiment, taken along line II-II' of FIG. 1.

Referring to FIGS. 1 and 2, the display device 1 may include a display substrate 10 and a color conversion substrate 20 facing/overlapping the display substrate 10. The display device 1 may further include a sealing member 70 bonding the display substrate 10 and the color conversion substrate 20 and may include a filling layer 50 filling a space between the display substrate 10 and the color conversion substrate 20.

The display substrate 10 may emit light having predetermined peak wavelengths from a plurality of light emitting areas of the display area DA. The display substrate 10 may include elements and circuits for displaying an image. For example, the display substrate 10 may include pixel circuits such as switching elements and self-light emitting elements disposed in the display area DA.

For example, the self-light emitting elements may include at least one of organic LEDs, quantum dot LEDs, inorganic material-based micro LEDs (e.g., quantum dot micro LEDs), and inorganic material-based nano-LEDs (e.g., quantum dot nano-LEDs). Inorganic material-based LEDs are illustrated in this application.

The sealing member 70 may be disposed in the non-display area NDA. The sealing member 70 may be located between the display substrate 10 and the color conversion substrate 20 in the non-display area NDA. The sealing member 70 may be disposed in the non-display area NDA along edges of the display substrate 10 and the color conversion substrate 20 and may surround the display area DA in a plan view. The display substrate 10 and the color conversion substrate 20 may be bonded to each other by the sealing member 70. The sealing member 70 may include an organic material. For example, the sealing member 70 may be made of epoxy resin.

The filling layer 50 may be located in the space between the display substrate 10 and the color conversion substrate 20 and surrounded by the sealing member 70. The filling layer 50 may fill the space between the display substrate 10 and the color conversion substrate 20. The filling layer 50 may be made of a material capable of transmitting light. The filling layer 50 may include an organic material. For example, the filling layer 50 may be made of a silicon-based organic material or an epoxy-based organic material.

Figure 3:
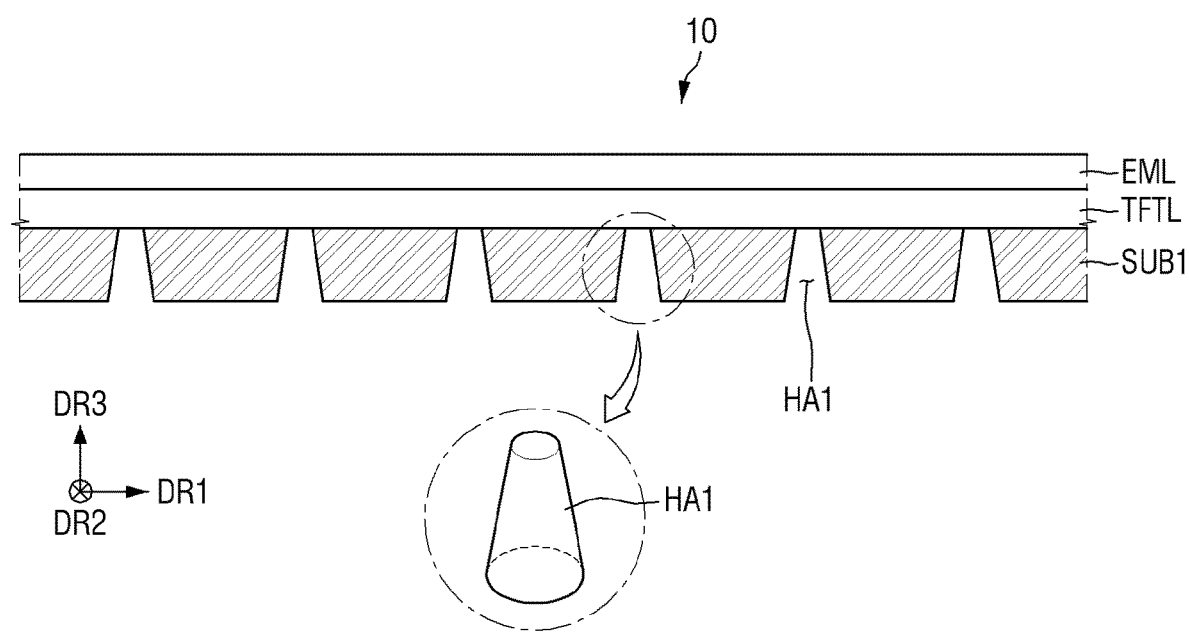
FIG. 3 is a schematic cross-sectional view of a display substrate according to an embodiment.
Figure 4:
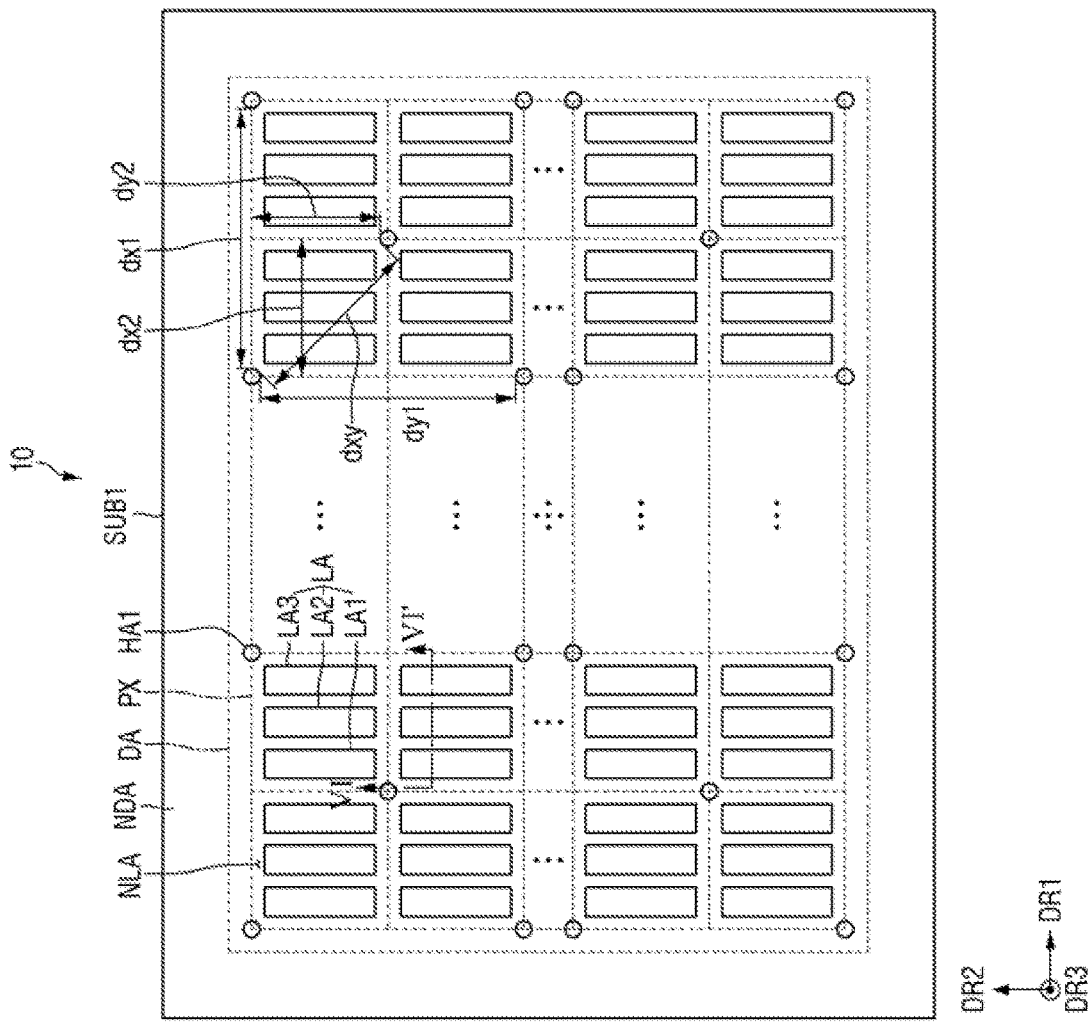
FIG. 4 is a schematic plan view illustrating pixels and a first substrate of a display substrate according to an embodiment.

FIG. 3 is a schematic cross-sectional view of a display substrate 10 according to an embodiment. FIG. 4 is a schematic plan view illustrating pixels PX and a first substrate SUB1 of the display substrate 10 according to an embodiment.

Referring to FIGS. 3 and 4, the display area DA of the display device 1 includes a plurality of pixels PX arranged along a plurality of rows and columns. A pixel PX is a (minimum) repeating unit for display. To display full color, each pixel PX may include a plurality of subpixels emitting light of different colors. For example, each pixel PX may include a first subpixel emitting blue light, a second subpixel emitting green light, and a third subpixel emitting red light.

A first subpixel, a second subpixel, and a third subpixel may be provided in each pixel PX. The subpixels may be sequentially and repeatedly disposed along the first direction DR1 in the order of the first subpixel, the second subpixel, and the third subpixel.

Each pixel PX of the display substrate 10 may include a plurality of light emitting areas LA (LA1 through LA3 corresponding to subpixels) and a non-light emitting area NLA.

Each of the light emitting areas LA may be an area where light generated by the display substrate 10 is emitted out of the display substrate 10, and the non-light emitting area NLA may be an area where light generated by the display substrate 10 is not emitted out of the display substrate 10.

The light emitting areas LA (LA1 through LA3) may include a first light emitting area LA1, a second light emitting area LA2, and a third light emitting area LA3. The first through third light emitting areas LA1 through LA3 may be light emitting areas LA of the first through third subpixels, respectively. For example, the first light emitting area LA1 may be the light emitting area LA of the first subpixel, the second light emitting area LA2 may be the light emitting area LA of the second subpixel, and the third light emitting area LA3 may be the light emitting area LA of the third subpixel.

Light emitted from the first through third light emitting areas LA1 through LA3 to the outside of the display substrate 10 may be light having a predetermined peak wavelength. For example, the first through third light emitting areas LA1 through LA3 may emit blue light. Light emitted from the first through third light emitting areas LA1 through LA3 may have a peak wavelength in a range of 440 to 480 nm.

The first through third light emitting areas LA1 through LA3 may be sequentially and repeatedly arranged along the first direction DR1 in the display area DA of the display substrate 10. The planar shape of each of the first through third light emitting areas LA1 through LA3 may be a rectangle whose width is greater in the second direction DR2 than in the first direction DR1.

A width of the first light emitting area LA1 in the first direction DR1, a width of the second light emitting area LA2 in the first direction DR1, and a width of the third light emitting area LA3 in the first direction DR1 may be substantially equal. A width of the first light emitting area LA1 in the first direction DR1 may be smaller than a width of the second light emitting area LA2 in the first direction DR1 and a width of the third light emitting area LA3 in the first direction DR1. A width of the second light emitting area LA2 in the first direction DR1 may be smaller than a width of the third light emitting area LA3 in the first direction DR1.

The non-light emitting area NLA may surround the light emitting areas LA (LA1 through LA3).

The non-light emitting area NLA of a subpixel contacts the non-light emitting area NLA of a neighboring subpixel (regardless of whether the neighboring subpixel is included in the same pixel PX). The non-light emitting areas NLA of neighboring subpixels may be connected as one. The non-light emitting areas NLA of all subpixels may be connected as one. The respective light emitting areas LA1 through LA3 of neighboring subpixels may be separated by the non-light emitting area NLA.

Referring to FIGS. 3 and 4, the display substrate 10 may include the first substrate SUB1, a thin-film transistor layer TFTL disposed on the first substrate SUB1, and a light emitting element layer EML disposed on the thin-film transistor layer TFTL.

The first substrate SUB1 may be an insulating substrate. The first substrate SUB1 may include a transparent material such as glass or quartz or may include a polymer material such as polyimide. The first substrate SUB1 may be a circuit board including a circuit element layer, such as a printed circuit board.

The planar shape of the first substrate SUB1 may be generally similar to that of the display device 1. For example, when the display device 1 is rectangular including long sides in the first direction DR1 and short sides in the second direction DR2 in a plan view, the first substrate SUB1 may be rectangular in a plan view.

The first substrate SUB1 may include a plurality of first holes HA1. The first holes HA1 may completely penetrate the first substrate SUB1 in the third direction DR3. Each of the first holes HA1 may have a truncated cone structure whose upper opening has a smaller diameter than its lower opening. One or more of the first holes HA1 may have a cylinder structure or a truncated cone structure whose upper opening has a greater diameter than its lower opening.

A height of each first hole HA1 may be equal to a thickness of the first substrate SUB1. That is, the height of each first hole HA1 may be equal to a distance from a lower surface to an upper surface of the first substrate SUB1.

The first holes HA1 may be shaped like circles having the same area in a plan view. The first holes HA1 may have one or more other planar shapes such as a square, an ellipse and a rectangle, and/or the planar shapes of the first holes HA1 may have different sizes.

The first holes HA1 may be disposed in the display area DA of the display device 1. The first holes HA1 may be disposed in the non-light emitting area NLA of the display substrate 10. Some first holes HA1 may be disposed in the light emitting areas LA of the display substrate 10.

The first holes HA1 may be arranged at predetermined intervals. The first holes HA1 may be arranged at predetermined intervals along the first direction DR1 and the second direction DR2. The first holes HA1 may be arranged such that neighboring rows and/or neighboring columns are staggered with each other. For example, a plurality of first holes HA1 disposed in odd-numbered rows may be disposed in odd-numbered columns, and a plurality of first holes HA1 disposed in even-numbered rows may be disposed in even-numbered columns. The first holes HA1 may be disposed in each row and/or each column in a matrix.

Referring to FIG. 4, a distance dx1 is a shortest distance between two immediately neighboring first holes HA1 along the first direction DR1, and a distance dy1 is a shortest distance between two immediately neighboring first holes HA1 disposed adjacent along the second direction DR2.

The distance dx1 in the first direction DR1 between the first holes HA1 arranged along the first direction DR1 in the same row and the distance dy1 in the second direction DR2 between the first holes HA1 arranged along the second direction DR2 in the same column may be equal to each other as illustrated in FIG. 4. The distance dx1 in the first direction DR1 between the first holes HA1 arranged along the first direction DR1 in the same row and the distance dy1 in the second direction DR2 between the first holes HA1 arranged along the second direction DR2 in the same column may be different from each other. The distance dx1 in the first direction DR1 between the first holes HA1 arranged along the first direction DR1 in the same row may be in the range of 600 to 660 μm. The distance dy1 in the second direction DR2 between the first holes HA1 arranged along the second direction DR2 in the same column may be in the range of 600 to 660 μm.

Each of a distance dx2 in the first direction DR1 between the first holes HA1 disposed in an odd-numbered column and an even-numbered column disposed adjacent to each other and a distance dy2 in the second direction DR2 between the first holes HA1 disposed in an odd-numbered row and an even-numbered row disposed adjacent to each other may be in the range of 300 to 330 μm. A shortest distance dxy between the first holes HA1 disposed in an odd-numbered column and an even-numbered column disposed adjacent to each other (or the first holes HA1 disposed adjacent to each other in a diagonal direction) may be in the range of about 430 μm to about 460 μm.

The thin-film transistor layer TFTL may be disposed on a surface of the first substrate SUB1. The thin-film transistor layer TFTL may overlap the first holes HA1 formed in the first substrate SUB1.

The thin-film transistor layer TFTL may include not only thin-film transistors of each pixel PX but also scan lines, data lines, power lines, scan control lines, and routing lines connecting pads and the data lines. Each of the thin-film transistors may include a gate electrode, a semiconductor layer, a source electrode, and a drain electrode.

The thin-film transistor layer TFTL may be disposed in the display area DA and the non-display area NDA. The thin-film transistor layer TFTL completely covers the first substrate SUB1 in the drawings. The thin-film transistor layer TFTL may be disposed on the first substrate SUB1 to cover the first substrate SUB1 but may include a plurality of holes penetrating the thin-film transistor layer TFTL in areas respectively corresponding to the first holes HA1 of the first substrate SUB1. That is, the thin-film transistor layer TFTL may include a plurality of holes overlapping (and/or connected to) the first holes HA1 of the first substrate SUB1 in the third direction DR3. The thin-film transistors of each pixel PX, the scan lines, the data lines, and the power lines of the thin-film transistor layer TFTL may be disposed in the display area DA. The scan control lines and link lines of the thin-film transistor layer TFTL may be disposed in the non-display area NDA.

The light emitting element layer EML may be disposed on the thin-film transistor layer TFTL. The light emitting element layer EML may completely cover the thin-film transistor layer TFTL in the drawings. The light emitting element layer EML may cover the first substrate SUB1 but may include a plurality of holes penetrating the light emitting element layer EML in areas respectively corresponding to the first holes HA1 of the first substrate SUB1. That is, the light emitting element layer EML may also include a plurality of holes overlapping the first holes HA1 of the first substrate SUB1 in the third direction DR3.

The light emitting element layer EML may include pixels PX (each including first electrodes, light emitting elements, and second electrodes) and a pixel defining layer defining the pixels PX. The light emitting elements may inorganic light emitting layers including an inorganic material. The pixels PX of the light emitting element layer EML may be disposed in the display area DA.

Figure 5:
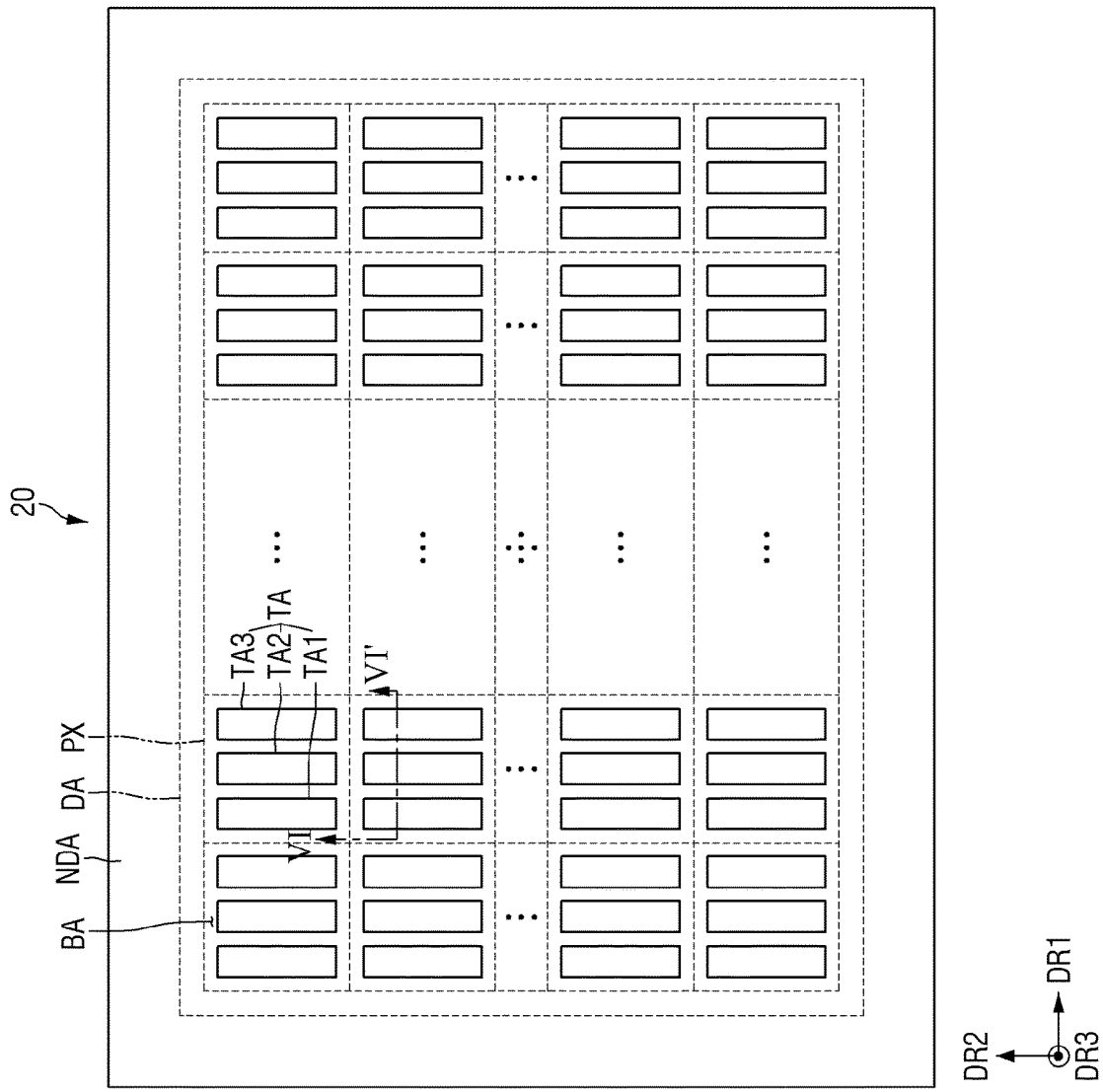
FIG. 5 is a schematic plan view illustrating pixels and a color conversion substrate according to an embodiment.

FIG. 5 is a schematic plan view illustrating pixels PX of the display device 1 and the color conversion substrate 20 according to an embodiment.

The color conversion substrate 20 may include a plurality of light exiting areas TA (TA1 through TA3) and a light blocking area BA.

Each of the light exiting areas TA may be an area where light emitted from the display substrate 10 passes through the color conversion substrate 20 and exits out of the display device 1. The light blocking area BA may block light emitted from the display substrate 10.

The light exiting areas TA (TA1 through TA3) may include a first light exiting area TA1, a second light exiting area TA2, and a third light exiting area TA3. The first through third light exiting areas TA1 through TA3 may be light exiting areas TA of the first through third subpixels, respectively. For example, the first light exiting area TA1 may be the light exiting area TA of the first subpixel, the second light exiting area TA2 may be the light exiting area TA of the second subpixel, and the third light exiting area TA3 may be the light exiting area TA of the third subpixel. The first through third light exiting areas TA1 through TA3 may correspond to the first through third light emitting areas LA1 through LA3 of the display substrate 10, respectively.

Light emitted from the light emitting areas LA1 through LA3 of the display substrate 10 may pass through the first light exiting area TA1, the second light exiting area TA2 and the third light exiting area TA3 and exit out of the display device 1. The first light exiting area TA1 may emit light of a first color to the outside of the display device 1, the second light exiting area TA2 may emit light of a second color different from the first color to the outside of the display device 1, and the third light exiting area TA3 may emit light of a third color different from the first color and the second color to the outside of the display device 1. For example, the light of the first color may be blue light having a peak wavelength of 440 to about 480 nm, the light of the second color may be green light having a peak wavelength of 510 to 550 nm, and the light of the third color may be red light having a peak wavelength of 610 to 650 nm.

The first through third light exiting areas TA1 through TA3 may be sequentially and repeatedly arranged along the first direction DR1 in the display area DA of the color conversion substrate 20. The planar shapes of the first through third light exiting areas TA1 through TA3 may be similar to those of the first through third light emitting areas LA1 through LA3.

A width of the first light exiting area TA1 in the first direction DR1, a width of the second light exiting area TA2 in the first direction DR1, and a width of the third light exiting area TA3 in the first direction DR1 may be substantially equal. A width of the first light exiting area TA1 in the first direction DR1 may be smaller than a width of the second light exiting area TA2 in the first direction DR1 and a width of the third light exiting area TA3 in the first direction DR1. A width of the second light exiting area TA2 in the first direction DR1 may be smaller than a width of the third light exiting area TA3 in the first direction DR1.

The light blocking area BA may surround the light exiting areas TA. The light exiting areas TA of neighboring subpixels may be separated by the light blocking area BA.

Figure 6:
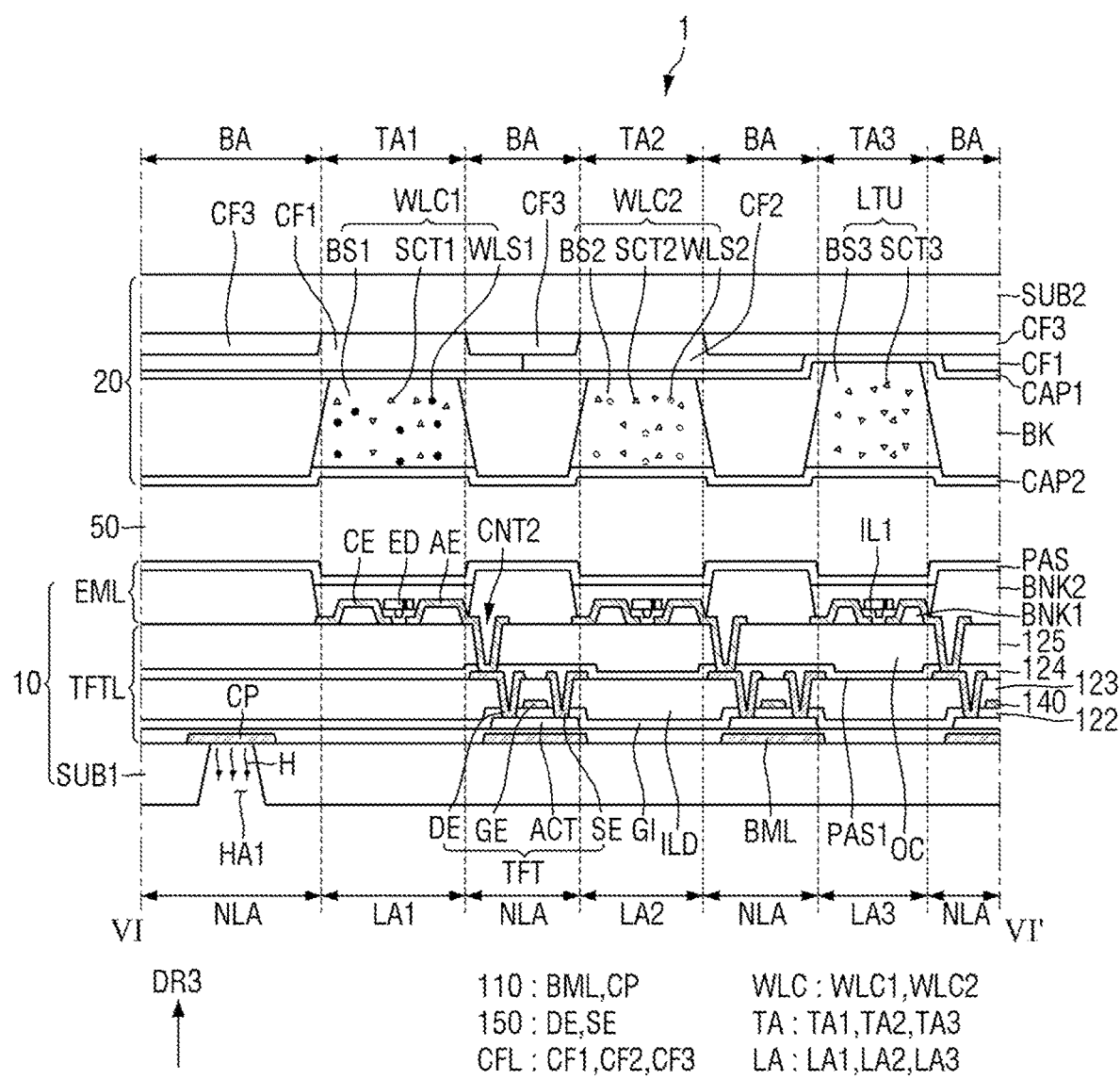
FIG. 6 is a schematic cross-sectional view of a display device taken along line VI-VI' of FIG. 4 or FIG. 5 according to an embodiment.
Figure 7:
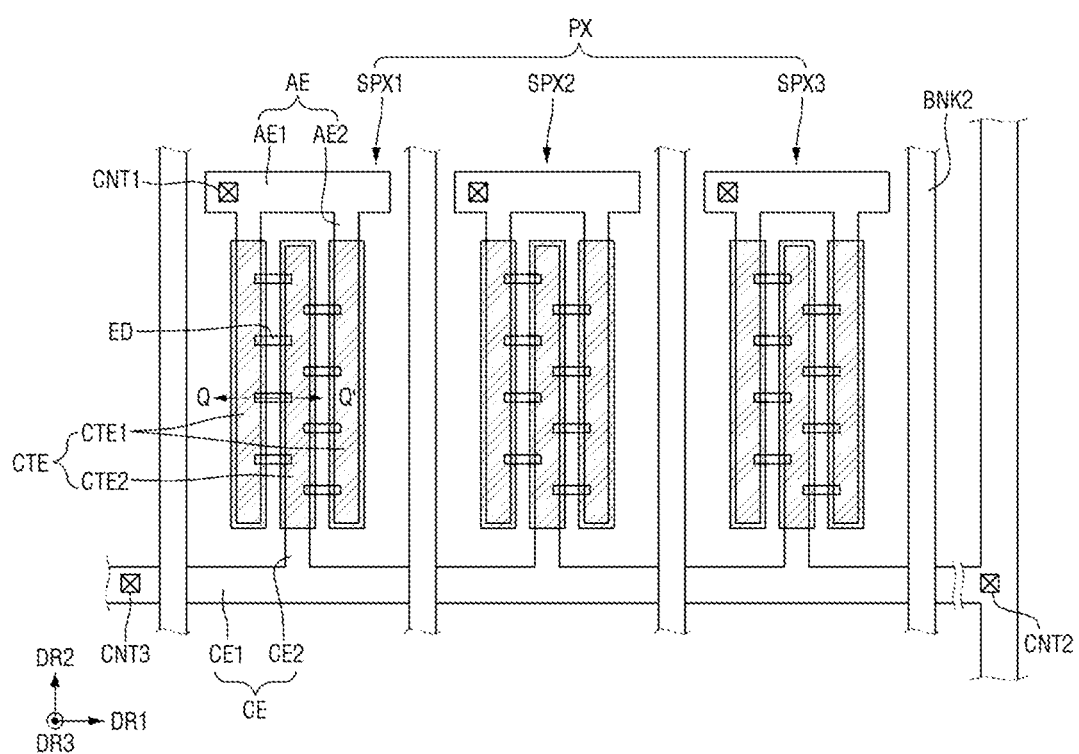
FIG. 7 is a schematic plan view of a pixel of a display device according to an embodiment.

FIG. 6 is a cross-sectional view of the display device 1 taken along line VI-VI' of FIG. 4 or FIG. 5 according to an embodiment. FIG. 7 is a plan view of a pixel PX of the display device 1 according to an embodiment.

Referring to FIG. 6, the display substrate 10 may include the first substrate SUB1, the thin-film transistor layer TFTL disposed on the first substrate SUB1, and the light emitting element layer EML disposed on the thin-film transistor layer TFTL. The color conversion substrate 20 may include a second substrate SUB2 and a color control structure disposed on a surface of the second substrate SUB2 facing the first substrate SUB1. The color control structure may include a wavelength conversion layer (or referred to as wavelength conversion member) WLC and a light transmission layer LTU disposed at the same level as the wavelength conversion layer WLC in some subpixels. The color control structure CFL, WLC and LTU may further include a color filter layer CFL. The filling layer 50 may be disposed between the display substrate 10 and the color conversion substrate 20. The filling layer 50 may fill the space between the display substrate 10 and the color conversion substrate 20 while bonding them together.

The first substrate SUB1 may be an insulating substrate. The first substrate SUB1 may include a transparent material. The first substrate SUB1 may include a transparent insulating material such as glass or quartz. The first substrate SUB1 may be a rigid substrate. The first substrate SUB1 may include plastic such as polyimide (PI).

A first hole HA1 penetrating the first substrate SUB1 may be formed in the first substrate SUB1. The first hole HA1 may be disposed in the non-light emitting area NLA. The cross-sectional shape of the first hole HA1 may become wider toward the outside of the display device 1 (e.g., in a direction opposite to the third direction DR3). Since the first hole HA1 is shaped like a trapezoid whose width increases toward the outside of the display device 1, heat H transferred to a conductive pattern CP (or conductive member CP) may easily move toward the outside of the display device 1.

The thin-film transistor layer TFTL may be disposed on a surface of the first substrate SUB1. The thin-film transistor layer TFTL may include thin-film transistors TFT, a bottom metal layer 110, and a plurality of insulating layers. Each of the thin-film transistors TFT may include an active layer ACT, a gate electrode GE, a source electrode SE, and a drain electrode DE.

The bottom metal layer 110 may be disposed on the first substrate SUB1. The bottom metal layer 110 may have a patterned shape. The bottom metal layer 110 may include a light blocking layer BML and the conductive pattern CP.

The light blocking layer BML may protect the active layer ACT of each thin-film transistor TFT from external light. The light blocking layer BML may be disposed under the active layer ACT of each thin-film transistor TFT to cover at least a channel region of the active layer ACT of the thin-film transistor TFT and, by extension, to cover the entire active layer ACT of the thin-film transistor TFT.

Referring to FIGS. 4, 6 and 7, the conductive pattern CP may be disposed in the non-light emitting area NLA of the display substrate 10. The conductive pattern CP may overlap the first hole HA1, which penetrates the first substrate SUB1, in the third direction DR3. The conductive pattern CP overlapping the first hole HA1 may be wider than the upper surface of the first hole HA1 to completely cover an opening of the first hole HA1. The conductive pattern CP may completely cover the first hole HA1 and overlap surface portions of the first substrate SUB1 around the first hole HA1.

The first hole HA1 may be overlapped by the thin-film transistor layer TFTL and the light emitting element layer EML of the display substrate 10 and the color conversion substrate 20 in the third direction DR3.

Although not illustrated in the drawings, the conductive pattern CP may also contact a second electrode CE of the light emitting element layer EML through a third contact hole CNT3. Since the conductive pattern CP is connected to the second electrode CE through the third contact hole CNT3, a heat dissipation path through which heat can be dissipated and/or released may be created. This will be described in detail later.

The bottom metal layer 110 may include a material that blocks light. For example, the bottom metal layer 110 may be made of an opaque metal material that blocks transmission of light. Since the bottom metal layer 110 includes a light blocking material, even if a plurality of first holes HA1 penetrating the first substrate SUB1 are formed, they can be invisible in the display area DA of the display device 1 from the outside.

A buffer layer 121 may be disposed on the bottom metal layer 110. The buffer layer 121 may cover the entire surface of the first substrate SUB1 on which the bottom metal layer 110 is disposed. The buffer layer 121 may protect the thin-film transistors TFT from moisture introduced through the first substrate SUB1 which is vulnerable to moisture penetration. The buffer layer 121 may include an inorganic material such as silicon oxide ($SiO_x$), silicon nitride ($SiN_x$), or silicon oxynitride (SiON). The buffer layer 121 may include a plurality of inorganic layers stacked alternately.

The thin-film transistors TFT may be disposed on the buffer layer 121 and may form respective pixel circuits of pixels PX. For example, the thin-film transistors TFT may be driving transistors or switching transistors of the pixel circuits.

The active layer ACT may be disposed on the buffer layer 121. The active layer ACT may overlap the light blocking layer BML, the gate electrode GE, the source electrode SE, and the drain electrode DE. The active layer ACT may directly contact the source electrode SE and the drain electrode DE and may face the gate electrode GE with a gate insulating film 122 interposed between them.

The active layer ACT may include crystalline silicon, an oxide semiconductor, or the like. The active layer ACT may include polycrystalline silicon formed by crystallizing amorphous silicon. The active layer ACT may include, for example, indium tin oxide (ITO), indium zinc oxide (IZO), indium gallium oxide (IGO), indium zinc tin oxide (IZTO), indium gallium tin oxide (IGTO), or indium gallium zinc tin oxide (IGZTO).

The gate insulating film 122 may be disposed on the active layer ACT. The gate insulating film 122 may be disposed on the buffer layer 121 on which the active layer ACT is disposed. The gate insulating film 122 may insulate the active layer ACT and the gate electrode GE of each thin-film transistor TFT from each other. The gate insulating film 122 may be an inorganic layer including an inorganic material such as silicon oxide ($SiO_x$), silicon nitride ($SiN_x$) or silicon oxynitride (SiON) or may have a structure in which the above materials are stacked.

A gate conductive layer 140 may be disposed on the gate insulating film 122. The gate conductive layer 140 may include the gate electrode GE of each thin-film transistor TFT. The gate electrode GE may overlap the channel region of the active layer ACT in the thickness direction. The gate conductive layer 140 may further include a first electrode of a storage capacitor.

The gate conductive layer 140 may include at least one of molybdenum (Mo), aluminum (Al), chromium (Cr), gold (Au), titanium (Ti), nickel (Ni), neodymium (Nd), and copper (Cu). The gate conductive layer 140 may be a single layer or a multilayer.

An interlayer insulating film 123 may be disposed on the gate conductive layer 140. The interlayer insulating film 123 may be disposed on the gate insulating film 122 on which the gate conductive layer 140 is formed. The interlayer insulating film 123 may include contact holes penetrating the interlayer insulating film 123. The source electrode SE and the drain electrode DE of each thin-film transistor TFT may contact the active layer ACT through the contact holes penetrating the interlayer insulating film 123.

A data conductive layer 150 may be disposed on the interlayer insulating film 123. The data conductive layer 150 may include the source electrode SE and the drain electrode DE of each thin-film transistor TFT.

The source electrode SE and the drain electrode DE may be spaced apart from each other on the interlayer insulating film 123. The source electrode SE may contact an end of the active layer ACT through a contact hole penetrating the interlayer insulating film 123 and the gate insulating film 122. The drain electrode DE may contact the other end of the active layer ACT through a contact hole penetrating the interlayer insulating film 123 and the gate insulating film 122. The drain electrode DE may be connected to a first electrode AE of the light emitting element layer EML through a contact hole penetrating a first passivation layer 124 and a via layer 125 which will be described later.

The data conductive layer 150 may be a single layer or a multilayer structure made of one or more of molybdenum (Mo), aluminum (Al), chromium (Cr), gold (Au), titanium (Ti), nickel (Ni), neodymium (Nd), copper (Cu), and an alloy of some of the above materials.

The first passivation layer 124 may be disposed on the data conductive layer 150. The first passivation layer 124 may be disposed on the thin-film transistors TFT to protect the thin-film transistors TFT by covering the thin-film transistors TFT. The first passivation layer 124 may include an inorganic insulating material such as silicon oxide ($SiO_x$), silicon nitride ($SiN_x$), or silicon oxynitride (SiON).

The via layer 125 may be disposed on the first passivation layer 124. The via layer 125 may be provided on the first passivation layer 124 to planarize the top of each thin-film transistor TFT. For example, the first electrode AE of the light emitting element layer EML to be described later may be electrically connected to the drain electrode DE of each thin-film transistor TFT through a first contact hole CNT1 penetrating the via layer 125 and the first passivation layer 124. The via layer 125 may include an organic insulating material, for example, an organic material such as polyimide (PI).

Layers of the light emitting element layer EML of the display substrate 10 are described with reference to FIGS. 6 and 7.

The light emitting element layer EML may be disposed on the thin-film transistor layer TFTL. The light emitting element layer EML may include a plurality of light emitting elements ED, the first and second electrodes AE and CE, first and second banks BNK1 and BNK2, and a second passivation layer PAS.

The first banks BNK1 may be disposed on the via layer 125. The first banks BNK1 may be disposed in each of the first through third light emitting areas LA1 through LA3. The first banks BNK1 disposed in each of the first through third light emitting areas LA1 through LA3 may be spaced apart from each other in the first direction DR1.

The first electrode AE may be disposed on the via layer 125. For example, the first electrode AE may be disposed on a first bank BNK1 disposed on the via layer 125 to cover the first bank BNK1. The first electrode AE may overlap one of the first through third light emitting areas LA1 through LA3 defined by the second banks BNK2. The first electrode AE may be connected to the drain electrode DE of each thin-film transistor TFT through the first contact hole CNT1 penetrating the via layer 125 and the first passivation layer 124.

The second electrode CE may be disposed on the via layer 125. For example, the second electrode CE may be disposed on a first bank BNK1 disposed on the via layer 125 to cover the first bank BNK1. The second electrode CE may overlap one of the first through third light emitting areas LA1 through LA3 defined by the second banks BNK2. For example, the second electrode CE may receive a common voltage supplied to all pixels PX.

The second electrode CE may contact the conductive pattern CP of the bottom metal layer 110 through the third contact hole CNT3 penetrating the via layer 125, the first passivation layer 124, the interlayer insulating film 123, the gate insulating film 122, and the buffer layer 121. A connection pattern including a conductive material may be disposed between the second electrode CE and the conductive pattern CP, and the second electrode CE and the conductive pattern CP may contact the connection pattern disposed between the second electrode CE and the conductive pattern CP and may be indirectly connected to each other through the connection pattern.

Since the second electrode CE is in contact with and connected to the conductive pattern CP, which overlaps the first hole HA1, through the third contact hole CNT3, heat generated from the light emitting elements ED to be described later may have a heat dissipation path leading to the conductive pattern CP through the second electrode CE. The heat (or thermal energy) H conducted to the conductive pattern CP through the second electrode CE may be released to the outside through the first hole HA1. This will be described in detail later.

A first insulating layer IL1 may cover a part of the first electrode AE and a part of the second electrode CE which are adjacent to each other and may insulate the first and second electrodes AE and CE from each other.

The light emitting elements ED may be disposed on the via layer 125 between the first electrode AE and the second electrode CE. The light emitting elements ED may be disposed on the first insulating layer ILL. A first end of the light emitting elements ED may be connected to the first electrode AE, and a second end of the light emitting elements ED may be connected to the second electrode CE. The light emitting elements ED may include active layers having the same material to emit light of the same wavelength band or light of the same color. Light emitted from the first through third light emitting areas LA1 through LA3 may have the same color. The light emitting elements ED may emit light of the third color or blue light having a peak wavelength in a range of 440 to 480 nm. Each of the first through third light emitting areas LA1 through LA3 may emit light of the third color or blue light.

The second banks BNK2 may define the first through third light emitting areas LA1 through LA3. Heights of the second banks BNK2 may be greater than those of the first banks BNK1.

The second passivation layer PAS may be disposed on the light emitting elements ED and the second banks BNK2. The second passivation layer PAS may cover and protect members of the light emitting element layer EML. The second passivation layer PAS may prevent damage to the light emitting elements ED by preventing penetration of impurities such as moisture or air from the outside.

The color conversion substrate 20 may be disposed on a surface of the display substrate 10 and may face the display substrate 10. The color conversion substrate 20 may include the first through third light exiting areas TA1 through TA3 and the light blocking area BA. The first through third light exiting areas TA1 through TA3 may correspond to the first through third light emitting areas LA1 through LA3 of the display substrate 10, respectively. The light blocking area BA may surround the first through third light exiting areas TA1 through TA3 to prevent color mixing of light emitted from the first through third light exiting areas TA1 through TA3.

The color conversion substrate 20 may include the color control structure that converts the color of incident light.

The color conversion substrate 20 may be disposed on the second passivation layer PAS to face the second passivation layer PAS. The color conversion substrate 20 may include the second substrate SUB2, the color filter layer CFL, the wavelength conversion layer WLC, the light transmission layer LTU, a first capping layer CAP1, and a second capping layer CAP2.

The second substrate SUB2 may include a transparent material. The second substrate SUB2 may include a transparent insulating material such as glass or quartz. The second substrate SUB2 may be a rigid substrate. The second substrate SUB2 may include plastic such as polyimide. A buffer layer may be disposed on the surface of the second substrate SUB2 facing the first substrate SUB1 to prevent introduction of impurities to the surface of the second substrate SUB2. The color filter layer CFL may directly contact the buffer layer.

The color filter layer CFL may be disposed on the surface of the second substrate SUB2. The color filter layer CFL may include a first color filter CF1, a second color filter CF2, and a third color filter CF3.

The first color filter CF1 may be disposed on the surface of the second substrate SUB2 and may overlap the first light exiting area TAL. The first color filter CF1 may selectively transmit light of the first color (e.g., red light) and block or absorb light of the second color (e.g., green light) and light of the third color (e.g., blue light). The first color filter CF1 may be a red color filter and may include a red colorant. The red colorant may be made of red dye or red pigment.

The second color filter CF2 may be disposed on the surface of the second substrate SUB2 and may overlap the second light exiting area TA2. The second color filter CF2 may selectively transmit light of the second color (e.g., green light) and block or absorb light of the first color (e.g., red light) and light of the third color (e.g., blue light). The second color filter CF2 may be a green color filter and may include a green colorant. The green colorant may be made of green dye or green pigment.

The third color filter CF3 may be disposed on the surface of the second substrate SUB2 and may overlap the third light exiting area TA3. The third color filter CF3 may overlap the light blocking area BA. The third color filter CF3 may overlap the first color filter CF1 or the second color filter CF2 in the light blocking area BA, thereby preventing color mixing of light emitted from the first through third light exiting areas TA1 through TA3. The third color filter CF3 may selectively transmit light of the third color (e.g., blue light) and block or absorb light of the first color (e.g., red light) and light of the second color (e.g., green light). The third color filter CF3 may be a blue color filter and may include a blue colorant. The blue colorant may be made of blue dye or blue pigment.

When the third color filter CF3 includes a blue colorant, external light or reflected light transmitted through the third color filter CF3 may have a blue wavelength band. The eye color sensibility that a user's eyes perceive varies depending on the color of light. For example, light in the blue wavelength band may be perceived less sensitively to a user than light in a green wavelength band and light in a red wavelength band. Therefore, since the third color filter CF3 includes a blue colorant, the user may perceive reflected light less sensitively.

The color filter layer CFL may absorb a part of light incident on the color conversion substrate 20 from the outside of the display device 1, thereby reducing reflected light due to the external light. Therefore, the color filter layer CFL can prevent color distortion due to reflection of external light.

The first capping layer CAP1 may cover the first through third color filters CF1 through CF3. The first capping layer CAP1 may prevent damage to or contamination of the first through third color filters CF1 through CF3 by preventing impurities such as moisture or air from being introduced from the outside. The first capping layer CAP1 may prevent the colorants contained in the first through third color filters CF1 through CF3 from spreading to the wavelength conversion layer WLC or the light transmission layer LTU.

The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

A plurality of light blocking members BK may overlap the light blocking area BA. The light blocking members BK may be directly disposed on the first capping layer CAP1 disposed on the first through third color filters CF1 through CF3. The light blocking members BK may block transmission of light. The light blocking members BK may prevent color mixing by preventing intrusion of light between the first through third light exiting areas TA1 through TA3, thereby improving a color gamut. The light blocking members BK may be disposed in a lattice shape surrounding the first through third light exiting areas TA1 through TA3 in a plan view.

The light blocking members BK may include an organic light blocking material and a liquid repellent component. Here, the liquid repellent component may be made of a fluorine-containing monomer or a fluorine-containing polymer, specifically, may include fluorine-containing aliphatic polycarbonate. The light blocking members BK may be made of a black organic material including a liquid repellent component. The light blocking members BK may be formed by coating and exposing an organic light blocking material including a liquid repellent component.

The light blocking members BK including a liquid repellent component may separate the wavelength conversion layer WLC and the light transmission layer LTU into light exiting areas. For example, when the wavelength conversion layer WLC and the light transmission layer LTU are formed using an inkjet method, an ink composition may flow on upper surfaces of the light blocking members BK. In this case, the light blocking members BK including a liquid repellent component may guide the ink composition to flow into each light exiting area. Therefore, the light blocking members BK can prevent mixing of the ink composition.

The wavelength conversion layer WLC may include a first wavelength conversion pattern WLC1 and a second wavelength conversion pattern WLC2.

The first wavelength conversion pattern WLC1 may be disposed on the first color filter CF1 to overlap the first light exiting area TA1. The first wavelength conversion pattern WLC1 may be surrounded by the light blocking members BK. The first wavelength conversion pattern WLC1 may include a first base resin BS1, first scatterers SCT1, and first wavelength conversion particles WLS1.

The first base resin BS1 may include a material having a relatively high light transmittance. The first base resin BS1 may be made of a transparent organic material. The first base resin BS1 may include at least one of organic materials such as epoxy resin, acrylic resin, cardo resin, and imide resin.

The first scatterers SCT1 may have a refractive index different from that of the first base resin BS1 and may form an optical interface with the first base resin BS1. The first scatterers SCT1 may include a light scattering material or light scattering particles that scatter at least a part of transmitted light. The first scatterers SCT1 may include metal oxide such as titanium oxide ($TiO_2$), zirconium oxide ($ZrO_2$), aluminum oxide ($A_2O_3$), indium oxide ($In_2O_3$) zinc oxide (ZnO) or tin oxide ($SnO_2$) or may include organic particles such as acrylic resin or urethane resin. The first scatterers SCT1 may scatter incident light in random directions regardless of the incident direction of the incident light without substantially converting the peak wavelength of the incident light.

The first wavelength conversion particles WLS1 may convert or shift the peak wavelength of incident light into a first peak wavelength. The first wavelength conversion particles WLS1 may convert blue light provided from the display substrate 10 into red light having a single peak wavelength in a range of 610 to 650 nm and emit the red light. The first wavelength conversion particles WLS1 may be quantum dots, quantum rods, or phosphors. The quantum dots may be particulate materials that emit light of a specific color when electrons transition from a conduction band to a valence band.

The quantum dots may be semiconductor nanocrystalline materials. The quantum dots may have a specific band gap according to their composition and size. Thus, the quantum dots may absorb light and then emit light having a unique wavelength. Examples of semiconductor nanocrystals of the quantum dots include group IV nanocrystals, group U-VI compound nanocrystals, group III-V compound nanocrystals, group IV-VI nanocrystals, and combinations of the same.

A part of blue light provided by the display substrate 10 may be transmitted through the first wavelength conversion pattern WLC1 without being converted into red light by the first wavelength conversion particles WLS1. Of the blue light provided from the display substrate 10, light incident on the first color filter CF1 without being converted by the first wavelength conversion pattern WLC1 may be blocked by the first color filter CF1. Red light into which the blue light provided from the display substrate 10 has been converted by the first wavelength conversion pattern WLC1 may be emitted to the outside through the first color filter CF1. Therefore, the first light exiting area TA1 may emit red light.

The second wavelength conversion pattern WLC2 may be disposed on the second color filter CF2 to overlap the second light exiting area TA2. The second wavelength conversion pattern WLC2 may be surrounded by the light blocking members BK. The second wavelength conversion pattern WLC2 may include a second base resin BS2, second scatterers SCT2, and second wavelength conversion particles WLS2.

The second base resin BS2 may include a material having a relatively high light transmittance. The second base resin BS2 may be made of a transparent organic material. The second base resin BS2 may be made of the same material as the first base resin BS1 or may be made of one or more materials suitable for the first base resin BS1.

The second scatterers SCT2 may have a refractive index different from that of the second base resin BS2 and may form an optical interface with the second base resin BS2. The second scatterers SCT2 may include a light scattering material or light scattering particles that scatter at least a part of transmitted light. The second scatterers SCT2 may be made of the same material as the first scatterers SCT1 or may be made of one or more of the materials suitable for the first scatterers SCT1. The second scatterers SCT2 may scatter incident light in random directions regardless of the incident direction of the incident light without substantially converting the peak wavelength of the incident light.

The second wavelength conversion particles WLS2 may convert or shift the peak wavelength of incident light into a second peak wavelength different from the first peak wavelength of the first wavelength conversion particles WLS1. The second wavelength conversion particles WLS2 may convert blue light provided from the display substrate 10 into green light having a single peak wavelength of 510 to 550 nm and emit the green light. The second wavelength conversion particles WLS2 may be quantum dots, quantum rods, or phosphors. The second wavelength conversion particles WLS2 may include a material having the same purpose as the materials exemplified in the description of the first wavelength conversion particles WLS1. The second wavelength conversion particles WLS2 may be made of quantum dots, quantum rods, or phosphors such that their wavelength conversion range is different from the wavelength conversion range of the first wavelength conversion particles WLS1.

The light transmission layer LTU may be disposed on the third color filter CF3 to overlap the third light exiting area TA3. The light transmission layer LTU may be surrounded by the light blocking members BK. The light transmission layer LTU may transmit incident light while maintaining the peak wavelength of the incident light. The light transmission layer LTU may include a third base resin BS3 and third scatterers SCT3.

The third base resin BS3 may include a material having a relatively high light transmittance. The third base resin BS3 may be made of a transparent organic material. The third base resin BS3 may be made of the same material as the first or second base resin BS1 or BS2 or may be made of one or more of the materials suitable for the first or second base resin BS1 or BS2.

The third scatterers SCT3 may have a refractive index different from that of the third base resin BS3 and may form an optical interface with the third base resin BS3. The third scatterers SCT3 may include a light scattering material or light scattering particles that scatter at least a part of transmitted light. The third scatterers SCT3 may be made of the same material as the first or second scatterers SCT1 or SCT2 or may be made of one or more of the materials suitable for the first or second scatterers SCT1 or SCT2. The third scatterers SCT3 may scatter incident light in random directions regardless of the incident direction of the incident light without substantially converting the peak wavelength of the incident light.

The second capping layer CAP2 may cover the first and second wavelength conversion patterns WLC1 and WLC2, the light transmission layer LTU, and the light blocking members BK. The second capping layer CAP2 may prevent damage to or contamination of the first and second wavelength conversion patterns WLC1 and WLC2 and the light transmission layer LTU by sealing the first and second wavelength conversion patterns WLC1 and WLC2 and the light transmission layer LTU. The second capping layer CAP2 may be made of the same material as the first capping layer CAP1 or may be made of one or more of the materials suitable for the first capping layer CAPE The filling layer 50 may be disposed in the space between the display substrate 10 and the color conversion substrate 20 and may be surrounded by the sealing member 70.

The filling layer 50 may fill the space between the display substrate 10 and the color conversion substrate 20. The filling layer 50 may be made of an organic material and may transmit light. The filling layer 50 may be made of a silicon-based organic material or an epoxy-based organic material. The filling layer 50 may have adhesive strength and may fix the display substrate 10 and the color conversion substrate 20 to each other.

Referring to FIG. 7, each of pixels PX may include first through third subpixels SPX1 through SPX3. The first through third subpixels SPX1 through SPX3 may correspond to the first through third light emitting areas LA1 through LA3, respectively. The light emitting elements ED of the first through third subpixels SPX1 through SPX3 may emit light through the first through third light emitting areas LA1 through LA3, respectively.

The first through third subpixels SPX1 through SPX3 may emit light of the same color. The first through third subpixels SPX1 through SPX3 may include the same type of light emitting elements ED and emit light of the third color or blue light. For another example, the first subpixel SPX1 may emit light of the first color or red light, the second subpixel SPX2 may emit light of the second color or green light, and the third subpixel SPX3 may emit light of the third color or blue light.

Each of the first through third subpixels SPX1 through SPX3 may include the first and second electrodes AE and CE, the light emitting elements ED, a plurality of contact electrodes CTE, and a plurality of second banks BNK2.

The first and second electrodes AE and CE may be electrically connected to the light emitting elements ED to receive a predetermined voltage, and the light emitting elements ED may emit light of a specific wavelength band. At least a part of each of the first and second electrodes AE and CE may form an electric field in the pixel PX, and the light emitting elements ED may be aligned by the electric field.

The first electrode AE may be a pixel electrode separate for each of the first through third subpixels SPX1 through SPX3, and the second electrode CE may be a common electrode connected in common to the first through third subpixels SPX1 through SPX3. One of the first electrode AE and the second electrode CE may be an anode of each light emitting element ED, and the other may be a cathode of each light emitting element ED.

The first electrode AE may include a first electrode stem part AE1 extending in the first direction DR1 and one or more first electrode branch parts AE2 branching from the first electrode stem part AE1 to extend in the second direction DR2.

The first electrode stem part AE1 of each of the first through third subpixels SPX1 through SPX3 may be spaced apart from the first electrode stem part AE1 of an adjacent subpixel and may be disposed on an imaginary extension line of the first electrode stem part AE1 of the subpixel adjacent in the first direction DR1. The respective first electrode stem parts AE1 of the first through third subpixels SPX1 through SPX3 may receive different signals and may be driven independently.

The first electrode branch parts AE2 may branch from the first electrode stem part AE1 to extend in the second direction DR2. An end of each first electrode branch part AE2 may be connected to the first electrode stem part AE1, and the other end of each first electrode branch part AE2 may be spaced apart from a second electrode stem part CE1 facing the first electrode stem part AE1.

The second electrode CE may include the second electrode stem part CE1 extending in the first direction DR1 and a second electrode branch part CE2 branching from the second electrode stem part CE1 to extend in the second direction DR2. The second electrode stem part CE1 of each of the first through third subpixels SPX1 through SPX3 may be connected to the second electrode stem part CE1 of an adjacent subpixel. The second electrode stein part CE1 may extend in the first direction DR1 across a plurality of pixels PX. The second electrode stem part CE1 may be connected to the periphery of the display area DA or a part extending in a direction in the non-display area NDA.

The second electrode branch part CE2 may be spaced apart from the first electrode branch parts AE2 to face them. An end of the second electrode branch part CE2 may be connected to the second electrode stem part CE1, and the other end of the second electrode branch part CE2 may be spaced apart from the first electrode stem part AE1.

The first electrode AE may be electrically connected to the thin-film transistor layer TFTL of the display substrate 10 through a first contact hole CNT1, and the second electrode CE may be electrically connected to the thin-film transistor layer TFTL of the display substrate 10 through the second contact hole CNT2 and/or the third contact hole CNT3. The first contact hole CNT1 may be disposed in each first electrode stem part AE1, and the second contact hole CNT2 and the third contact hole CNT3 may be disposed in the second electrode stem part CE1.

Referring to FIGS. 6 and 7, the first electrode AE may be electrically connected to the drain electrode DE of each thin-film transistor TFT of the thin-film transistor layer TFTL through the first contact hole CNT1. Although not illustrated in the drawings, the second electrode CE may be electrically connected to a power line and may contact the conductive pattern CP of the bottom metal layer 110 through the third contact hole CNT3.

The second banks BNK2 may be disposed at boundaries between a plurality of pixels PX. A plurality of first electrode stem parts AE1 may be spaced apart from each other by the second banks BNK2. The second banks BNK2 may extend in the second direction DR2 and may be disposed at the boundaries of pixels PX arranged in the first direction DR1. Additionally, the second banks BNK2 may be disposed at the boundaries of pixels PX arranged in the second direction DR2. The second banks BNK2 may define the boundaries of the pixels PX.

The second banks BNK2 may prevent ink from crossing the boundaries of adjacent pixels PX when the ink in which the light emitting elements ED are dispersed is sprayed during the manufacture of the display substrate 10. The second banks BNK2 may separate inks in which different light emitting elements ED are dispersed so that the inks are not mixed with each other.

The light emitting elements ED may be disposed between the first electrode AE and the second electrode CE. The first end of the light emitting elements ED may be connected to the first electrode AE, and the second end of the light emitting elements ED may be connected to the second electrode CE. The light emitting elements ED may be connected to the first electrode AE through first contact electrodes CTE1 and may be connected to the second electrode CE through a second contact electrode CTE2.

The light emitting elements ED may be spaced apart from each other and aligned substantially parallel to each other. A gap between the light emitting elements ED is not particularly limited. Some of the light emitting elements ED may be disposed adjacent to each other, some other ones of the light emitting elements ED may be spaced apart from each other by a predetermined distance, and some other ones of the light emitting elements ED may be disposed with non-uniform density but may be aligned in a specific direction. For example, each of the light emitting elements ED may be disposed in a direction perpendicular to the direction in which each first electrode branch part AE2 or the second electrode branch part CE2 extends. For another example, each of the light emitting elements ED may be disposed in a direction oblique to the direction in which each first electrode branch part AE2 or the second electrode branch part CE2 extends.

The light emitting elements ED may include active layers having the same material to emit light of the same wavelength band or light of the same color. The first through third subpixels SPX1 through SPX3 may emit light of the same color. The light emitting elements ED may emit light of the third color or blue light having a peak wavelength in a range of 440 to 480 nm. Therefore, each of the first through third light emitting areas LA1 through LA3 of the display substrate 10 may emit light of the third color or blue light. For another example, the first through third subpixels SPX1 through SPX3 may include light emitting elements ED having different active layers to emit light of different colors.

The contact electrodes CTE may include the first and second contact electrodes CTE1 and CTE2. The first contact electrodes CTE1 may cover parts of the first electrode branch parts AE2 and the first end of the light emitting elements ED and may electrically connect the first electrode branch parts AE2 and the light emitting elements ED to each other. The second contact electrode CTE2 may cover a part of the second electrode branch part CE2 and the second end of the light emitting elements ED and may electrically connect the second electrode branch part CTE2 and the light emitting elements ED.

The first contact electrodes CTE1 may be disposed on the first electrode branch parts AE2 to extend in the second direction DR2. The first contact electrodes CTE1 may contact the first end of the light emitting elements ED. The light emitting elements ED may be electrically connected to the first electrode AE through the first contact electrodes CTE1.

The second contact electrode CTE2 may be disposed on the second electrode branch part CE2 to extend in the second direction DR2. The second contact electrode CTE2 may be spaced apart from the first contact electrodes CTE1 in the first direction DR1. The second contact electrode CTE2 may contact the second end of the light emitting elements ED. The light emitting elements ED may be electrically connected to the second electrode CE through the second contact electrode CTE2.

For example, respective widths of the first and second contact electrodes CTE1 and CTE2 may be greater than respective widths of the first and second electrode branch parts AE2 and CE2. For another example, the first and second contact electrodes CTE1 and CTE2 may cover respective sides of the first and second electrode branch parts AE2 and CE2, respectively.

Figure 8:
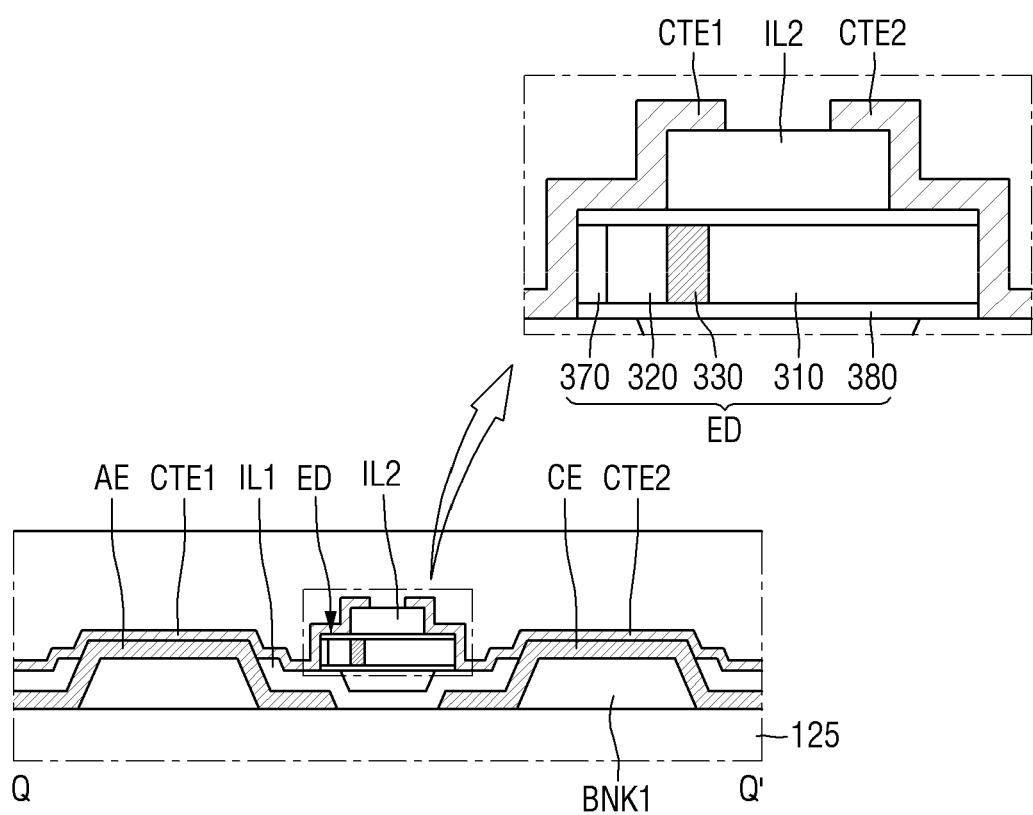
FIG. 8 illustrates a schematic cross-sectional view taken along line Q-Q' of FIG. 7 according to an embodiment.

FIG. 8 is a cross-sectional view taken along line Q-Q' of FIG. 7 according to an embodiment.

Referring to FIG. 8, the light emitting element layer EML of the display substrate 10 may be disposed on the thin-film transistor layer TFTL and may include the first and second insulating layers IL1 and IL2.

The first banks BNK1 may protrude from a surface of the via layer 125, and side surfaces of each of the first banks BNK1 may be inclined with respect to the surface of the via layer 125. The inclined surfaces (side surfaces) of the first banks BNK1 may reflect light emitted from a light emitting element ED.

Referring to FIG. 8 in conjunction with FIGS. 6 and 7, the first electrode stem part AE1 may be electrically connected to the thin-film transistor layer TFTL through the first contact hole CNT1 penetrating the via layer 125. The first electrode stem part AE1 may be electrically connected to a thin-film transistor TFT through the first contact hole CNT1. Therefore, the first electrode AE may receive a predetermined electrical signal from the thin-film transistor TFT.

The second electrode stem part CE1 may extend in the first direction DR1 and may be disposed in the non-light emitting area NLA in which the light emitting element ED is not disposed. The second electrode stem part CE1 may be electrically connected to the thin-film transistor layer TFTL through the second contact hole CNT2 penetrating the via layer 125 and the first passivation layer 124 in the non-light emitting area NLA. The second electrode stem part CE1 may be electrically connected to a power electrode through the second contact hole CNT2. Therefore, the second electrode CE may receive a predetermined electrical signal from the power electrode.

The second electrode stem part CE1 may contact the conductive pattern CP of a bottom metal layer 110 through the third contact hole CNT3 penetrating the via layer 125, the first passivation layer 124, the interlayer insulating film 123, the gate insulating film 122, and the buffer layer 121. Since the second electrode stem part CE1 contacts the conductive pattern CP, heat generated by light emission of the light emitting element ED may have a heat dissipation path along the second electrode stem part CE1 and the conductive pattern CP.

The first and second electrodes AE and CE may include a transparent conductive material or a conductive material having high reflectivity. Examples of the transparent conductive material may include, but are not limited to, at least one of indium tin oxide (ITO), indium zinc oxide (IZO), and indium tin zinc oxide (ITZO). Examples of the conductive material having high reflectivity may include metals such as silver (Ag), copper (Cu), and aluminum (Al). The first and second electrodes AE and CE may reflect light incident from the light emitting element ED to above the display substrate 10.

The first insulating layer IL1 may be disposed on the via layer 125, the first electrode AE, and the second electrode CE. The first insulating layer IL1 may cover a part of each of the first and second electrodes AE and CE and insulate them from each other. The first insulating layer IL1 may include an inorganic insulating material. The first insulating layer IL1 may prevent the light emitting element ED from directly contacting other members and thus being damaged.

The light emitting element ED may be disposed on the first insulating layer IL1 between the first electrode AE and the second electrode CE. The first end of the light emitting element ED may be connected to the first electrode AE, and the second end of the light emitting element ED may be connected to the second electrode CE. The light emitting element ED may be connected to the first electrode AE through a first contact electrode CTE1 and may be connected to the second electrode CE through the second contact electrode CTE2.

The second insulating layer IL2 may be disposed on a part of the light emitting element ED disposed between the first and second electrodes AE and CE. The second insulating layer IL2 may fix the light emitting element ED.

The contact electrodes CTE may include the first and second contact electrodes CTE1 and CTE2, and the first and second contact electrodes CTE1 and CTE2 may be disposed on the first and second electrodes AE and CE, respectively. The first and second contact electrodes CTE1 and CTE2 may respectively electrically connect the first and second electrodes AE and CE to the light emitting element ED.

The contact electrodes CTE may include a conductive material. The contact electrodes CTE may include, but are not limited to, ITO, IZO, ITZO, or aluminum (Al).

A heat dissipation path through which heat generated from the light emitting elements ED is dissipated to the environment outside the display device 1 is described with reference to FIGS. 6 through 8.

Heat generated from the light emitting elements ED may have a heat dissipation path along which the heat is conducted and thus diffused to the conductive pattern CP through an area where a part of each light emitting element ED physically contacts the second contact electrode CTE2. Specifically, heat generated from the light emitting elements ED may be diffused to the second electrode CE through the second contact electrode CTE2 in a part where each light emitting element ED physically contacts the second contact electrode CTE2, and the heat diffused to the second electrode CE may be diffused to the conductive pattern CP through an area where the second electrode CE physically contacts the conductive pattern CP through the third contact hole CNT3.

Since the conductive pattern CP is disposed on the first substrate SUB1 to overlap the first hole HA1 in the third direction DR3, the heat H transferred (or diffused) to the conductive pattern CP can be released to the outside of the display device 1 through the first hole HA1. Therefore, heat generated from the light emitting elements ED may have a heat dissipation path along which the heat is diffused to the conductive pattern CP disposed in an area adjacent to the first hole HA1 through a plurality of conductive layers of the display substrate 10. Since the conductive pattern CP is exposed to the outside by the first hole HA1, the heat H transferred to the conductive pattern CP may be released from the conductive pattern CP to the outside of the display device 1 or the display substrate 10 (bottom in FIG. 6) by heat convection in an area defined by the first hole HA1. That is, heat generated from the light emitting elements ED may be conducted and transferred to the conductive pattern CP through mutual contact between a plurality of conductive materials included in the display substrate 10, and the heat H transferred to the conductive pattern CP may be released to the outside through each first hole HA1 formed in the first substrate SUB1 to overlap the conductive pattern CP in the third direction DR3.

Although the first substrate SUB1, like glass, has low thermal conductivity, a plurality of first holes HA1 formed in the first substrate SUB1 to penetrate the first substrate SUB1 may allow heat generated from the light emitting elements ED to be easily released to the outside through the first holes HA1, thereby preventing deterioration of the display device 1. The heat generated from the light emitting elements ED may be transferred to the first substrate SUB1 through diffusion and then released to the outside through the first holes HA1. The heat generated from the light emitting elements ED may have a heat dissipation path along which the heat is conducted to the conductive pattern CP through mutual contact between a plurality of conductive materials. Since each first hole HA1 is formed to overlap the conductive pattern CP in the third direction DR3, the heat H transferred to the conductive pattern CP can be more easily released to the outside through the first hole HA1. Therefore, the first holes HA1 formed in the first substrate SUB1 can improve heat dissipation efficiency of the display device 1 and mitigate heat generation of the display device 1. The improved heat dissipation efficiency and mitigated heat generation of the display device 1 can prevent the light emitting elements ED from being damaged by heat failing to be released from the inside of the display device 1 to the outside. This can extend the life of the light emitting elements ED, thereby improving the display quality of the display device 1.

Figure 9:
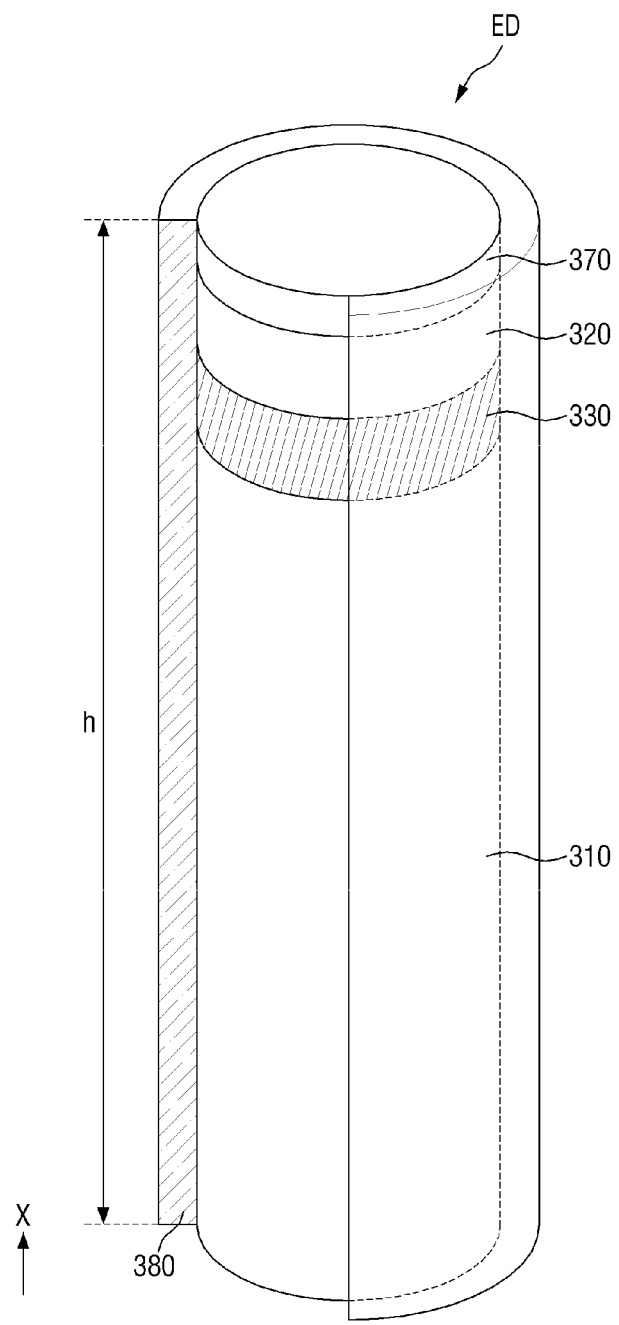
FIG. 9 illustrates a light emitting element according to an embodiment.

FIG. 9 illustrates a light emitting element ED according to an embodiment.

Referring to FIG. 9, the light emitting element ED is a particulate element and may be shaped like a rod or a cylinder having a predetermined aspect ratio. A length h of the light emitting element ED may be greater than a diameter of the light emitting element ED, and the aspect ratio of the light emitting element ED may be 1.2:1 to 100:1.

The light emitting element ED may have a nanometer-scale size (1 nm to less than 1 μm) or a micrometer-scale size (1 μm to less than 1 mm). In an embodiment, both the diameter and length of the light emitting element ED may have a nanometer-scale size or a micrometer-scale size. In some other embodiments, the diameter of the light emitting element ED may have a nanometer-scale size, whereas the length of the light emitting element ED has a micrometer-scale size. In some embodiments, some of a plurality of light emitting elements ED may have a nanometer-scale size in diameter and/or length, whereas the other ones of the light emitting elements ED have a micrometer-scale size in diameter and/or length.

The light emitting element ED may include an inorganic LED. The inorganic LED may include a plurality of semiconductor layers. The inorganic LED may include a first conductivity type (e.g., n-type) semiconductor layer, a second conductivity type (e.g., p-type) semiconductor layer, and an active semiconductor layer interposed between them. The active semiconductor layer may receive holes and electrons respectively from the first conductivity type semiconductor layer and the second conductivity type semiconductor layer, and the holes and the electrons reaching the active semiconductor layer may combine together to emit light.

The above-described semiconductor layers may be sequentially stacked along a longitudinal direction (e.g., x direction) of the light emitting element ED. The light emitting element ED may include a first semiconductor layer 310, an active layer 330, and a second semiconductor layer 320 sequentially stacked in the longitudinal direction as illustrated in FIG. 9. The first semiconductor layer 310, the active layer 330, and the second semiconductor layer 320 may be the first conductivity type semiconductor layer, the active semiconductor layer, and the second conductivity type semiconductor layer described above, respectively.

The first semiconductor layer 310 may be doped with a first conductivity type dopant. The first conductivity type dopant may be Si, Ge, or Sn. The first semiconductor layer 310 may be n-GaN doped with n-type Si.

The second semiconductor layer 320 may be spaced apart from the first semiconductor layer 310 with the active layer 330 interposed between them. The second semiconductor layer 320 may be doped with a second conductivity type dopant such as Mg, Zn, Ca, Se, or Ba. The second semiconductor layer 320 may be p-GaN doped with p-type Mg.

The active layer 330 may include a material having a single or multiple quantum well structure. The active layer 330 may emit light through combination of electron-hole pairs according to electrical signals received through the first semiconductor layer 310 and the second semiconductor layer 320.

The active layer 330 may have a structure in which a semiconductor material having a large band gap energy and a semiconductor material having a small band gap energy are alternately stacked or may include different group 3 to 5 semiconductor materials depending on the wavelength band of light that it emits.

Light emitted from the active layer 330 may be radiated not only to an outer surface of the light emitting element ED in the longitudinal direction but also to both side surfaces. That is, the direction of light emitted from the active layer 330 is not limited to one direction.

The light emitting element ED may further include an electrode layer 370 disposed on the second semiconductor layer 320. The electrode layer 370 may contact the second semiconductor layer 320. The electrode layer 370 may be an ohmic contact electrode. The electrode layer 370 may be a Schottky contact electrode.

When both ends of the light emitting element ED are electrically connected to electrodes to transmit electrical signals to the first semiconductor layer 310 and the second semiconductor layer 320, the electrode layer 370 may be disposed between the second semiconductor layer 320 and the electrodes to reduce the resistance between them. The electrode layer 370 may include at least one of aluminum (Al), titanium (Ti), indium (In), gold (Au), silver (Ag), indium tin oxide (ITO), indium zinc oxide (IZO), and indium tin zinc oxide (ITZO). The electrode layer 370 may also include an n-type or p-type doped semiconductor material.

The light emitting element ED may further include an insulating film 380 surrounding outer circumferential surfaces of the first semiconductor layer 310, the second semiconductor layer 320, the active layer 330, and/or the electrode layer 370. The insulating film 380 may surround the outer surface of at least the active layer 330 and extend in the direction in which the light emitting element ED extends. The insulating film 380 may protect the above members. The insulating film 380 may be made of materials having insulating properties to prevent an electrical short circuit that may occur when the active layer 330 directly contacts an electrode through which an electrical signal is transmitted to the light emitting element ED. Since the insulating film 380 protects the outer circumferential surfaces of the first and second semiconductor layers 310 and 320 as well as the active layer 330, a reduction in luminous efficiency can be prevented.

FIGS. 10 through 14 are cross-sectional views illustrating processes of a method of manufacturing the display device 1 of FIG. 6. In FIGS. 10 through 14, the detailed cross-sectional structures of the thin-film transistor layer TFTL and the light emitting element layer EML of the display substrate 10 are not illustrated for ease of description.

Figure 10:
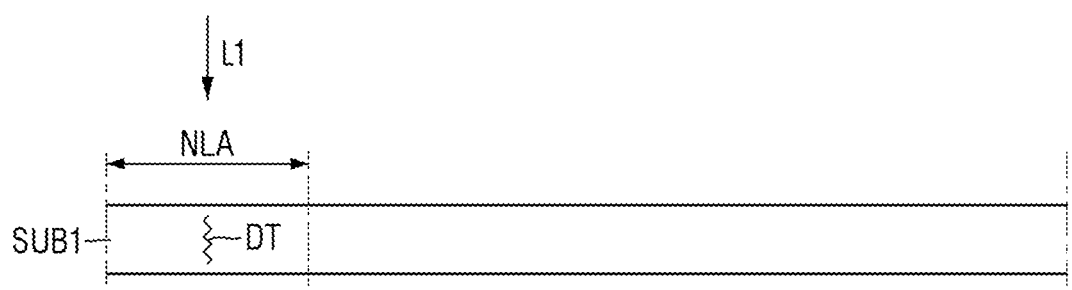
FIG. 10, FIG. 11, FIG. 12A, FIG. 12B, FIG. 13, and FIG. 14 are schematic cross-sectional views illustrating processes in a method of manufacturing a display device and structures related to the processes according to one or more embodiments.

First, referring to FIG. 10, a laser-damaged area DT may be formed inside the first substrate SUB1 by irradiating a first laser beam L1 into the first substrate SUB1 by using a laser. The focus of the first laser beam L1 may be located inside the first substrate SUB1. The laser-damaged area DT formed inside the first substrate SUB1 by irradiating the first laser beam L1 may be formed at a position corresponding to a first hole HA1 formed in the non-light emitting area NLA. The laser is not particularly limited as long as it can damage a part of the first substrate SUB1. The laser may be a pulsed laser.

In an embodiment in which the first substrate SUB1 includes glass or quartz, the laser-damaged area DT formed inside the first substrate SUB1 by irradiating the first laser beam L1 may be a weakened area. Therefore, at least a part of the first substrate SUB1 which corresponds to the laser-damaged area DT may be etched by an etching process of the first substrate SUB1 which will be described later.

Figure 11:
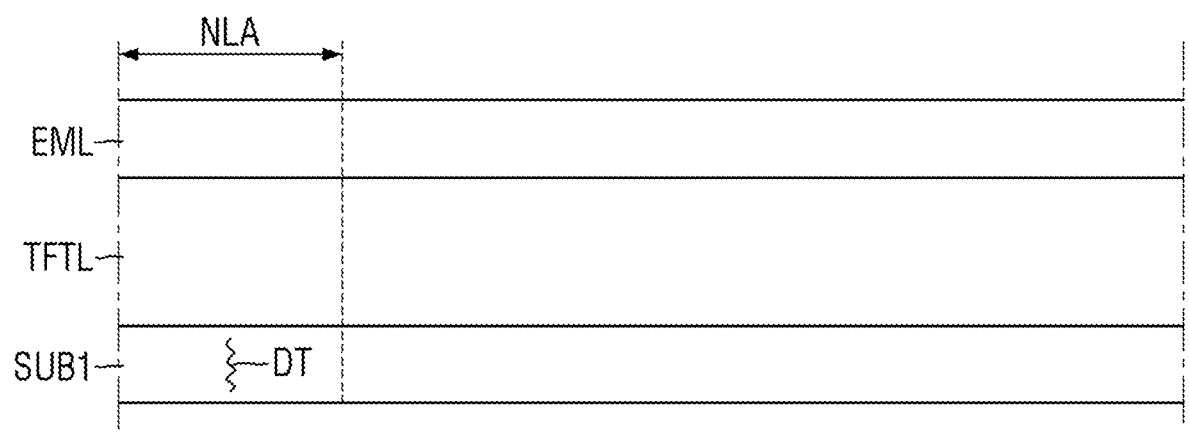

Next, referring to FIG. 11, the thin-film transistor layer TFTL is formed on a surface of the first substrate SUB1, and the light emitting element layer EML is formed on the thin-film transistor layer TFTL. The thin-film transistor layer TFTL and the light emitting element layer EML disposed on the surface of the first substrate SUB1 may be entirely formed on the first substrate SUB1.

Figure 12A:
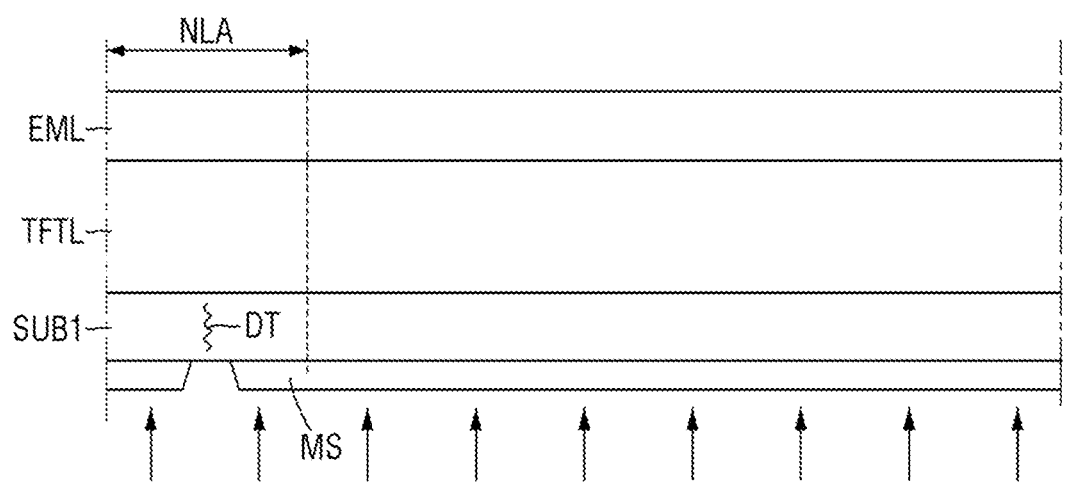
Figure 12B:
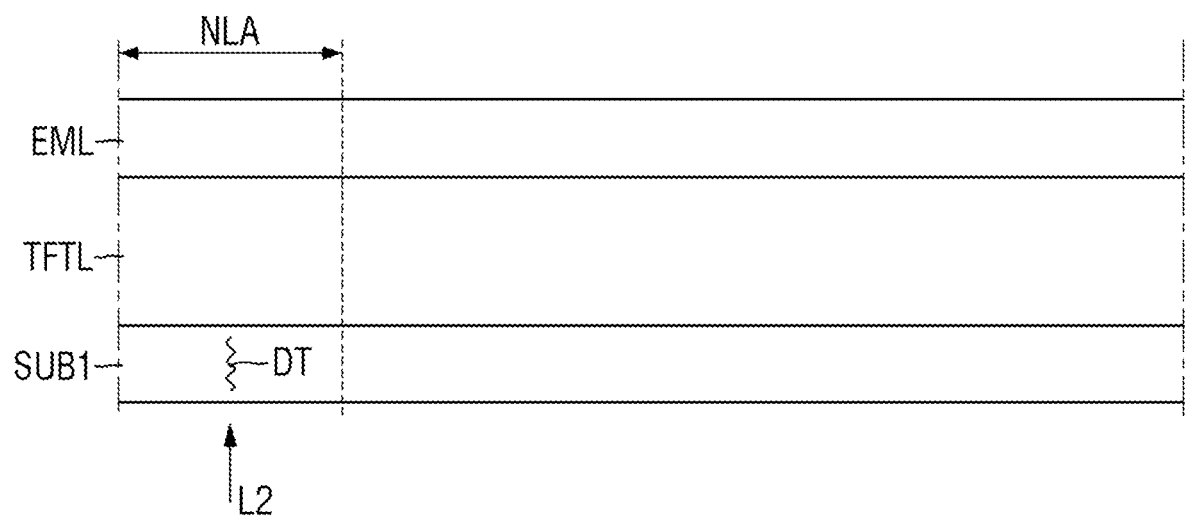
Figure 13:
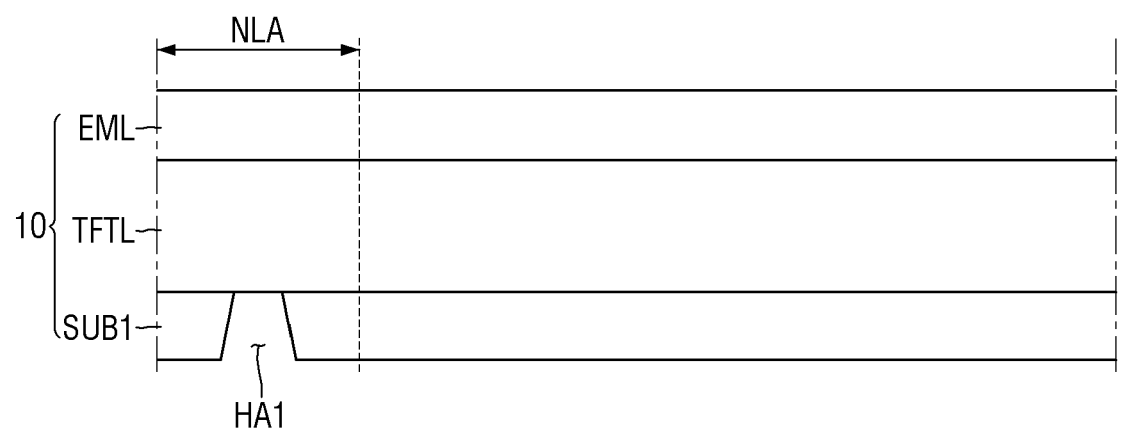

Next, referring to FIGS. 12A, 12B and 13, a first hole HA1 penetrating the first substrate SUB1 is formed in the first substrate SUB1 corresponding to the laser-damaged area DT. The first hole HA1 penetrating the first substrate SUB1 may be formed by a laser drilling process, an etching process, or the like.

Referring to FIG. 12A, in an embodiment, a first hole HA1 penetrating the first substrate SUB1 may be formed through an etching process using an etching mask. A photoresist pattern (a plurality of contact hole patterns) may be formed on the other surface opposite the surface of the first substrate SUB1 on which the thin-film transistor layer TFTL is disposed, and a plurality of first holes HA1 penetrating the first substrate SUB1 may be formed in the first substrate SUB1 as illustrated in FIG. 13 using the photoresist pattern as an etching mask MS. The etching mask MS may expose the first substrate SUB1 in areas corresponding to the first holes HA1. Then, an etching process for etching the first substrate SUB1 may be performed using the etching mask MS that exposes the areas corresponding to the first holes HA1. The etching process performed to form the first holes HA1 by etching the first substrate SUB1 may be wet etching. An etchant used to form the first holes HA1 in the first substrate SUB1 may include HF, KOH, or NaOH.

Referring to FIGS. 6 and 12A, when the thin-film transistor layer TFTL or the light emitting element layer EML is exposed for a long time to the etchant used in the etching process for forming the first hole HA1 penetrating the first substrate SUB1, the first substrate SUB1 corresponding to the laser-damaged area DT may be completely etched. As a result, even the thin-film transistor layer TFTL or the light emitting element layer EML may be exposed to the etchant. In this case, a part of the thin-film transistor layer TFTL or the light emitting element layer EML may be damaged by the etchant. Therefore, the conductive pattern CP included in the thin-film transistor layer TFTL may serve as an etching stopper that prevents the thin-film transistor layer TFTL or the light emitting element layer EML from being etched by the etchant. In an embodiment in which HF is used as the etchant for forming the first hole HA1 in the first substrate SUB1, the conductive pattern CP may include PI or MO.

Referring to FIG. 12B, a first hole HA1 penetrating the first substrate SUB1 may be formed by a laser drilling process. The first hole HA1 may be formed as illustrated in FIG. 13 by irradiating a second laser beam L2 toward the other surface of the first substrate SUB1 opposite the surface of the first substrate SUB1 on which the thin-film transistor layer TFTL is disposed. The second laser beam L2 may be irradiated to an area corresponding to the laser-damaged area DT.

A photoresist pattern (a plurality of contact hole patterns) may not be formed on the other surface opposite the surface of the first substrate SUB1 on which the thin-film transistor layer TFTL is disposed. Instead, a plurality of first holes HA1 penetrating the first substrate SUB1 may be formed in the first substrate SUB1 by using the first substrate SUB1 as an etching mask. The laser-damaged area DT formed in the non-light emitting area NLA of the first substrate SUB1 may be an area damaged by the first laser beam L1. Therefore, when the entire surface of the first substrate SUB1 is exposed to an etchant, an area corresponding to the laser-damaged area DT may be etched more than other areas due to a difference between the etch selectivity of the area corresponding to the laser-damaged area DT of the first substrate SUB1 and the etch selectivity of other areas excluding the laser-damaged area DT of the first substrate SUB1 with respect to the etchant. As a result, a first hole HA1 penetrating the first substrate SUB1 may be formed.

Figure 14:
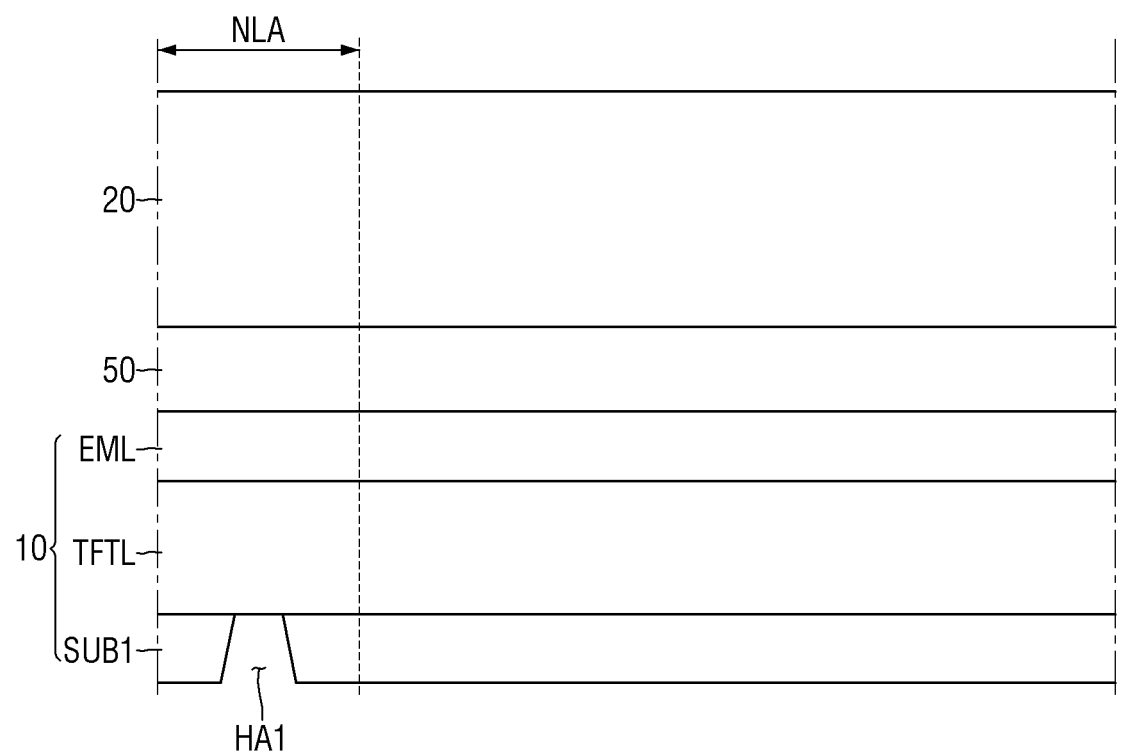

Next, referring to FIG. 14, the display substrate 10 and the color conversion substrate 20 are bonded to each other. The filling layer 50 may be disposed between the display substrate 10 and the color conversion substrate 20.

Hereinafter, other embodiments of the display device will be described. In the following embodiments, a description of the same elements as those of the above-described embodiment will be omitted or given briefly, and differences will be mainly described.

Figure 15:
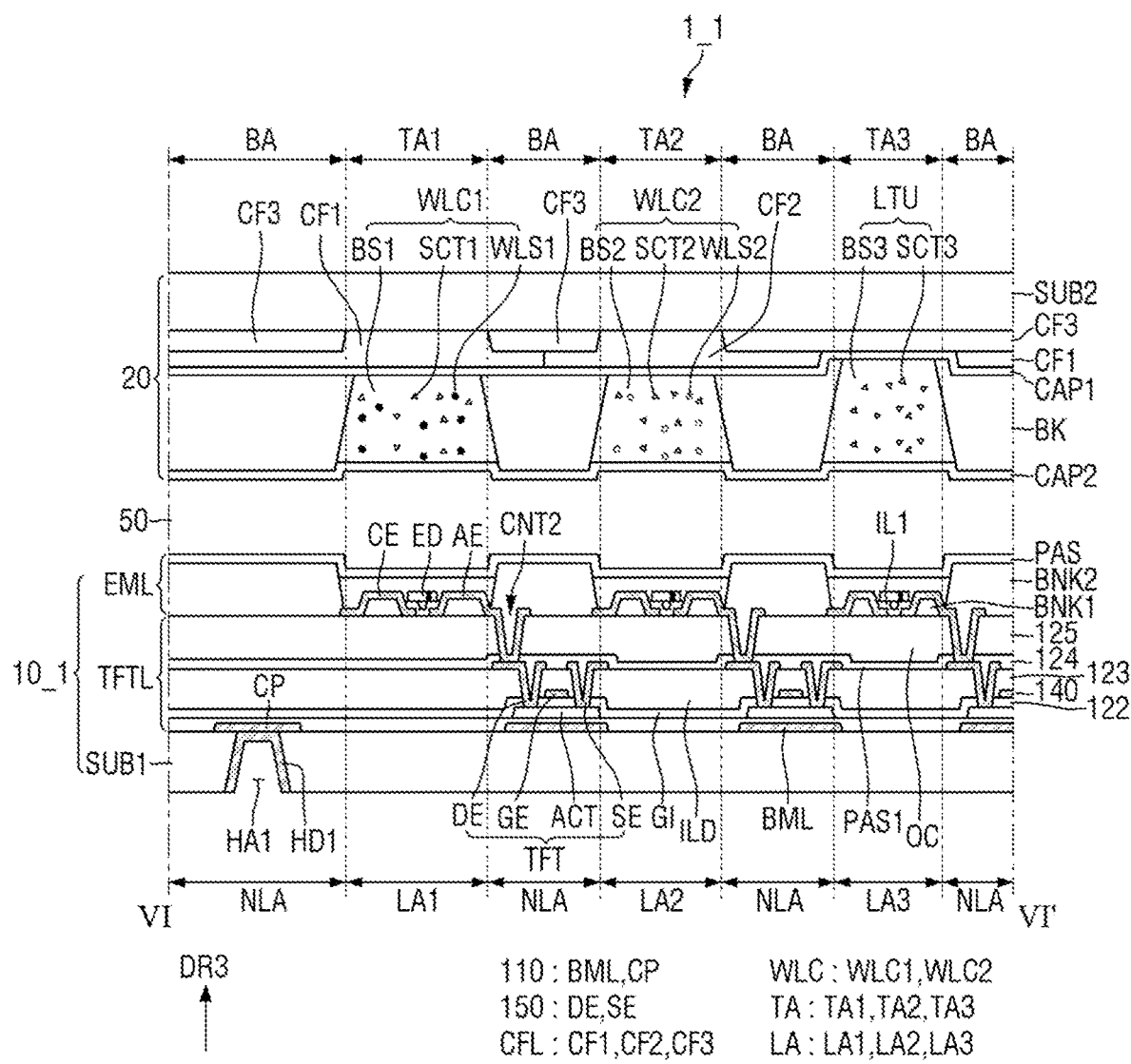
FIG. 15 is a schematic cross-sectional view of a display device according to an embodiment.

FIG. 15 is a cross-sectional view of a display device 1_1 according to an embodiment.

Referring to FIG. 15, the display device 1_1 is different from the display device 1 of FIG. 6 in that it includes a display substrate 10_1 further including a first metal coating layer HD1 disposed on one or more sidewalls of a first hole HA1 formed in a first substrate SUB1.

The first metal coating layer HD1 may be further disposed in an area corresponding to the first hole HA1. The first metal coating layer HD1 may be disposed on the sidewalls of the first hole HA1 (or sidewalls of the first substrate SUB1 which define the first hole HA1) and a surface of a conductive pattern CP. The surface of the conductive pattern CP on which the first metal coating layer HD1 is disposed may be a surface of the conductive pattern CP exposed by the first hole HA1. The first metal coating layer HD1 may overlap the conductive pattern CP in the third direction DR3.

The first metal coating layer HD1 may include a metal material having high thermal conductivity. The first metal coating layer HD1 may include silver (Ag), copper (Cu), aluminum (Al), molybdenum (Mo), indium tin oxide (ITO), or an alloy of some of the above materials. The first metal coating layer HD1 may be directly deposited or coated on the sidewalls of the first substrate SUB1 which form the first hole HA1. The deposition or coating method may be plating, sputtering, or the like.

Heat generated from light emitting elements ED may have a heat dissipation path along which the heat is diffused from the light emitting elements ED to the conductive pattern CP and the first metal coating layer HD1 through a layer including a plurality of thermally conductive materials disposed between the first substrate SUB1 and the light emitting elements ED.

The second end of the light emitting elements ED and a second contact electrode CTE2 may physically contact each other, the second contact electrode CTE2 and a second electrode CE may physically contact each other, the second electrode CE and the conductive pattern CP may physically contact each other through a third contact hole CNT3 (see FIG. 7), and the conductive pattern CP and the first metal coating layer HD1 may physically contact each other. Therefore, heat generated from the light emitting elements ED may be transferred from the light emitting elements ED to the conductive pattern CP and the first metal coating layer HD1 by heat conduction due to physical contact between the above layers. The heat transferred to the conductive pattern CP may be conducted and transferred to the first metal coating layer HD1 in an area in which the conductive pattern CP and the first metal coating layer HD1 are in contact with each other. The heat transferred to the first metal coating layer HD1 may be released to the outside of the display device 1_1 through the first hole HA1 penetrating the first substrate SUB1. That is, the first metal coating layer HD1 further formed on the sidewalls of the first hole HA1 may increase a heat dissipation area and increase the area of contact of the display device 1_1 with the outside, thereby increasing heat dissipation efficiency by convection. Therefore, heat generation inside the display device 1_1 can be reduced.

Figure 16:
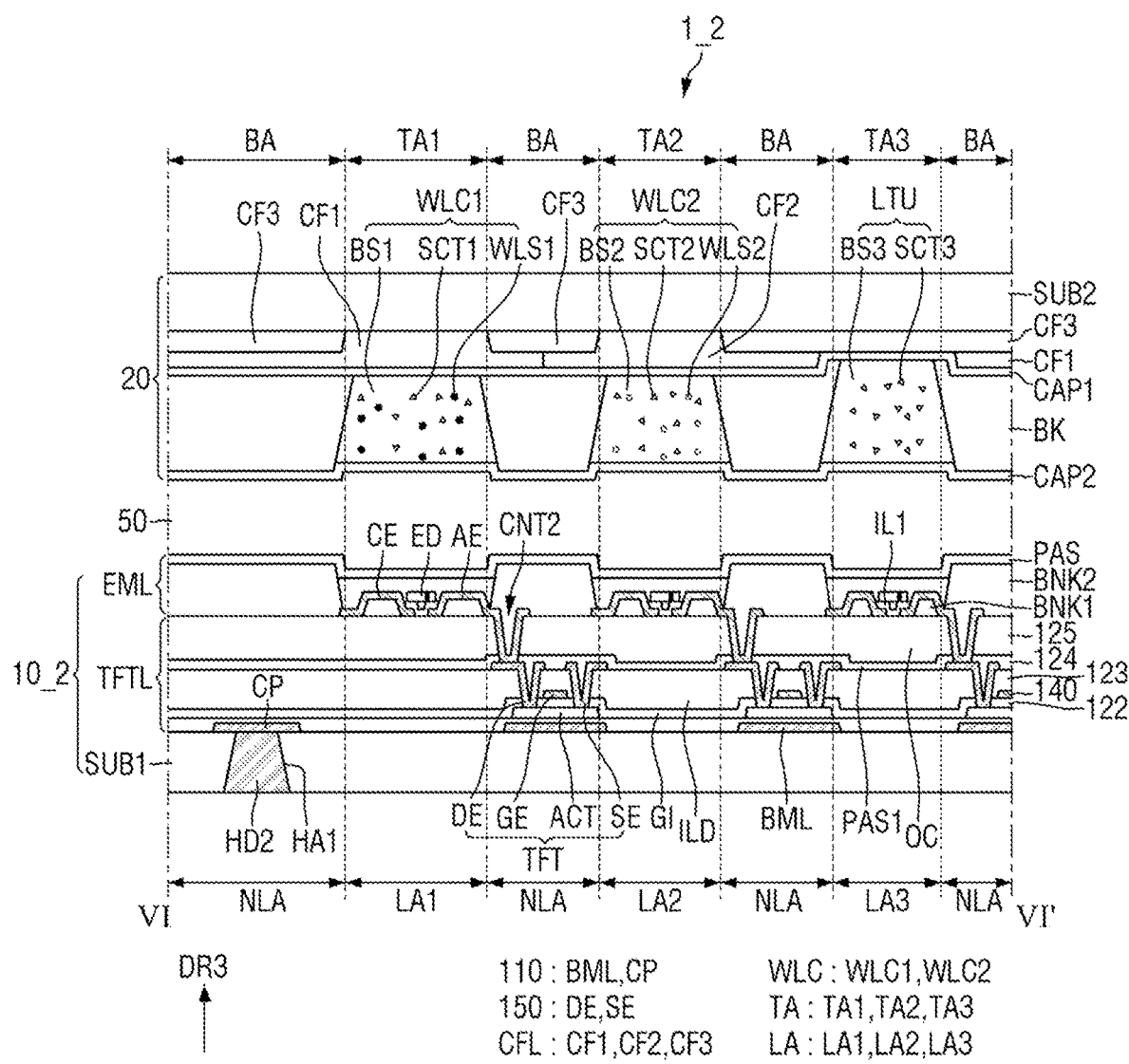
FIG. 16 is a schematic cross-sectional view of a display device according to an embodiment.

FIG. 16 is a cross-sectional view of a display device 1_2 according to an embodiment.

Referring to FIG. 16, the display device 1_2 is different from the display device 1 of FIG. 6 in that it includes a display substrate 10_2 further including a first metal filling layer HD2 filling a space of a first hole HA1 formed in a first substrate SUB1.

A first metal filling layer HD2 may fill each of first holes HA1. The shape and/or size of a first metal filling layer HD2 may be substantially the same as the shape and/or size of the corresponding one of the first holes HA1. Therefore, when each of the first holes HA1 is shaped like a truncated cone whose upper surface has a smaller diameter than its lower surface, the first metal filling layer HD2 may have a truncated cone structure whose upper surface has a smaller diameter than its lower surface. A height/thickness of the first metal filling layer HD2 may be equal to a height/thickness of the first substrate SUB1. A height/thickness of the first metal filling layer HD2 may be smaller than a height/thickness of the first substrate SUB1. In this case, the first metal filling layer HD2 may fill only a part of the space of the first hole HA1.

The first metal filling layer HD2 may overlap a conductive pattern CP in the third direction DR3.

The first metal filling layer HD2 may include a metal material having high thermal conductivity. The first metal filling layer HD2 may include a seed layer for effective plating in an area corresponding to the first hole HA1. The first metal filling layer HD2 may be formed through a screen printing method or an inkjet printing process.

Heat generated from light emitting elements ED may have a heat dissipation path along which the heat is diffused from the light emitting elements ED to the conductive pattern CP and the first metal filling layer HD2 through a layer including a plurality of thermally conductive materials disposed between the first substrate SUB1 and the light emitting elements ED.

The second end of the light emitting elements ED and a second contact electrode CTE2 may physically contact each other, the second contact electrode CTE2 and a second electrode CE may physically contact each other, the second electrode CE and the conductive pattern CP may physically contact each other through a third contact hole CNT3 (see FIG. 7), and the conductive pattern CP and the first metal filling layer HD2 may physically contact each other. Therefore, heat generated from the light emitting elements ED may be transferred from the light emitting elements ED to the conductive pattern CP and the first metal filling layer HD2 by heat conduction due to physical contact between the above layers. The heat transferred to the conductive pattern CP may be transferred to the first metal filling layer HD2 by heat conduction in an area in which the conductive pattern CP and the first metal filling layer HD2 are in contact with each other. Since the heat generated from the light emitting elements ED is diffused to the first metal filling layer HD2 disposed in the first hole HA1, an additional heat dissipation path may be generated. Accordingly, the heat dissipation area and/or volume may increase, thereby increasing the heat dissipation efficiency of the display substrate 10_2. Although a heat dissipation path for dissipating heat to the outside through the first hole HA1 by convection is removed because the first metal filling layer HD2 fills the first hole HA1, the heat dissipation efficiency may be increased by the increased heat dissipation area and/or volume. Therefore, heat generation inside the display device 1_2 can be reduced.

Figure 17:
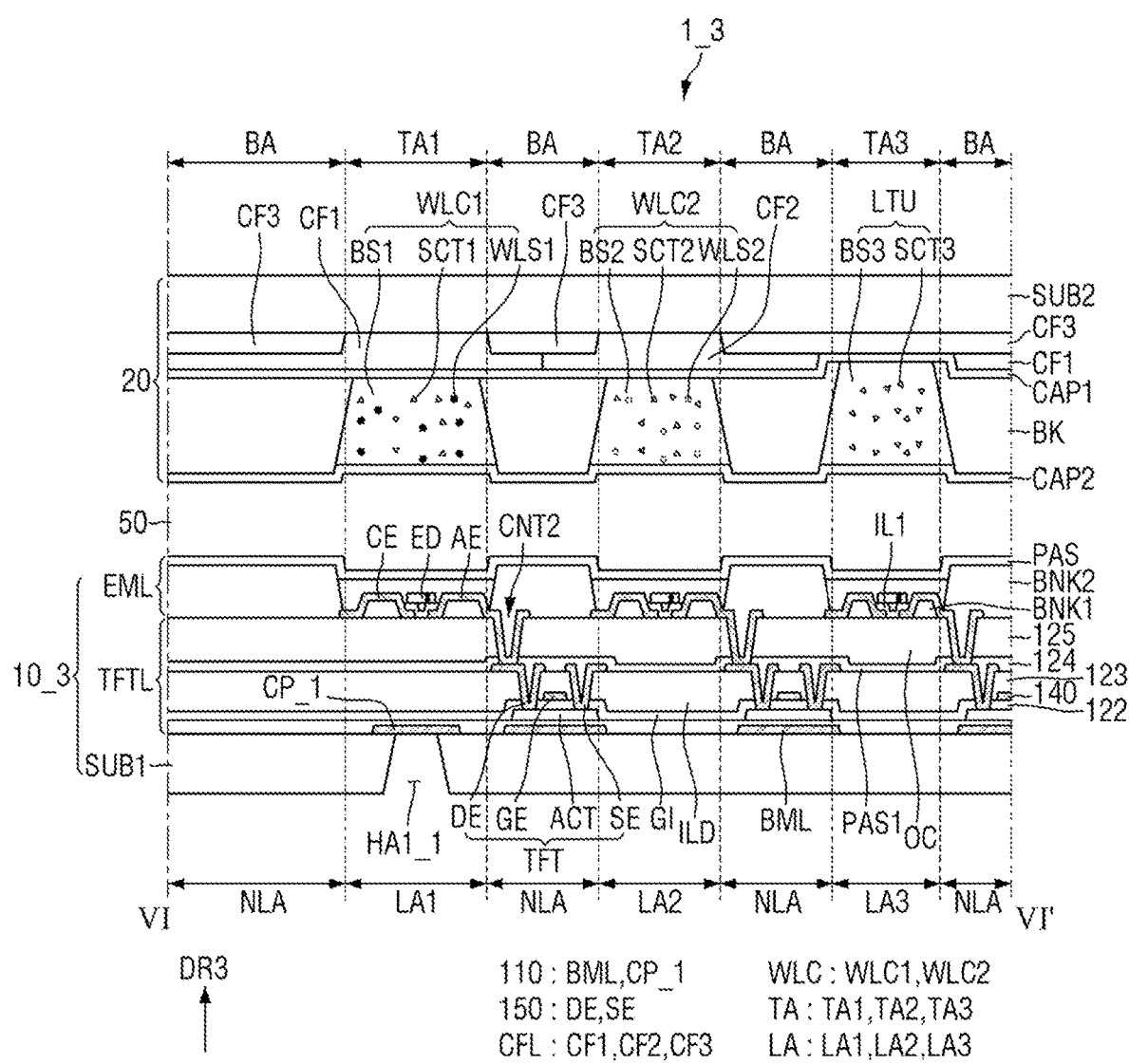
FIG. 17 is a schematic cross-sectional view of a display device according to an embodiment.

FIG. 17 is a cross-sectional view of a display device 1_3 according to an embodiment.

Referring to FIG. 17, the display device 1_3 is different from the display device 1 of FIG. 6 in that a first hole HA1_1 and a conductive pattern CP_1 formed in a first substrate SUB1 are disposed in a light emitting area LA.

The first hole HA1_1 may be disposed in a light emitting area LA of a display substrate 10_3. The first hole HA1_1 may be formed in an area of the first substrate SUB1 which overlaps a first light emitting area LA1. The first hole HA1_1 may overlap a second light emitting area LA2 or a third light emitting area LA3. Alternatively, the first hole HA1_1 may be formed in areas of the first substrate SUB1 which overlap all of the first through third light emitting areas LA1 through LA3.

The conductive pattern CP_1 may be disposed in a light emitting area LA of the display substrate 10_3. The conductive pattern CP_1 may be formed on a surface of the first substrate SUB1 which overlaps the first light emitting area LA1. The conductive pattern CP_1 may be disposed on the surface of the first substrate SUB1 to overlap the first hole HA1_1 in the third direction DR3.

Since the first hole HA1_1 is disposed in the first light emitting area LA1, it may be formed close to a plurality of light emitting elements ED disposed in a first light exiting area TA1 overlapping the first light emitting area LA1. Therefore, a path through which heat generated from the light emitting elements ED is diffused to the first hole HA1_1 may be shortened, thus enabling the heat generated from the light emitting elements ED to be released or dissipated to the outside of the display device 1_3 with improved efficiency. Although the first hole HA1_1 overlaps the first light emitting area LA1 of the display substrate 10_3 or the first light exiting area TA1 of the color conversion substrate 20, since the conductive pattern CP_1 covering the first hole HA1_1 in the third direction DR3 includes a light blocking material, light transmitted by the first hole HA1_1 may be blocked and may not be seen by a user. In addition, the exemplary embodiment is not limited thereto, and in an embodiment, a plurality of first holes HA1 and HA1_1 may be formed in the first substrate SUB1. For example, the first hole HA1 may be formed in the non-light emitting area NLA of the first substrate SUB1 (see FIG. 6), and the first hole HA1_1 may be further formed in the first light emitting area LA1 of the first substrate SUB1.

Figure 18:
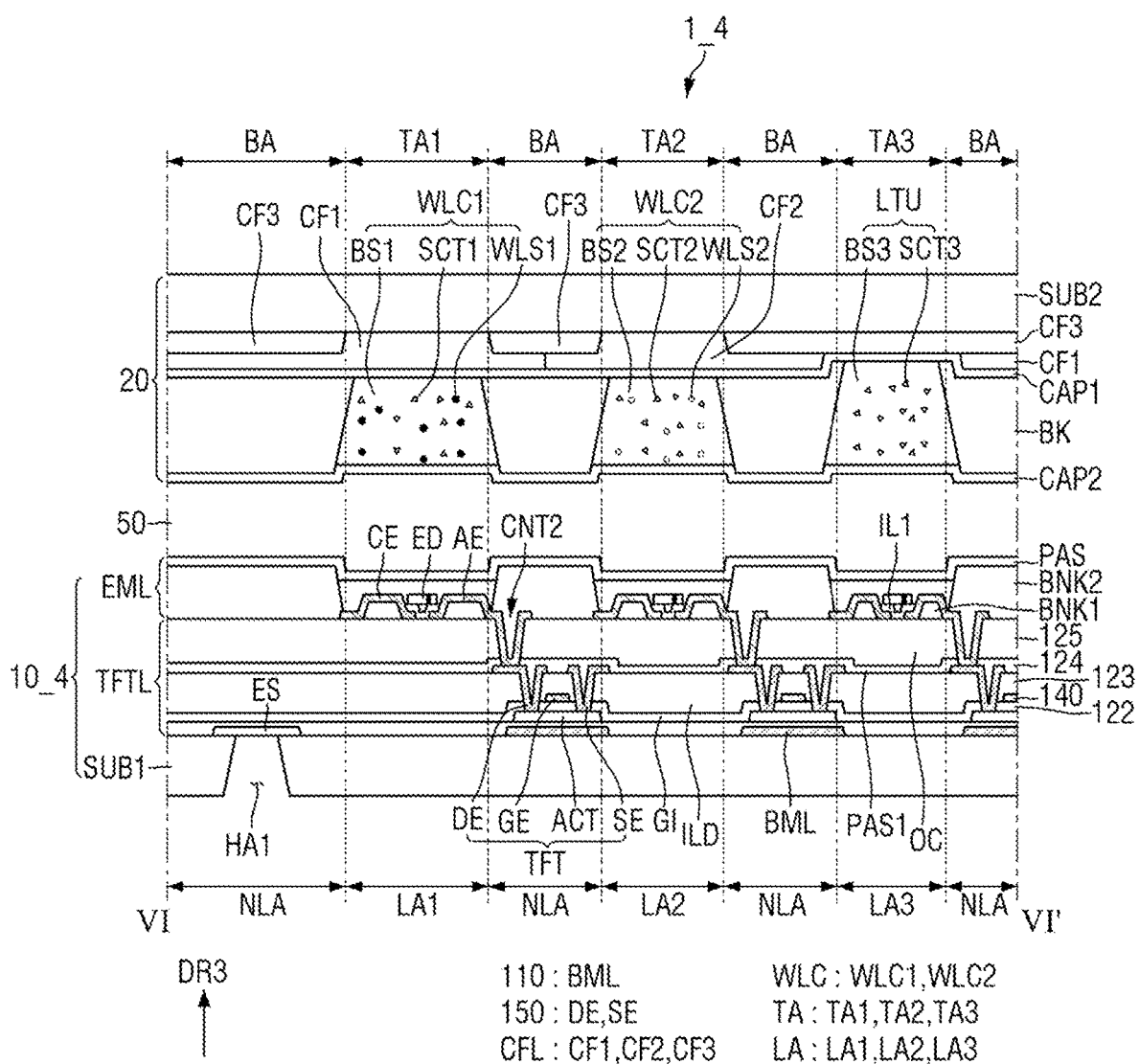
FIG. 18 is a schematic cross-sectional view of a display device according to an embodiment.

FIG. 18 is a cross-sectional view of a display device 1_4 according to an embodiment.

Referring to FIG. 18, the display device 1_4 is different from the display device 1 of FIG. 6 in that a protective pattern ES, not a conductive pattern, is disposed on a surface of a first substrate SUB1 to overlap a first hole HA1.

A display substrate 104 may further include the protective pattern ES. When a process of forming the first hole HA1 that penetrates the first substrate SUB1 is performed by a wet etching process with reference to FIG. 12A, the protective pattern ES may serve as an etching stopper for preventing a plurality of layers disposed on the surface of the first substrate SUB1 from being damaged by an etchant for etching the first substrate SUB1.

The protective pattern ES may include a material having a low etch selectivity with respect to the etchant for etching the first substrate SUB1. In an embodiment, when the first substrate SUB1 includes glass or quartz and an etchant including HF, NaOH or KOH is used to form the first hole HA1 in the first substrate SUB1, the protective pattern ES may include at least one of PI, Mo, Cu, Ti, and Cr.

The protective pattern ES may be patterned on the surface of the first substrate SUB1 to correspond to each of a plurality of first holes HA1. The area of the protective pattern ES may be greater than the area of at least an upper surface of a first hole HA1. The area of the protective pattern ES may be greater than the area of a lower surface of the first hole HA1. Therefore, the protective pattern ES may be disposed on the first hole HA1 to completely cover the first hole HA1. Since the protective pattern ES completely covers the first hole HA1, it is possible to prevent a plurality of layers of the display substrate 10_4 from being damaged by the above-described etchant.

When the first hole HA1 penetrating the first substrate SUB1 is formed by a laser drilling process with reference to FIG. 12B, the protective pattern ES may include a material that is strong enough not to be damaged by a laser drill.

Figure 19:
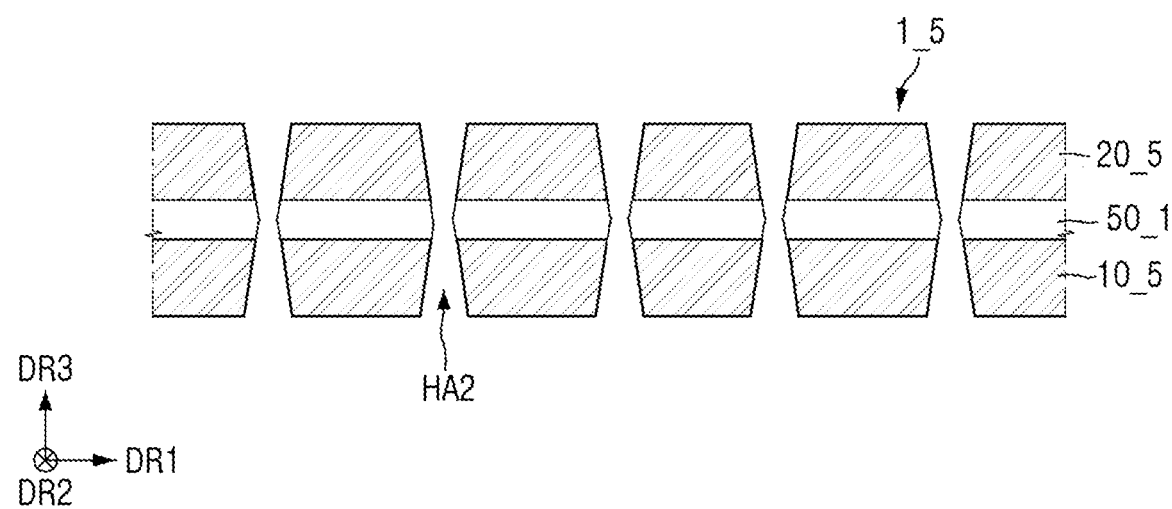
FIG. 19 is a schematic cross-sectional view of a display device according to an embodiment.
Figure 20:
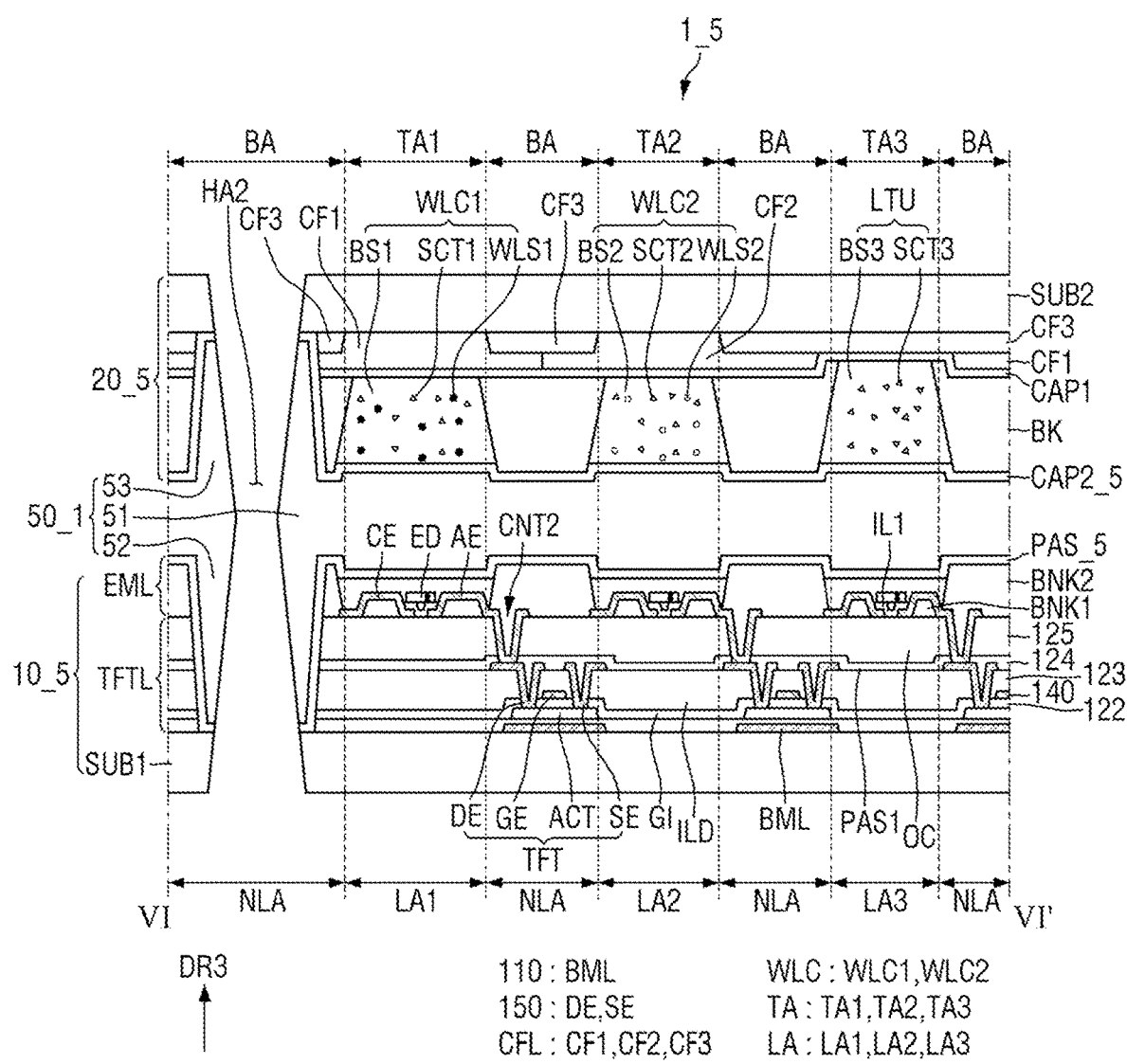
FIG. 20 is a schematic cross-sectional view of the display device of FIG. 19.

FIG. 19 is a schematic cross-sectional view of a display device 1_5 according to an embodiment. FIG. 20 is a cross-sectional view of the display device 1_5 of FIG. 19.

Referring to FIGS. 19 and 20, the display device 1_5 is different from the above-described embodiments in that it includes second holes HA2 penetrating a display substrate 10_5, a color conversion substrate 20_5, and a filling layer 50_1 interposed between the display substrate 10_5 and the color conversion substrate 20_5.

The display device 1_5 may include the second holes HA2 penetrating, in the third direction DR3, the display substrate 10_5, the color conversion substrate 20_5, and the filling layer 50_1 disposed between the display substrate 10_5 and the color conversion substrate 20_5. The second holes HA2 may be disposed in a light blocking area BA and a non-light emitting area NLA overlapping the light blocking area BA. The second holes HA2 may be passages through which heat generated inside the display device 1_5 can be released to the outside of the display device 1_5.

The planar arrangement of the second holes HA2 may be the same as the arrangement of the first holes HA1 in the display substrate 10 illustrated in FIG. 4. The planar shape of each of the second holes HA2 may be a circular shape. A height/length of each of the second holes HA2 in the third direction DR3 may be equal to a distance from a lower surface of a first substrate SUB1 to an upper surface of a second substrate SUB2.

The second holes HA2 may not overlap a plurality of layers of the display substrate 10_5 in the third direction DR3. The layers of the display substrate 10_5 may be disposed on a surface of the first substrate SUB1 and patterned not to overlap areas in which the second holes HA2 are disposed. That is, a thin-film transistor layer TFTL and a light emitting element layer EML of the display substrate 10_5 may not overlap the second holes HA2.

Likewise, the second holes HA2 may not overlap a plurality of layers of the color conversion substrate 20_5 in the third direction DR3. The layers of the color conversion substrate 20_5 may be disposed on a surface of the second substrate SUB2 and patterned not to overlap the areas in which the second holes HA2 are disposed. That is, a color filter layer CFL and a wavelength conversion layer WLC and a light transmission layer LTU of the color conversion substrate 20_5 may not overlap the second holes HA2.

The filling layer 50_1 may be disposed between the display substrate 10_5 and the color conversion substrate 20_5. The filling layer 50_1 may include a first area (or referred to as a first filling part) 51 disposed between the display substrate 10_5 and the color conversion substrate 20_5, a second area (or referred to as a second filling part) 52 surrounding the second holes HA2 in the display substrate 10_5, and a third area (or referred to as a third filling part) 53 surrounding the second holes HA2 in the color conversion substrate 20_5.

The first area 51 may be substantially the same as the filling layer 50 (see FIG. 6) described above with reference to FIG. 6. The first area 51 may be disposed between a second passivation layer PAS_5 of the display substrate 10_5 and a second capping layer CAP2_5 of the color conversion substrate 20_5 to bond the display substrate 10_5 and the color conversion substrate 20_5 together.

The second area 52 may be disposed in the non-light emitting area NLA of the display substrate 10_5 to surround the second holes HA2. The second area 52 may form part of sidewalls of each second hole HA2. The second area 52 may be disposed around the second holes HA2 to contact the second passivation layer PAS_5 covering the thin-film transistor layer TFTL and the light emitting element layer EML patterned on the first substrate SUB1.

The third area 53 may be disposed in the light blocking area BA of the color conversion substrate 20_5 to surround the second holes HA2. The third area 53 may form part of the sidewalls of each second hole HA2. The third area 53 may be disposed around the second holes HA2 to contact the second capping layer CAP2_5 covering a color control structure patterned on the second substrate SUB2.

The display device 1_5 may include the second holes HA2 penetrating the display substrate 10_5, the color conversion substrate 20_5, and the filling layer 50_1 disposed between the display substrate 10_5 and the color conversion substrate 20_5. The second holes HA2 penetrating the display device 1_5 in the third direction DR3 (or the thickness direction) may be passages through which heat generated from light emitting elements ED are released to the outside. Specifically, heat generated inside the display device 1_5 may be transferred from the inside of the display device 1_5 toward the outside by convection in spaces defined by the second holes HA2. Therefore, the heat generated inside the display device 1_5 may be released to the outside of the display device 1_5 through the second holes HA2. Accordingly, since the second holes HA2 are formed to completely penetrate the display device 1_5 in the third direction DR3, the heat generated inside the display device 1_5 may be released in both directions (that is, toward above and below the display device 1_5). This can improve the heat release and heat dissipation efficiency of the display device 1_5, thereby mitigating heat generation of the display device 1_5.

Referring to FIG. 20, a diameter of each second hole HA2 may increase from the center of the display device 1_5 in the thickness direction (the third direction DR3) toward the outside in the thickness direction (the third direction DR3). Since the diameter of each second hole HA2 increases from the inside of the display device 1_5 toward the outside, heat in the space defined by each second hole HA2 may easily move from the center of the display device 1_5 toward above and/or below the display device 1_5. Therefore, the heat dissipation efficiency of the display device 1_5 can be improved.

Figure 21:
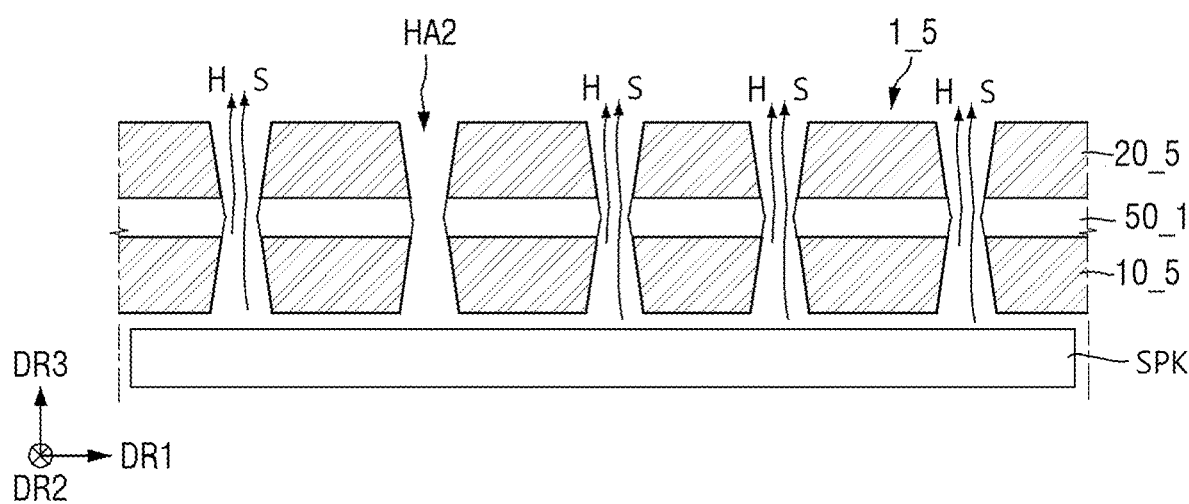
FIG. 21 is a schematic cross-sectional view of a display device according to an embodiment.

FIG. 21 is a schematic cross-sectional view of a display device 1_5 according to an embodiment.

Referring to FIG. 21, the display device 1_5 is different from the embodiment of FIG. 19 in that it further includes a sound generator SPK disposed under a display substrate 10_5.

The sound generator SPK may be disposed under the display substrate 10_5 and spaced apart from the display substrate 10_5. Although not illustrated in the drawing, the display device 1_5 may further include a housing, and the sound generator SPK may be disposed in the housing. The sound generator SPK may output a sound signal to the outside of the display device 1_5. The sound generator SPK may include a speaker.

Second holes HA2 penetrating the display substrate 10_5, a color conversion substrate 20_5, and a filling layer 50_1 may be sound transmitting holes that transmit sound S output from the sound generator SPK. The second holes HA2 may be not only heat dissipation passages through which heat H generated inside the display device 1_5 is released to the outside of the display device 1_5 but also sound transmitting holes through which the sound S generated from the sound generator SPK disposed under the display substrate 10_5 is output to the outside of the display device 1_5. Since a plurality of second holes HA2 penetrating the display substrate 10_5, the color conversion substrate 20_5 and the filling layer 50_1 are formed, the heat release and heat dissipation efficiency of the display device 1_5 can be improved while the sound S generated from the sound generator SPK can be effectively output.

FIGS. 22 through 26 are cross-sectional views illustrating processes of a method of manufacturing the display device 1_5 of FIG. 20. In FIGS. 22 through 26, only a first light exiting area TA1 and a first light emitting area LA1 and the light blocking area BA and the non-light emitting area NLA respectively surrounding the first light existing area TA1 and the first light emitting area LA1 are illustrated for ease of description.

Figure 22:
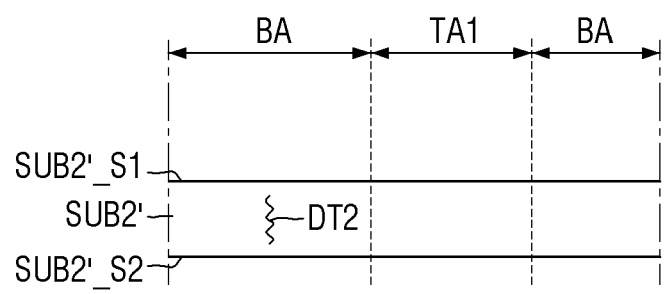
FIG. 22, FIG. 23, FIG. 24, FIG. 25, and FIG. 26 are schematic cross-sectional views illustrating processes in a method of manufacturing a display device and structures related to the processes according to one or more embodiments.
Figure 22:
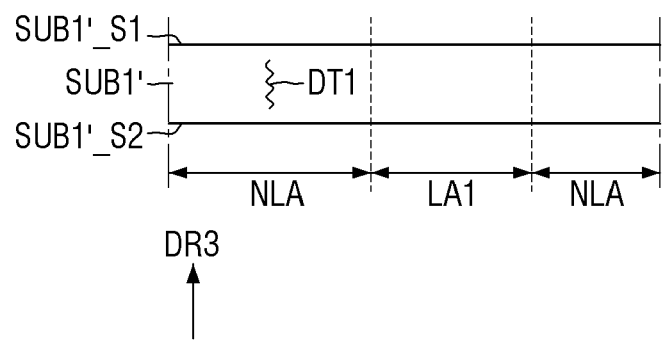

First, referring to FIG. 22, a first laser-damaged area DT1 may be formed inside a first base substrate SUB1' by irradiating a laser beam to the first base substrate SUB1'. The first base substrate SUB1' may be a member corresponding to the first substrate SUB1 of the display substrate 10_5 of FIG. 20 described above. The first base substrate SUB1' may include glass or quartz. The focus of the laser beam may be located inside the first base substrate SUB1'. The first laser-damaged area DT1 formed inside the first base substrate SUB1' by irradiating the laser beam may be located in an area corresponding to the second hole HA2 of FIG. 20 which is formed in the non-light emitting area NLA.

Likewise, a second laser-damaged area DT2 may be formed inside a second base substrate SUB2' by irradiating a laser beam to the second base substrate SUB2'. The second base substrate SUB2' may be a member corresponding to the second substrate SUB2 of the color conversion substrate 20_5 of FIG. 20 described above. The second base substrate SUB2' may include glass or quartz. The focus of the laser beam may be located inside the second base substrate SUB2'. The second laser-damaged area DT2 formed inside the second base substrate SUB2' by irradiating the laser beam may be located in an area corresponding to the second hole HA2 of FIG. 20 which is formed in the light blocking area BA.

The laser beam may be the same as the first laser beam L1 described above with reference to FIG. 10. A detailed description of the laser beam will be replaced with the description of FIG. 10.

Figure 23:
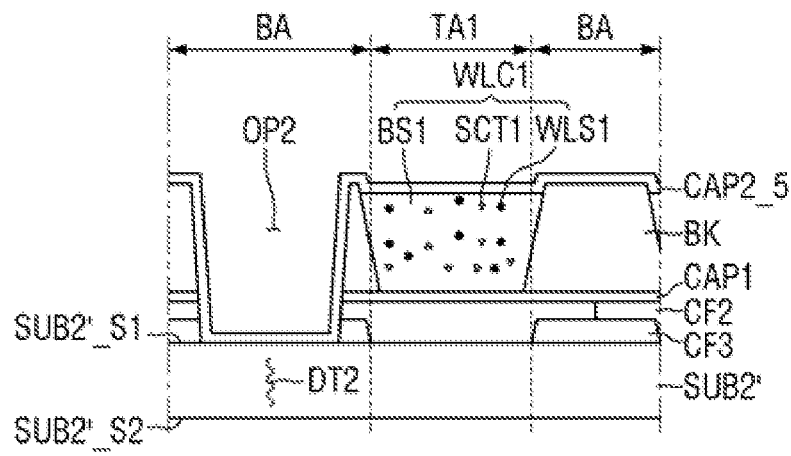
Figure 23:
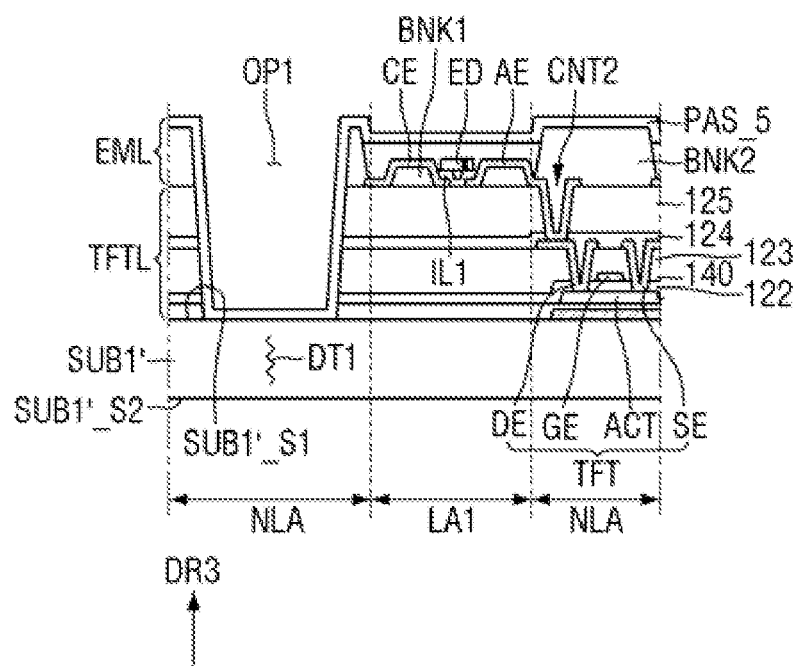

Next, referring to FIG. 23, the thin-film transistor layer TFTL and the light emitting element layer EML may be formed on a surface of the first base substrate SUB1' including the first laser-damaged area DT1.

The first base substrate SUB1' may include a first surface SUB1'_S1 and a second surface SUB1'_S2. The first surface SUB1'_S1 of the first base substrate SUB1' may be a surface disposed on a side of the third direction DR3, that is, an upper surface in FIG. 23, and the second surface SUB1'_S2 of the first base substrate SUB1' may be the other surface opposite the first surface SUB1'_S1, that is, a lower surface in FIG. 23.

The thin-film transistor layer TFTL and the light emitting element layer EML may be patterned on the first surface SUB1'_S1 of the first base substrate SUB1' to include a first opening OP1. The thin-film transistor layer TFTL and the light emitting element layer EML may be disposed to expose at least a part of the first surface SUB1'_S1 of the first base substrate SUB1' of the non-light emitting area NLA in which a second hole HA2 is formed.

The second passivation layer PAS_5 may be disposed on the entire surface of the first base substrate SUB1' to cover the patterned thin-film transistor layer TFTL and light emitting element layer EML and the first surface SUB1'_S1 of the first base substrate SUB1' exposed by the thin-film transistor layer TFTL and the light emitting element layer EML. Therefore, the second passivation layer PAS_5 may contact side surfaces of a plurality of layers of the thin-film transistor layer TFTL and the light emitting element layer EML which form sidewalls of the first opening OP1, second banks BNK2, and a part of the first surface SUB1'_S1 of the first base substrate SUB1'.

Likewise, a color control structure and light blocking members BK may be formed on a surface of the second base substrate SUB2' including the second laser-damaged area DT2.

The second base substrate SUB2' may include a first surface SUB2'_S1 and a second surface SUB2'_S2. The first surface SUB2'_S1 of the second base substrate SUB2' may be a surface disposed on a side of the third direction DR3, that is, an upper surface in FIG. 23, and the second surface SUB2'_S2 of the second base substrate SUB2' may be the other surface opposite the first surface SUB2'_S1, that is, a lower surface in FIG. 23.

The color control structure WLC, LTU and CFL and the light blocking members BK may be patterned on the first surface SUB2'_S1 of the second base substrate SUB2' to include a second opening OP2. The color control structure WLC, LTU and CFL and the light blocking members BK may be disposed to expose at least a part of the first surface SUB2'_S1 of the second base substrate SUB2' of the light blocking area BA in which a second hole HA2 is formed.

The second capping layer CAP2_5 may be disposed on the entire surface of the second base substrate SUB2' to cover the patterned color control structure WLC, LTU and CFL and light blocking members BK and the first surface SUB2'_S1 of the second base substrate SUB2' exposed by the color control structure WLC, LTU and CFL and the light blocking members BK. Therefore, the second capping layer CAP2_5 may contact side surfaces of the light blocking members BK and the color filter layer CFL which form sidewalls of the second opening OP2, the wavelength conversion layer WLC, the light transmission layer LTU, and a part of the first surface SUB2'_S1 of the second base substrate SUB2'.

Figure 24:
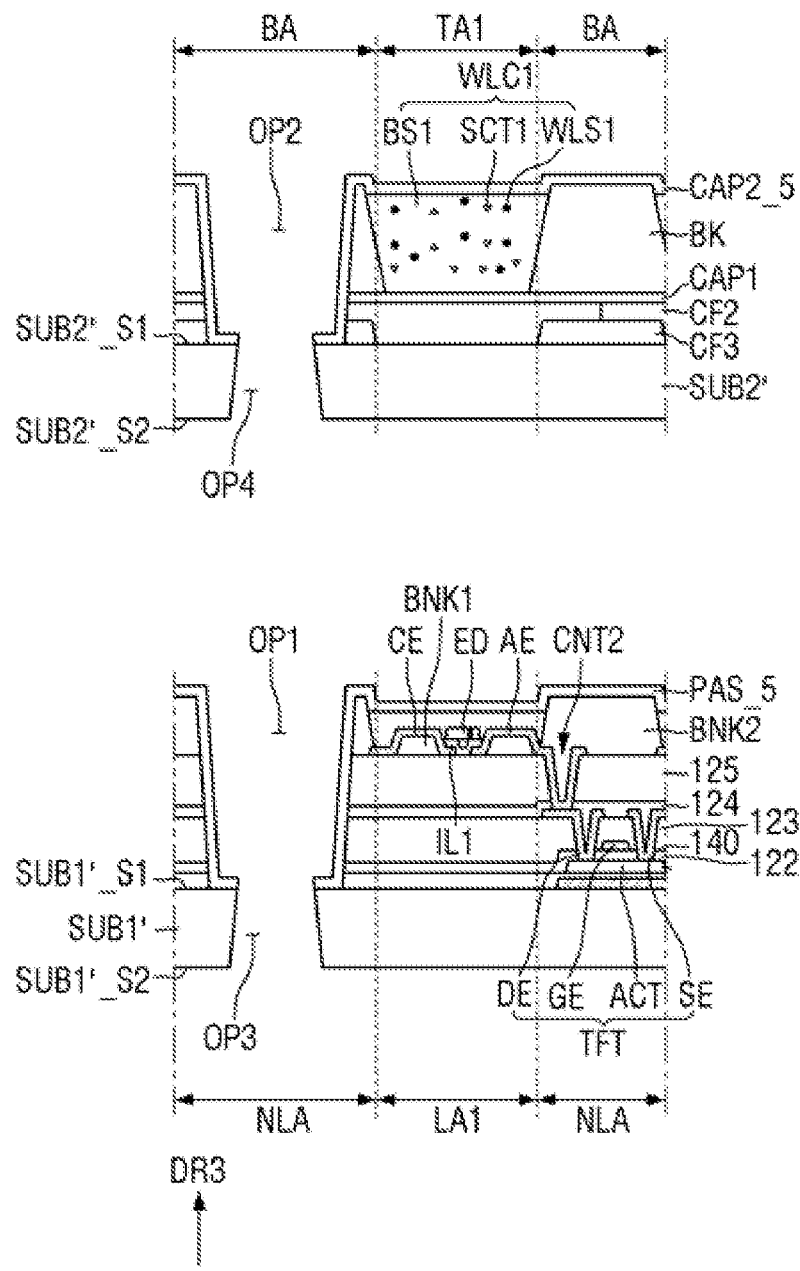

Next, referring to FIG. 24, a third opening OP3 penetrating the first base substrate SUB1' is formed in an area corresponding to the first laser-damaged area DT1 formed in the first base substrate SUB1'.

Likewise, a fourth opening OP4 penetrating the second base substrate SUB2' is formed in an area corresponding to the second laser-damaged area DT2 formed in the second base substrate SUB2'.

The third and fourth openings OP3 and OP4 may be formed by a laser drilling process, a mask process, or the like. The third opening OP3 and the fourth opening OP4 may be formed in the first base substrate SUB1' and the second base substrate SUB2' by wet etching. With reference to FIGS. 11, 12A and 12B, when the entire surfaces of the first base substrate SUB1' and the second base substrate SUB2' are exposed to an etchant, areas corresponding to the first and second laser-damaged areas DT1 and DT2 have a high etch rate due to a difference between the etch selectivity of the areas corresponding to the first and second laser-damaged areas DT1 and DT2 of the first base substrate SUB1' and the second base substrate SUB2' and the etch selectivity of other areas excluding the first and second laser-damaged areas DT1 and DT2 of the first base substrate SUB1' and the second base substrate SUB2' with respect to the etchant. As a result, the third and fourth openings OP3 and OP4 penetrating the first base substrate SUB1' and the second base substrate SUB2', respectively, may be formed. In the process of forming the third and fourth openings OP3 and OP4, the second passivation layer PAS_5 and the second capping layer CAP2_5 disposed in areas overlapping the third and fourth openings OP3 and OP4 in the third direction DR3 may be removed.

The third opening OP3 may overlap the first opening OP1 in the third direction DR3, and the fourth opening OP4 may overlap the second opening OP2 in the third direction DR3.

Figure 25:
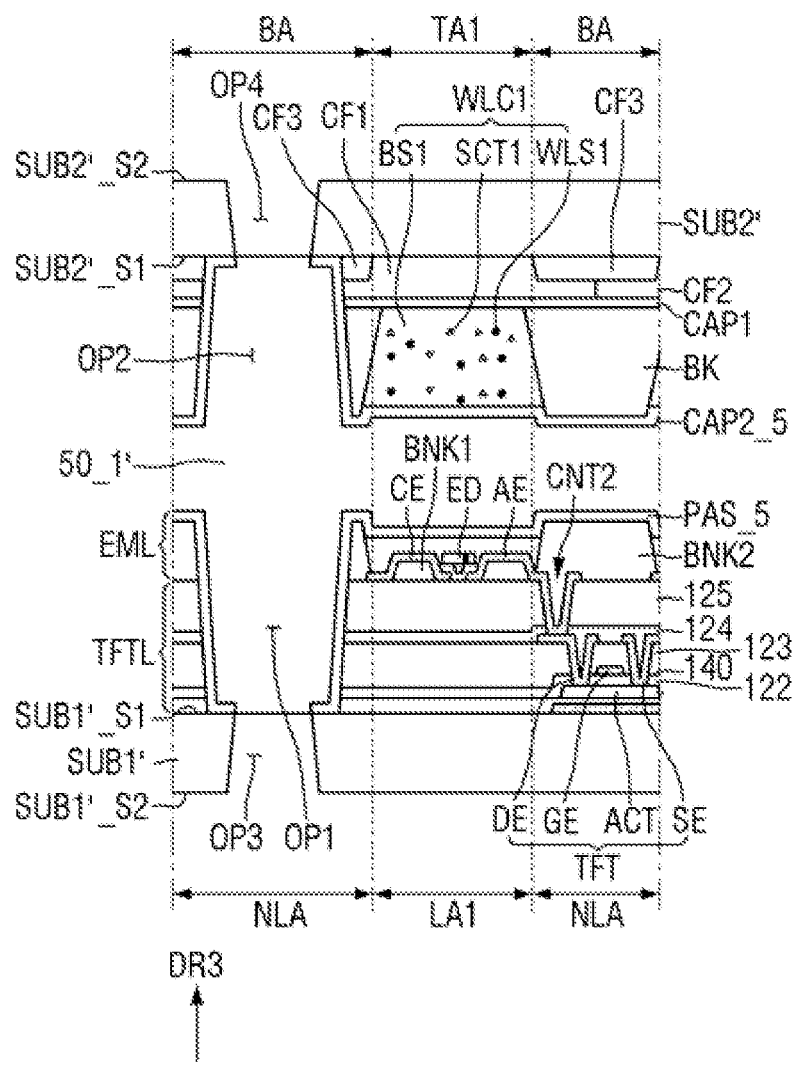

Next, referring to FIG. 25, the first base substrate SUB1' and the second base substrate SUB2' are bonded to each other by forming a filling material layer 50_1' in a space between the thin-film transistor layer TFTL and the light emitting element layer EML formed on the first surface SUB1'_S1 of the first base substrate SUB1' and the first surface SUB2'_S1 of the second base substrate SUB2' so that the first surface SUB1'_S1 of the first base substrate SUB1' and the first surface SUB2'_S1 of the second base substrate SUB2' face each other.

The filling material layer 50_1' may be disposed between the second passivation layer PAS_5 formed on the first base substrate SUB1' and the second capping layer CAP2_5 formed on the second base substrate SUB2'. The filling material layer 50_1' may fill the first opening OP1 and the second opening OP2.

Figure 26:
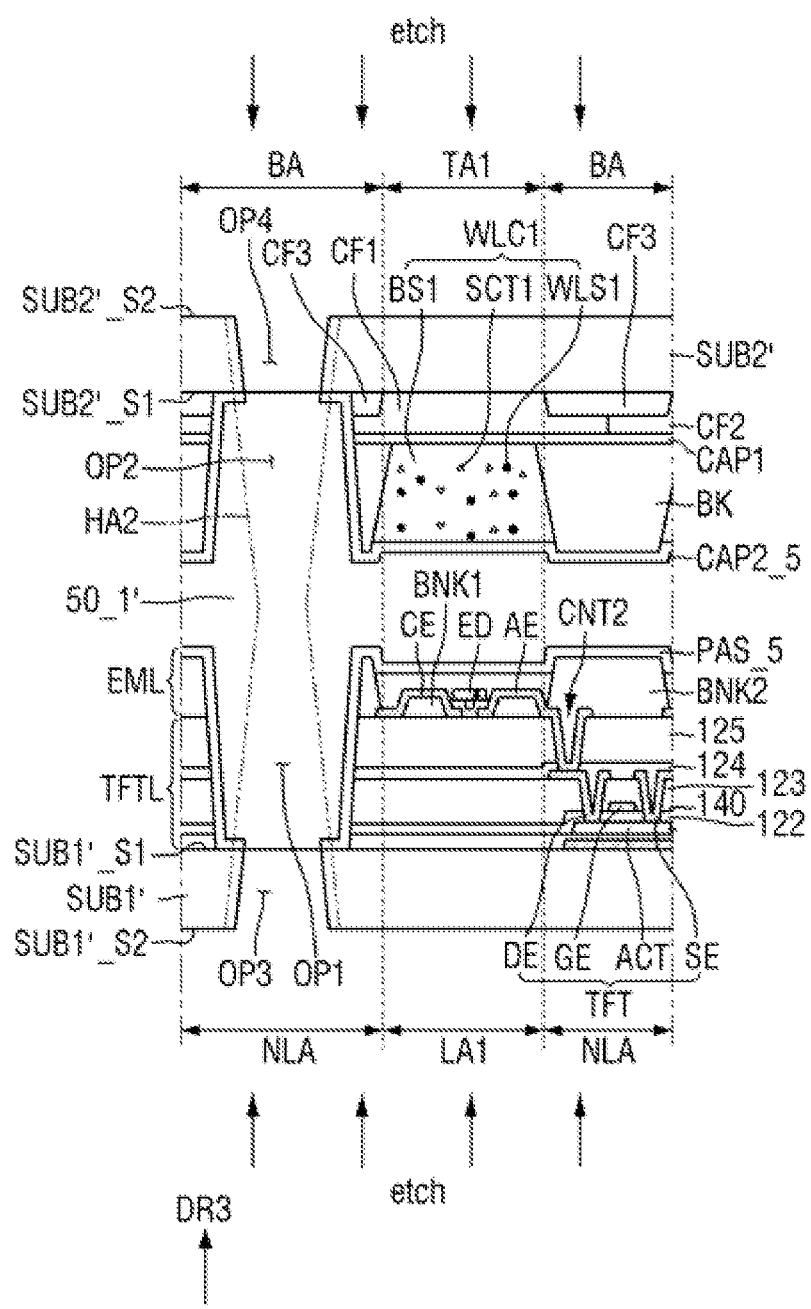

Next, referring to FIG. 26, a second hole HA2 is formed to penetrate the display substrate 10_5, the color conversion substrate 20_5, and the filling material layer 50_1'. The second hole HA2 may be formed by performing an etching process on the second surface SUB1'_S2 of the first base substrate SUB1' and the second surface SUB2'_S2 of the second base substrate SUB2'.

The second hole HA2 may be formed by forming a photoresist pattern on the second surface SUB1'_S2 of the first base substrate SUB1' and the second surface SUB2'_S2 of the second base substrate SUB2' and etching the filling material layer 50_1' using the photoresist pattern as an etching mask. The second hole HA2 may be formed by wet etching or dry etching.

The second hole HA2 may be formed by a laser drilling process, not by forming a photoresist pattern on the second surface SUB1'_S2 of the first base substrate SUB1' and the second surface SUB2'_S2 of the second base substrate SUB2'. A plurality of second holes HA2 penetrating the display device 1_5 as illustrated in FIG. 20 may be formed by irradiating a laser beam toward the first base substrate SUB1' and the second base substrate SUB2' from above the second surface SUB1'_S2 of the first base substrate SUB1' and the second surface SUB2'_S2 of the second base substrate SUB2'.

Figure 27:
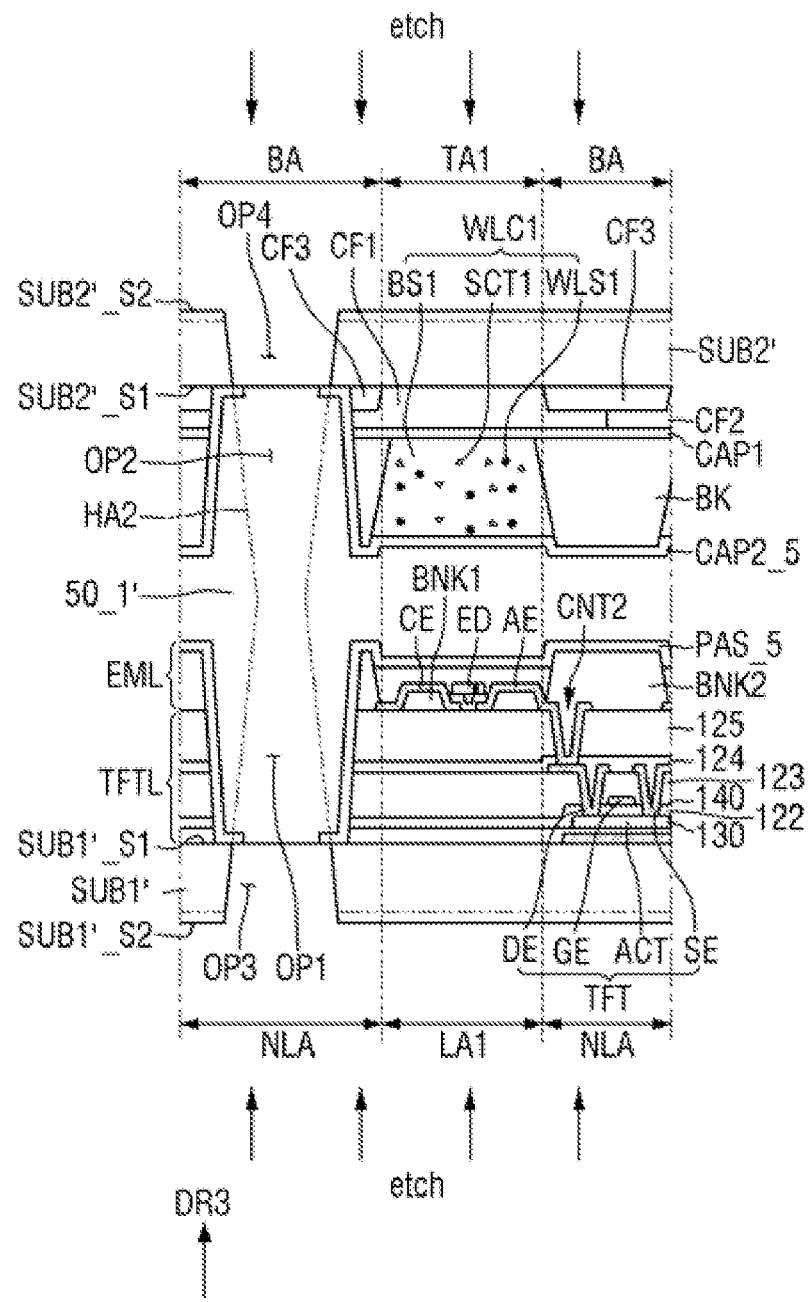
FIG. 27 is a cross-sectional view illustrating a process in a method of manufacturing a display device according to an embodiment.

FIG. 27 is a cross-sectional view illustrating an example of the process of FIG. 26.

FIG. 27 is an example of forming the second hole HA2 by etching the filling material layer 50_1' that fills the first opening OP1 and the second opening OP2 by using the first base substrate SUB1' and the second base substrate SUB2' themselves as an etching mask instead of forming a separate etching mask on the second surface SUB1'_S2 of the first base substrate SUB1' and the second surface SUB2'_S2 of the second base substrate SUB2'.

The second hole HA2 may be formed by etching the filling material layer 50_1' exposed by the third opening OP3 and the fourth opening OP4 using the first base substrate SUB1' in which the third opening OP3 is formed and the second base substrate SUB2' in which the fourth opening OP4 is formed as an etching mask. The process of forming the second hole HA2 may be performed by wet etching. Since the process is performed by wet etching without forming a separate etching mask on the second surface SUB1'_S2 of the first base substrate SUB1' and the second surface SUB2'_S2 of the second base substrate SUB2', the second surface SUB1'_S2 of the first base substrate SUB1' and the second surface SUB2'_S2 of the second base substrate SUB2' may also be partially etched by an etchant. Therefore, a thickness of the first substrate SUB1 of the display device 1_5 may be smaller than a thickness of the first base substrate SUB1', and a thickness of the second substrate SUB2 may also be smaller than a thickness of the second base substrate SUB2'.

In the method of manufacturing the display device 15, the first base substrate SUB1' and the second base substrate SUB2' themselves may be used as an etching mask in an etching process for forming the second hole HA2 without an additional process of forming a separate etching mask. The second hole HA2 may be formed when the filling material layer 50_1' exposed by the respective third opening OP3 and fourth opening OP4 of the first base substrate SUB1' and the second base substrate SUB2' corresponding to the position of the second hole HA2 is exposed to an etchant. Since the first substrate SUB1 and the second substrate SUB2 can be formed by reducing the thicknesses of the first base substrate SUB1' and the second base substrate SUB2' through the process of forming the second hole HA2 without an additional process, a thin display device 1_5 can be manufactured.

Figure 28:
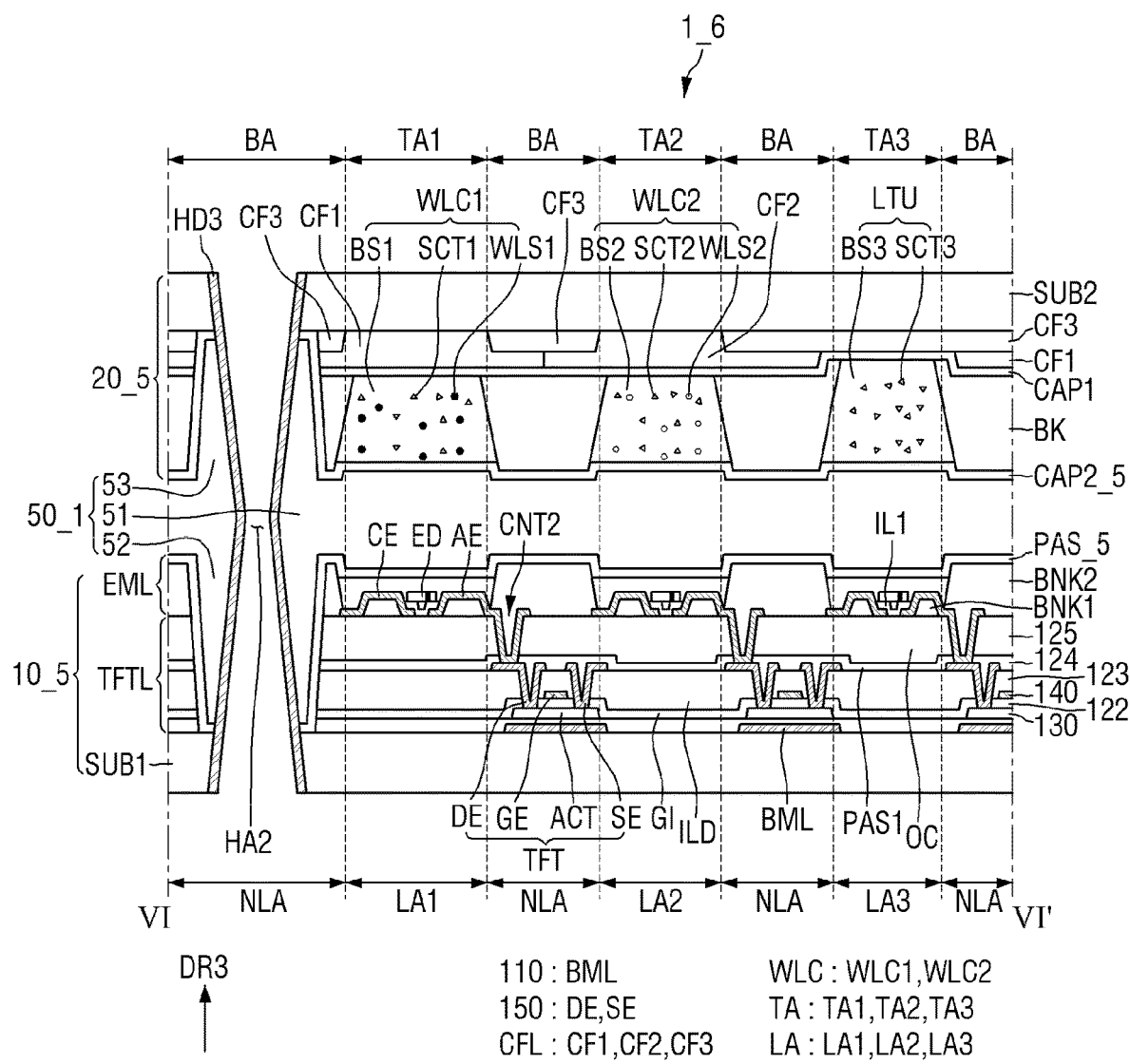
FIG. 28 is a schematic cross-sectional view of a display device according to an embodiment.

FIG. 28 is a cross-sectional view of a display device 1_6 according to an embodiment.

Referring to FIG. 28, the display device 1_6 is different from the embodiment of FIG. 20 in that it further includes a second metal coating layer HD3 disposed on sidewalls of a second hole HA2 penetrating a display substrate 10_5, a color conversion substrate 205, and a filling layer 50_1.

The second metal coating layer HD3 may be further disposed in an area corresponding to the second hole HA2. The second metal coating layer HD3 may be disposed on the sidewalls of the second hole HA2.

The second metal coating layer HD3 may include a metal material having high thermal conductivity. The second metal coating layer HD3 may include silver (Ag), copper (Cu), aluminum (Al), molybdenum (Mo), indium tin oxide (ITO), or an alloy of some of the metal materials. The second metal coating layer HD3 may be directly deposited or coated on the sidewalls of the second hole HA2. The deposition or coating method may be plating, sputtering, or the like.

Heat generated from light emitting elements ED may be released to above and below the display device 1_6 through the second hole HA2. The heat generated from the light emitting elements ED may be diffused to the second metal coating layer HD3 disposed on the sidewalls of the second hole HA2. Therefore, a heat dissipation area may be increased by the area of the second metal coating layer HD3 disposed on the sidewalls of the second hole HA2. Accordingly, since heat generated inside the display device 1_6 is released to the outside of the display device 1_6 through the second hole HA2, and the contact area of the display device 1_6 with the outside and the heat dissipation area of the display device 1_6 are increased by the second metal coating layer HD3, the heat may be released from the inside of the display device 1_6 to the outside by heat conduction and convection, thereby improving the heat dissipation efficiency.

Figure 29:
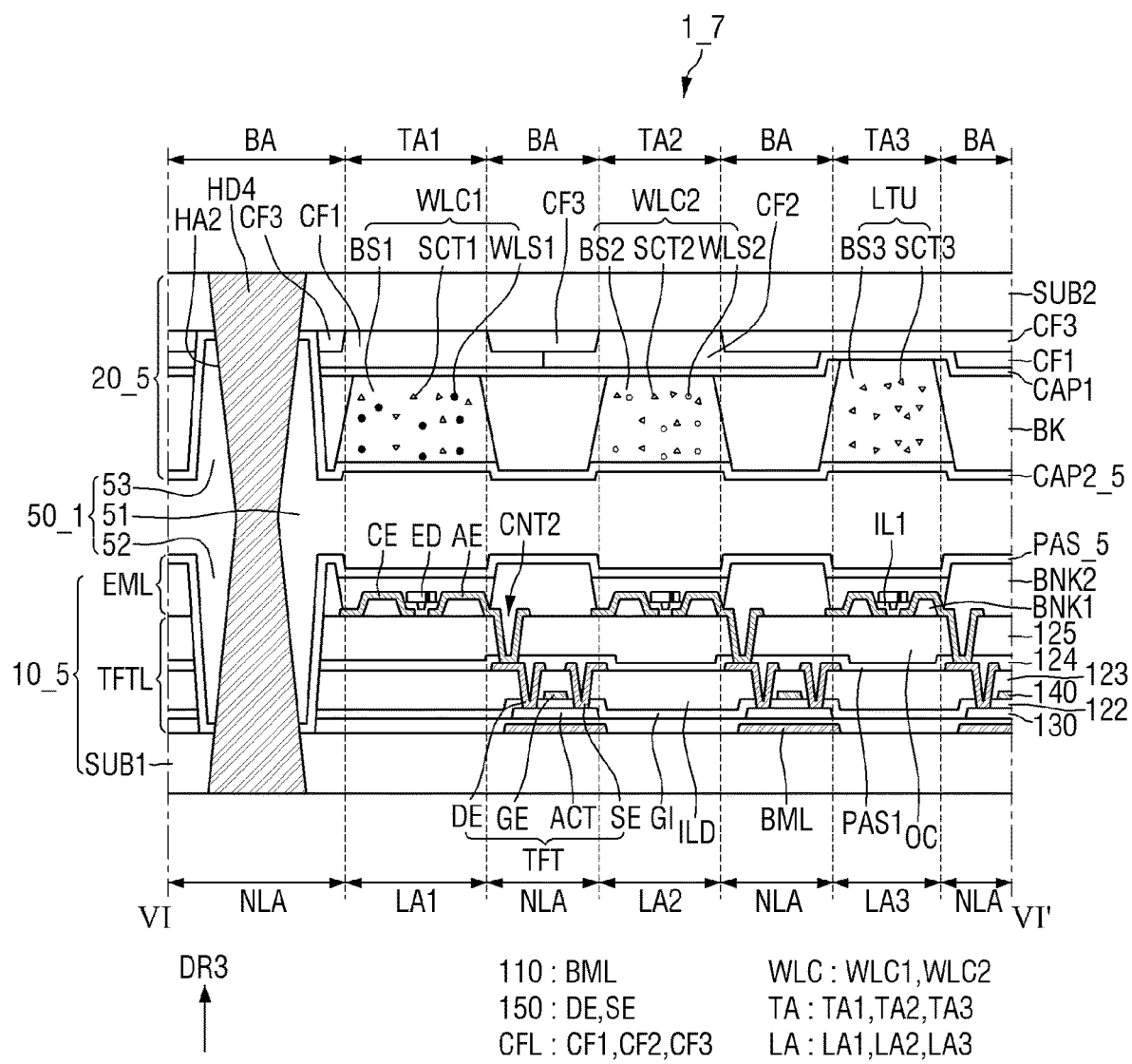
FIG. 29 is a schematic cross-sectional view of a display device according to an embodiment.

FIG. 29 is a cross-sectional view of a display device 1_7 according to an embodiment.

Referring to FIG. 29, the display device 1_7 is different from the embodiment of FIG. 20 in that it further includes a second metal filling layer HD4 filling a second hole HA2 that penetrates a display substrate 10_5, a color conversion substrate 20_5, and a filling layer 50_1.

The second metal filling layer HD4 may fill a plurality of second holes HA2. The shape and/or size of the second metal filling layer HD4 may be the same as the shape and/or size of each of the second holes HA2. A height/thickness of the second metal filling layer HD4 may be equal to a distance from a lower surface of a first substrate SUB1 to an upper surface of a second substrate SUB2. A height/thickness of the second metal filling layer HD4 may be smaller than a distance from the lower surface of the first substrate SUB1 to the upper surface of the second substrate SUB2.

The second metal filling layer HD4 may include a metal material having high thermal conductivity. The second metal filling layer HD4 may include a seed layer for effective plating in an area corresponding to the second hole HA2. The second metal filling layer HD4 may be formed through a screen printing method or an inkjet printing process.

Heat generated from light emitting elements ED may be diffused to the second metal filling layer HD4. The heat diffused to the second metal filling layer HD4 may be dissipated by the second metal filling layer HD4. Accordingly, the heat dissipation area and/or volume may increase, thereby increasing the heat dissipation efficiency of the display substrate 10_5. Although a heat dissipation path for dissipating heat through the second hole HA2 by convection is removed because the second metal filling layer HD4 fills the second hole HA2, the heat dissipation efficiency may be increased by the increased heat dissipation area and/or volume. Therefore, heat generation inside the display device 1_7 can be reduced.

Figure 30:
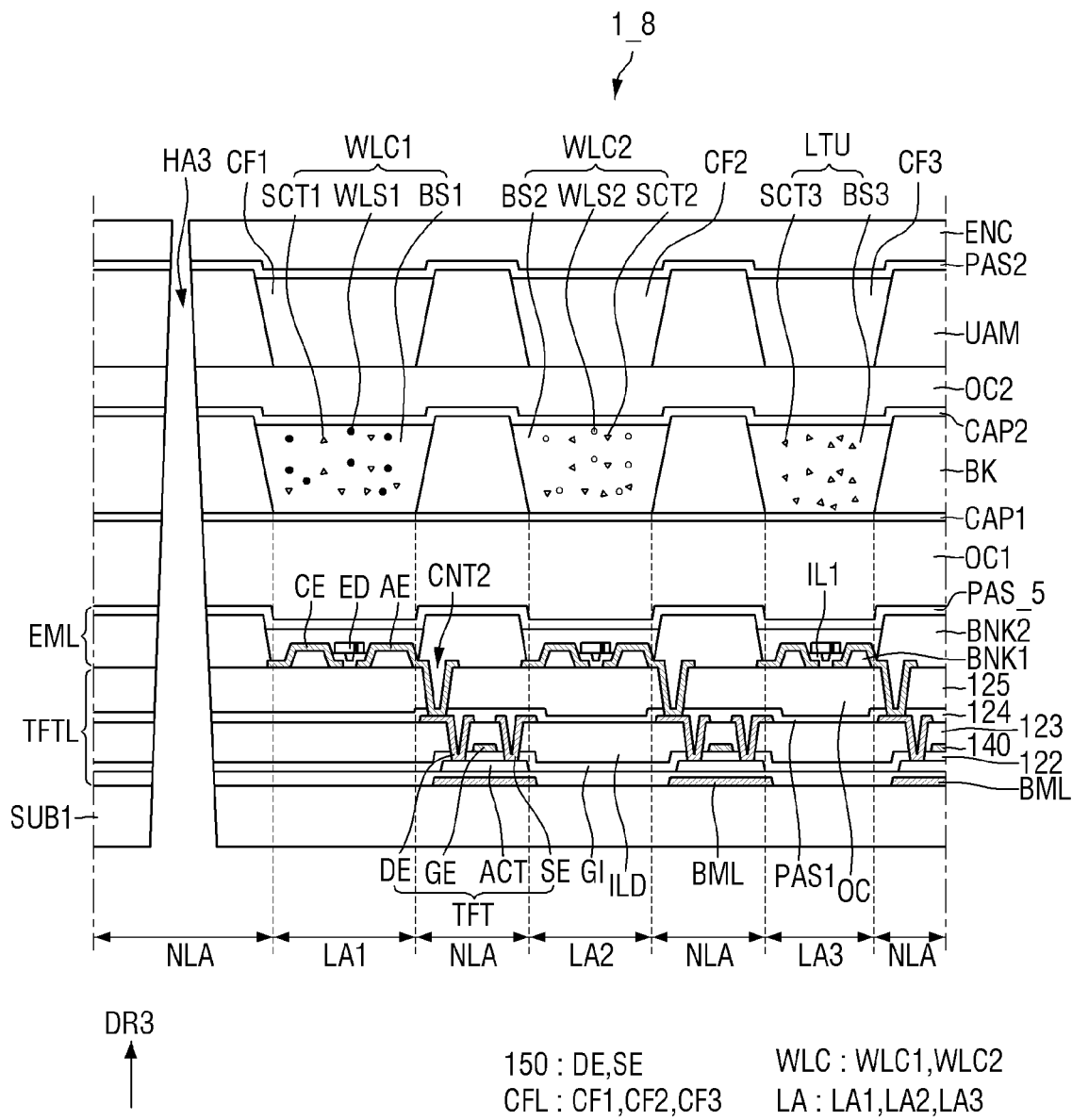
FIG. 30 is a schematic cross-sectional view of a display device according to an embodiment.

FIG. 30 is a cross-sectional view of a display device 1_8 according to an embodiment.

Referring to FIG. 30, the display device 18 exemplifies that the above-described color control structure CFL, WLC and LTU and upper light-absorbing members UAM can be formed on a first substrate SUB1.

A first planarization layer OC1 may be disposed on a second passivation layer PAS_5. The first planarization layer OC1 may be disposed in an upper part of a light emitting element layer EML. The first planarization layer OC1 may planarize steps of the upper part of the light emitting element layer EML. The first planarization layer OC1 may include an organic material. The first planarization layer OC1 may include at least one of acrylic resin, epoxy resin, phenolic resin, polyamide resin, and polyimide resin.

A first capping layer CAP1 may be disposed on the first planarization layer OC1. Light blocking members BK, a wavelength conversion layer WLC, and a light transmission layer LTU may be disposed on the first capping layer CAP1. A second capping layer CAP2 may be disposed on the light blocking members BK, the wavelength conversion layer WLC, and the light transmission layer LTU to cover them. The second capping layer CAP2 may prevent damage to or contamination of a first wavelength conversion pattern WLC1, a second wavelength conversion pattern WLC2, and the light transmission layer LTU by sealing the first wavelength conversion pattern WLC1, the second wavelength conversion pattern WLC2 and the light transmission layer LTU and the light blocking members BK.

A second planarization layer OC2 may be disposed on the second capping layer CAP2 to planarize the tops of the first and second wavelength conversion patterns WLC1 and WLC2 and the light transmission layer LTU.

The upper light-absorbing members UAM may be disposed on the second planarization layer OC2. The upper light-absorbing members UAM may be disposed in a non-light emitting area NLA. The upper light-absorbing members UAM may not only block light emission but also suppress reflection of external light. A color filter layer CFL may be disposed on the second planarization layer OC2. The color filter layer CFL may be disposed on a surface of the second planarization layer OC2 in areas separated by the upper light-absorbing members UAM.

A third passivation layer PAS2 may be disposed on the color filter layer CFL and the upper light-absorbing members UAM to cover them. The third passivation layer PAS2 may protect the color filter layer CFL.

An encapsulation layer ENC may be disposed on the third passivation layer PAS2. The encapsulation layer ENC may include at least one inorganic layer to prevent penetration of oxygen or moisture. The encapsulation layer ENC may include at least one organic layer to protect the display device 1_8 from foreign substances such as dust.

The display device 1_8 may include a plurality of third holes HA3 penetrating the display device 1_8. The third holes HA3 may be holes penetrating the display device 1_8 in the thickness direction of the display device 1_8. Each of the third holes HA3 may be shaped like a truncated cone whose diameter decreases from the first substrate SUB1 toward the encapsulation layer ENC. The shape of each third hole HA3 whose diameter decreases from the first substrate SUB1 toward the encapsulation layer ENC may be obtained by sequentially forming a plurality of layers included in the display device 1_8 on the first substrate SUB1 and then etching the layers through a single process. Since the third holes HA3 are formed to penetrate the display device 1_8, they may be heat dissipation passages through which heat generated inside the display device 1_8 is released.

Figure 31:
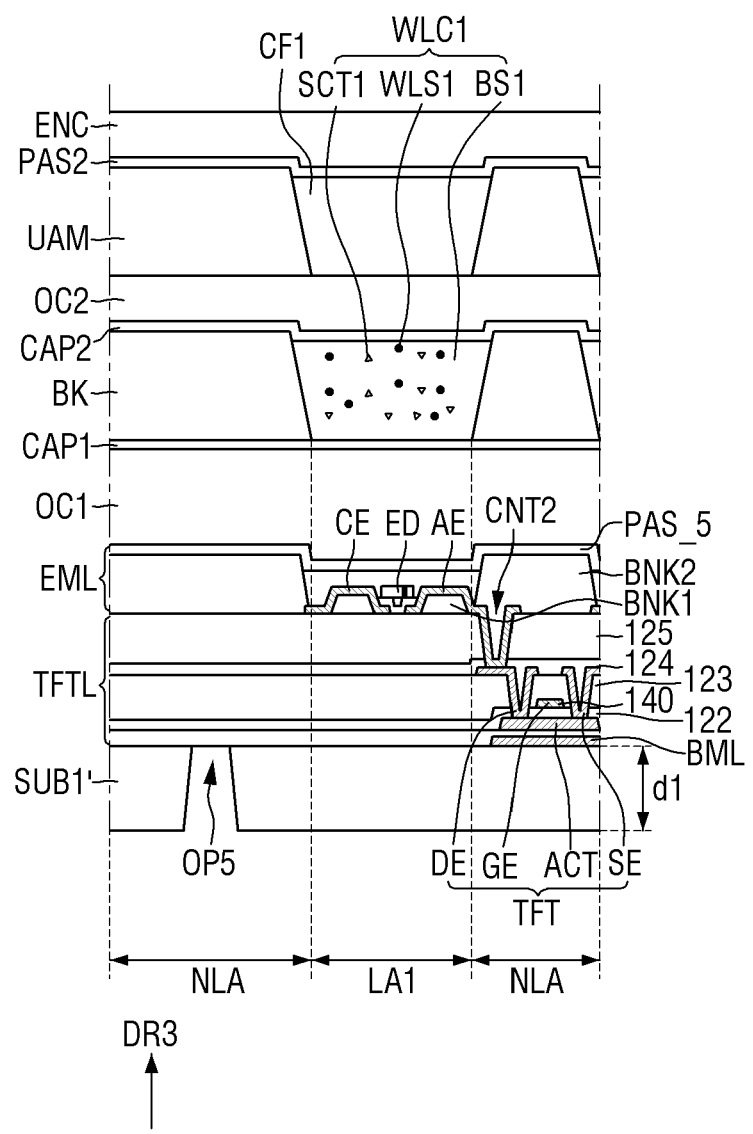
FIG. 31, FIG. 32, and FIG. 33 are schematic cross-sectional views illustrating processes in a method of manufacturing a display device and structures related to the processes according one or more embodiments.
Figure 32:
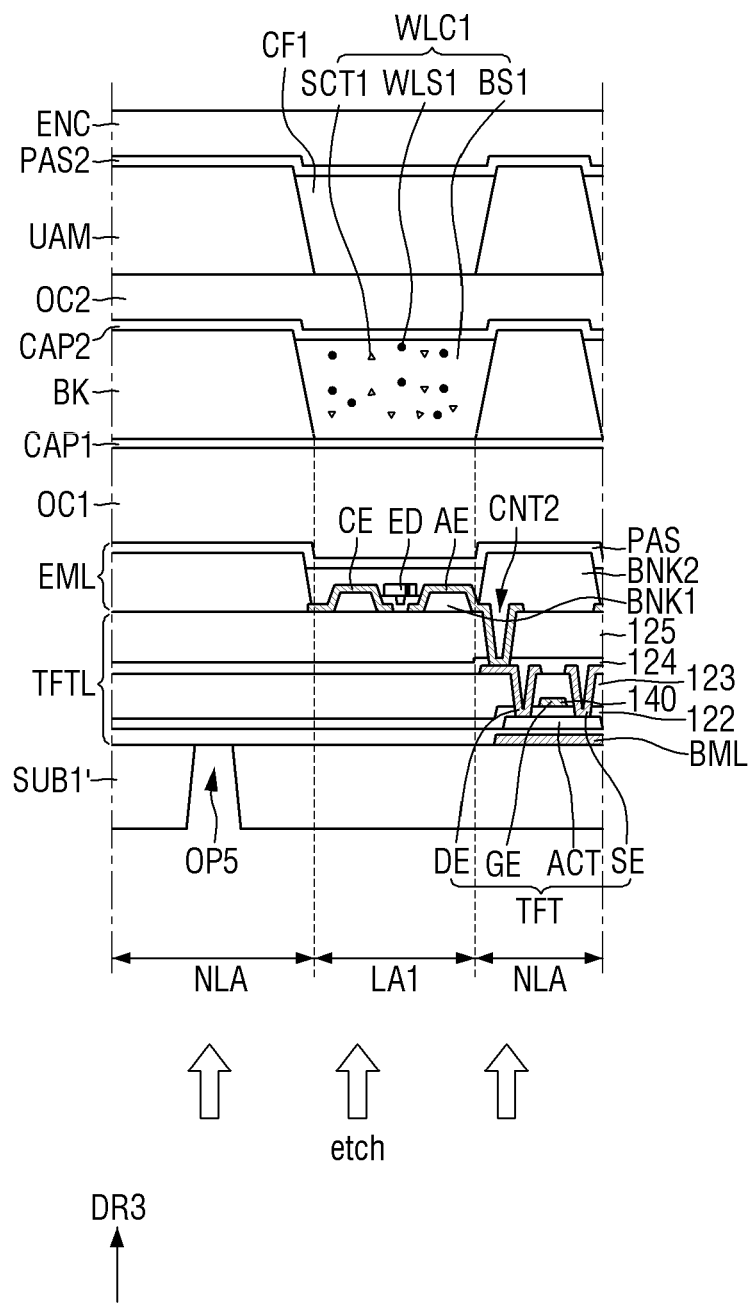
Figure 33:
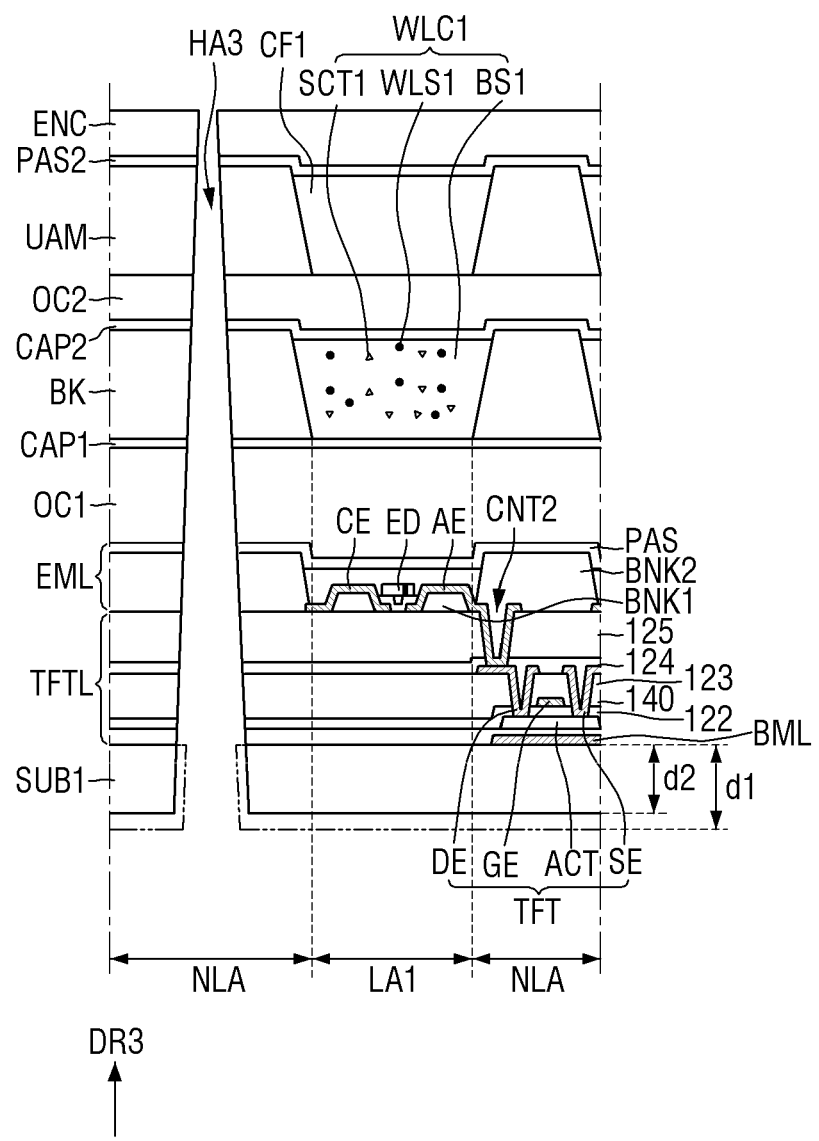

FIGS. 31 through 33 are cross-sectional views illustrating processes of a method of manufacturing the display device 1_8 of FIG. 30. In FIGS. 31 through 33, only a first light emitting area LA1 and the non-light emitting area NLA disposed around the first light emitting area LA1 are illustrated for ease of description.

First, referring to FIG. 31, a plurality of layers may be formed on a first base substrate SUB1', and a fifth opening OP5 penetrating the first base substrate SUB1' may be formed in an area corresponding to a third hole HA3. The layers formed on the first base substrate SUB1' may be layers corresponding to the layers described above in FIG. 30 and may be disposed in the non-light emitting area NLA. The process of forming the fifth opening OP5 may be performed by the process described above with reference to FIGS. 12A and 12B. The fifth opening OP5 penetrating the first base substrate SUB1' may be formed through a wet etching using an etching mask. In some other embodiments, the fifth opening OP5 penetrating the first base substrate SUB1' may be formed by a laser drilling process. In some other embodiments, the fifth opening OP5 penetrating the first base substrate SUB1' may be formed by forming a laser-damaged area by irradiating a laser beam to an area in which the fifth opening OP5 is to be formed and then performing an etching process using the first base substrate SUB1' itself as an etching mask without a separate etching mask.

Next, referring to FIG. 32, an etching process is performed from under the first base substrate SUB1' onto a lower surface of the first base substrate SUB1'. The etching process may be performed using the first base substrate SUB1' as an etching mask without a separate etching mask. The etching process may be performed by wet etching, dry etching, or powder blasting. Since the first base substrate SUB1' is used as an etching mask without a separate etching mask, the lower surface of the first base substrate SUB1' may be exposed to an etchant used in the etching process.

A plurality of layers exposed by the fifth opening OP5 penetrating the first base substrate SUB1' and disposed in the non-light emitting area NLA may be etched by an etchant or powder used in the etching process, thereby forming a third hole HA3 as illustrated in FIG. 33. Since the first base substrate SUB1' itself is used as an etching mask without a separate etching mask, a part of the first base substrate SUB1' which is exposed to the etchant or powder may also be etched. Therefore, due to the partial etching of the first base substrate SUB1', a thickness d2 of the first substrate SUB1 may be smaller than a thickness d1 of the first base substrate SUB1'.

In the method of manufacturing the display device 1_8, since the first base substrate SUB1' is used as an etching mask, an additional process of forming a separate etching mask is omitted. Therefore, the manufacturing process efficiency of the display device 1_8 can be improved. Since the first base substrate SUB1' is partially etched by being exposed to an etchant or powder, the thickness of the first substrate SUB1 may be reduced. Accordingly, the thickness of the display device 1_8 may be minimized.

Figure 34:
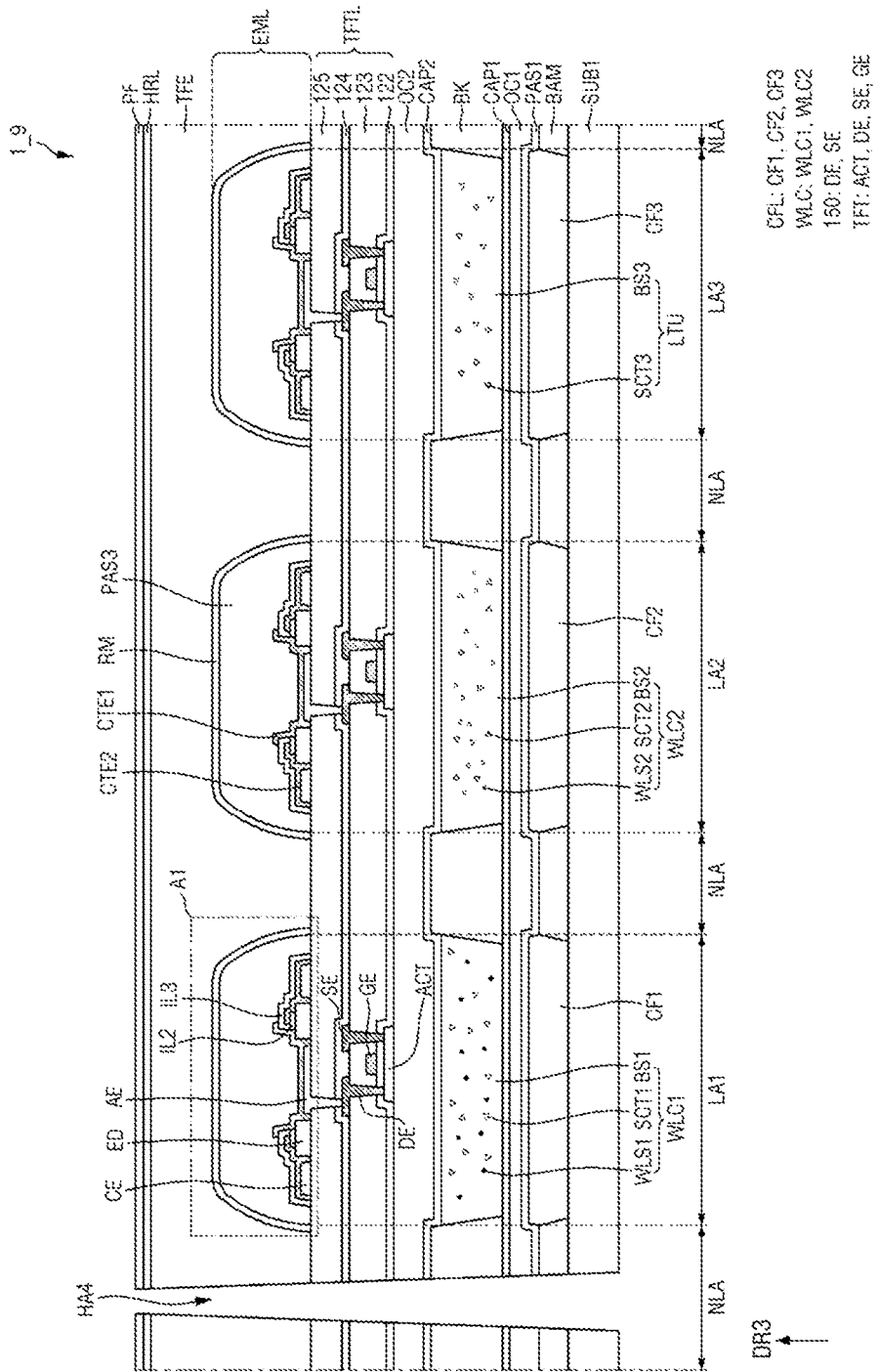
FIG. 34 is a schematic cross-sectional view of a display device according to an embodiment.
Figure 35:
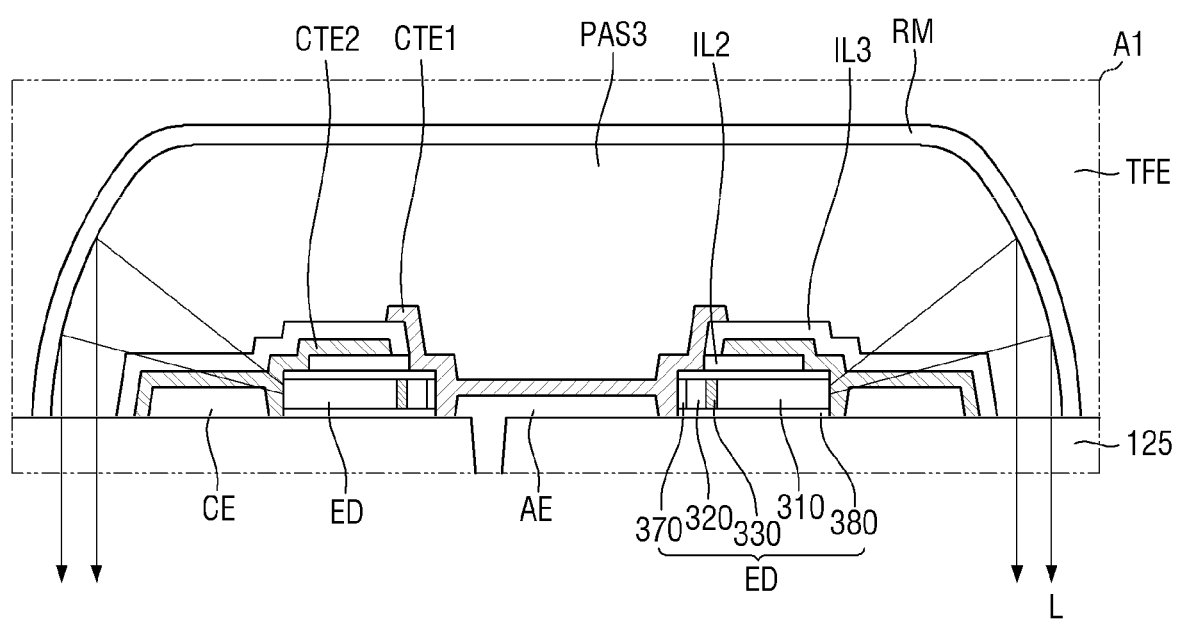
FIG. 35 is an enlarged view of area A1 of FIG. 34 according to an embodiment.

FIG. 34 is a cross-sectional view of a display device 1_9 according to an embodiment. FIG. 35 is an enlarged view of area A1 of FIG. 34.

Referring to FIGS. 34 and 35, the display device 1_9 is different from the previous embodiments in that the display direction is a downward direction (that is, the direction opposite to the third direction DR3).

A color filter layer CFL may be disposed on a first substrate SUB1, a color control layer WLC and LTU may be disposed on the color filter layer CFL, a thin-film transistor layer TFTL may be disposed on the color control layer WLC and LTU, and a light emitting element layer EML may be disposed on the thin-film transistor layer TFTL. A fourth hole HA4 penetrating the first substrate SUB1 and a plurality of layers disposed on the first substrate SUB1 may be included.

The color filter layer CFL may be disposed on the first substrate SUB1. The color filter layer CFL may be disposed on the first substrate SUB1 exposed by lower light-absorbing members BAM disposed in a non-light emitting area NLA. The lower light-absorbing members BAM may not only block light emission but also suppress reflection of external light.

The color control layer WLC and LTU may be disposed on the color filter layer CFL. The thin-film transistor layer TFTL may be disposed on the color control layer WLC and LTU. The light emitting element layer EML may be disposed on the thin-film transistor layer TFTL.

The light emitting element layer EML may include light emitting elements ED, first and second electrodes AE and CE, first and second contact electrodes CTE1 and CTE2, second and third insulating layers IL2 and IL3, a fourth passivation layer PAS3, and a reflective member RM in each subpixel.

The first electrode AE may be disposed on a via layer 125 of the thin-film transistor layer TFTL. The second electrode CE may be disposed on the via layer 125 of the thin-film transistor layer TFTL and spaced apart from the first electrode AE.

The light emitting elements ED may be disposed on the via layer 125 of the thin-film transistor layer TFTL between the first electrode AE and the second electrode CE.

The first contact electrode CTE1 may cover the first end of the light emitting elements ED and the first electrode AE. The second contact electrode CTE2 may cover second end of the light emitting elements ED and the second electrode CE. The first contact electrode CTE1 and the second contact electrode CTE2 may be insulated from each other by the third insulating layer IL3 disposed on the second contact electrode CTE2.

The fourth passivation layer PAS3 may cover the light emitting elements ED, the first and second electrodes AE and CE, and the first and second contact electrodes CTE1 and CTE2. The fourth passivation layer PAS3 may prevent damage to the light emitting elements ED by preventing penetration of impurities such as moisture or air from the outside.

The fourth passivation layer PAS3 may include a material having a relatively high light transmittance. The fourth passivation layer PAS3 may be made of a transparent organic material. The fourth passivation layer PAS3 may include at least one of organic materials such as epoxy resin, acrylic resin, cardo resin, and imide resin. The fourth passivation layer PAS3 may determine the shape of the reflective member RM to be described later.

The reflective member RM may cover the fourth passivation layer PAS3. The reflective member RM may reflect light L, which is emitted from the light emitting elements ED, toward the first substrate SUB1 disposed under the reflective member RM. The light L emitted from the light emitting elements ED may be reflected by the reflective member RM to pass through the thin-film transistor layer TFTL, the color control layer WLC and LTU and the color filter layer CFL and then to travel toward a lower surface of the first substrate SUB1 of the display device 1_9. The shape of the reflective member RM may be determined by the fourth passivation layer PAS3. The reflective member RM may have a shape that can maximize the light emission efficiency of the light emitting element layer EML.

The reflective member RM may include an alloy, nitride or oxide including at least one of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), copper (Cu), lithium fluoride/calcium (LiF/Ca), and lithium fluoride/aluminum (LiF/Al). The reflective member RM may have a single layer structure or a multilayer structure.

An encapsulation layer TFE may cover the light emitting element layer EML. The encapsulation layer TFE may cover upper and side surfaces of the reflective member RM and a part of the thin-film transistor layer TFTL. The encapsulation layer TFE may include at least one inorganic layer to prevent penetration of oxygen or moisture. The encapsulation layer TFE may include at least one organic layer to protect the display device 1_9 from foreign substances such as dust.

A metal layer HRL may be disposed on the encapsulation layer TFE. The metal layer HRL may release heat generated inside the display device 1_9 to the outside. The thermal conductivity of the metal layer HRL may be higher than that of the encapsulation layer TFE. When heat generated from the light emitting element layer EML or the thin-film transistor layer TFTL is transferred to the metal layer HRL through the encapsulation layer TFE, the metal layer HRL may release the heat to the outside of the display device 1_9.

A protective film PF may be disposed on the metal layer HRL. The protective film PF may cover the metal layer HRL to prevent damage to the metal layer HRL.

The fourth hole HA4 may penetrate from the first substrate SUB1 to the protective film PF. The fourth hole HA4 may be a heat dissipation passage through which heat is released to the outside of the display device 1_9.

Figure 36:
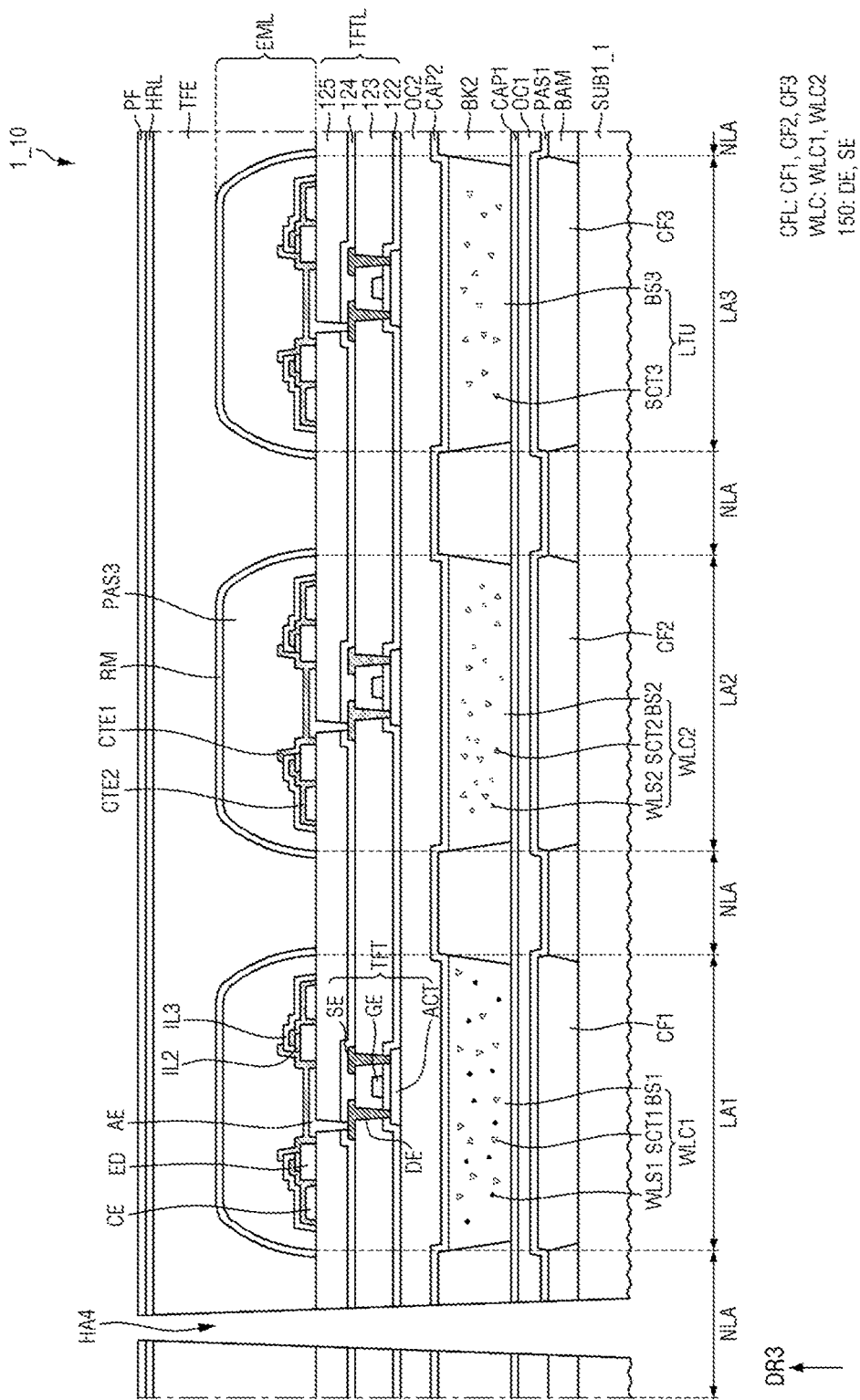
FIG. 36 is a schematic cross-sectional view of a display device according to an embodiment.

FIG. 36 is a cross-sectional view of a display device 1_10 according to an embodiment.

Referring to FIG. 36, the display device 1_10 is different from the embodiment of FIG. 34 in that a lower surface of a first substrate SUB1_1 is formed with a predetermined surface roughness.

The lower surface of the first substrate SUB1_1 may be formed with a predetermined surface roughness. The lower surface of the first substrate SUB1_1 with the surface roughness may be formed in a process for forming a fourth hole HA4. The fourth hole HA4 may be formed in an etching process performed by dry etching or powder blasting without a separate etching mask. In this case, the lower surface of the first substrate SUB1_1 exposed to an etchant or powder in the etching process performed without a separate etching mask may be partially damaged, thereby forming the lower surface of the first substrate SUB1_1 with a predetermined surface roughness (or uneven patterns). The lower surface of the first substrate SUB1_1 with the surface roughness may increase diffused reflection on a display surface (the lower surface of the first substrate SUB1_1) of the display device 1_10. Therefore, the display device 110 may have anti-glare characteristics due to the surface roughness of the first substrate SUB1_1.

Figure 37:
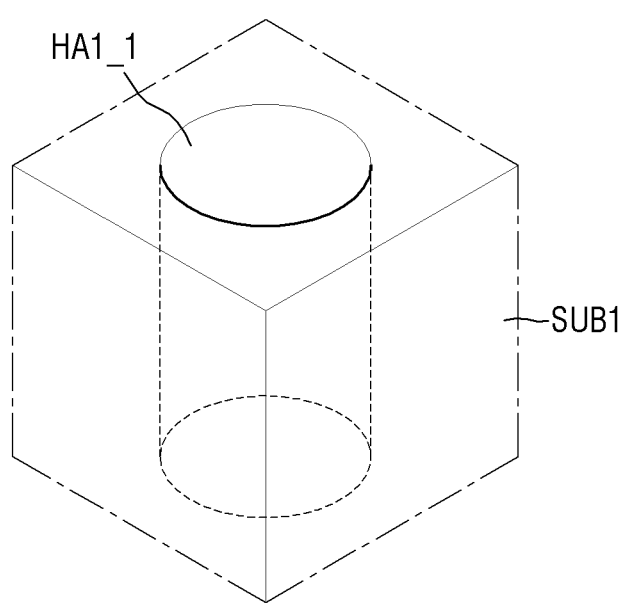
FIG. 37 is a schematic perspective view of a first hole formed in a first substrate according to an embodiment.
Figure 38:
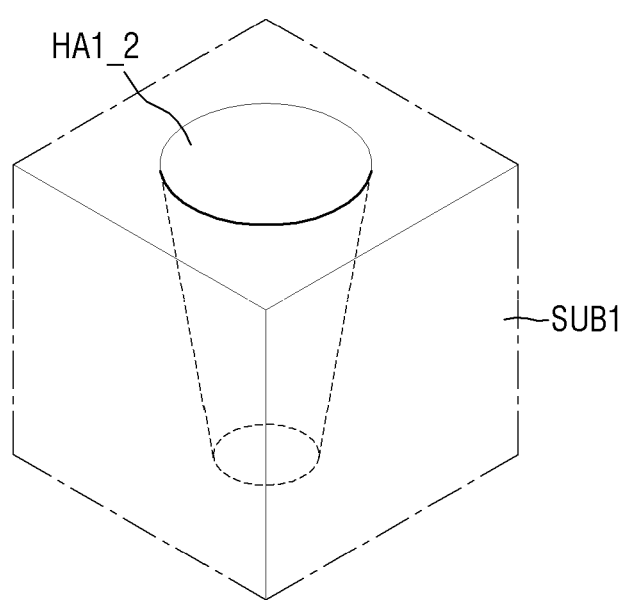
FIG. 38 is a schematic perspective view of a first hole formed in a first substrate according to an embodiment.

FIG. 37 is a perspective view of a first hole HA1_1 formed in a first substrate SUB1 according to an embodiment. FIG. 38 is a perspective view of a first hole HA1_2 formed in a first substrate SUB1 according to an embodiment.

Referring to FIGS. 37 and 38, a first hole penetrating the first substrate SUB1 may have various shapes. For example, referring to FIG. 37, the first hole HA1_1 may have cylinder structure whose upper and lower openings have the same diameter. Referring to FIG. 38, the first hole HA1_2 may have truncated cone structure whose upper opening has a greater diameter than its lower opening.

The above-described embodiments are illustrative. Many variations and modifications can be made to the above-described embodiments without departing from the scope defined by the claims.

What is claimed is:

1. A display device comprising:
   a first substrate comprising a first set of holes, wherein each of the first set of holes extends through the first substrate;
   a first set of light emitting elements overlapping the first substrate;
   a second set of light emitting elements overlapping the first substrate,
   a first set of light blocking members;
   a second set of light blocking members;
   a first set of transistors, wherein each of the first set of transistors respectively overlaps each of the first set of light blocking members and respectively corresponds to each of the first set of light emitting elements; and
   a second set of transistors, wherein each of the second set of transistors respectively overlaps each of the second set of light blocking members and respectively corresponds to each of the second set of light emitting elements, and wherein the each of the first set of holes is positioned between the first set of light blocking members and the second set of light blocking members in the plan view of the display device,
   wherein the each of the first set of holes is positioned between the first set of light emitting elements and the second set of light emitting elements in a plan view of the display device.

2. The display device of claim 1, wherein the first substrate comprises glass.

3. The display device of claim 1, wherein the each of the first set of holes is spaced from each other.

4. The display device of claim 1,
   wherein the each of the first set of holes is positioned between the first set of transistors and the second set of transistors in the plan view of the display device.

5. The display device of claim 1, further comprising:
   a first set of conductive members disposed on the first substrate,
   wherein each of the first set of conductive members covers an opening of at least one of the first set of holes.

6. The display device of claim 1, wherein the first substrate further comprises a second set of holes, wherein each of the second set of holes extends through the first substrate, and wherein each of the first set of light emitting elements overlaps the each of the second set of holes.

7. The display device of claim 1, further comprising:
   a first electrode;
   a second electrode spaced from the first electrode in a direction parallel to the substrate; and
   a transistor,
   wherein the transistor comprises a drain electrode electrically connected to the first electrode, and
   wherein the first set of light emitting elements includes a first light emitting element disposed between the first electrode and the second electrode.

8. The display device of claim 7, further comprising:
   a conductive member covering an opening of the each of the first set of holes.

9. The display device of claim 1, further comprising:
   a protective pattern disposed directly on the first substrate, narrower than the first substrate in a direction parallel to the first substrate, and covering an opening of a hole of the first set of holes.

10. The display device of claim 9, wherein the protective pattern comprises at least one of PI, Mo, Cu, Ti, and Cr.

11. The display device of claim 9, wherein the protective pattern is wider than an opening of the each of the first set of holes in the direction parallel to the first substrate.

12. The display device of claim 1, wherein the each of the first set of holes is spaced from each of the first set of light emitting elements and each of the second set of light emitting elements in the plan view of the display device.

13. The display device of claim 12, wherein the first set of holes is a first column of holes, the first set of light emitting elements is a first column of light emitting elements, and the second set of light emitting elements is a second column of light emitting elements.

14. The display device of claim 1, further comprising: a metal coating layer disposed on a wall of the each of the first set of holes and surrounded by the wall of the each of the first set of holes.

15. The display device of claim 1, further comprising: a metal filling layer filling a hole of the first set of holes.

16. A display device comprising:
- a first substrate;
- an overlapping layer overlapping the first substrate;
- a light emitting element positioned between the first substrate and the overlapping layer;
- a wavelength conversion member overlapping the light emitting element and positioned between the light emitting element and the overlapping layer; and
- a hole spaced from each of the light emitting element and the wavelength conversion member and extending through at least the first substrate and the overlapping layer.

17. The display device of claim 16, wherein a first face of the first substrate and a first face of the overlapping layer are positioned between a second face of the first substrate and a second face of the overlapping layer, and wherein a distance from the second face of the first substrate to the second face of the overlapping layer is equal to a length of the hole.

18. The display device of claim 16, further comprising:
- a light blocking member neighboring the wavelength conversion member,
- wherein the hole extends through the light blocking member.

19. The display device of claim 16, further comprising:
- a filling layer comprising a first filling part, a second filling part, and a third filling part,
- wherein the first filling part is disposed between the light emitting element and the wavelength conversion member,
- wherein the second filling part is disposed between the hole and the light emitting element, and
- wherein the third filling part is disposed between the hole and the wavelength conversion member.

* * * * *